US009035611B2

(12) United States Patent
Kikuchi et al.

(10) Patent No.: US 9,035,611 B2
(45) Date of Patent: May 19, 2015

(54) BATTERY SYSTEM FOR VEHICLE

(75) Inventors: Mutsumi Kikuchi, Mito (JP); Akihiko Kudo, Hitachinaka (JP); Gosuke Shibahara, Chiba (JP); Yoshinori Aoshima, Hitachinaka (JP); Kenji Kubo, Hitachi (JP); Yasuo Uemura, Naka (JP)

(73) Assignees: Hitachi, Ltd., Tokyo (JP); Hitachi Automotive Systems, Ltd., Hitachinaka-shi (JP)

( * ) Notice: Subject to any disclaimer, the term of this patent is extended or adjusted under 35 U.S.C. 154(b) by 485 days.

(21) Appl. No.: 13/201,478

(22) PCT Filed: Feb. 18, 2010

(86) PCT No.: PCT/JP2010/052467
§ 371 (c)(1),
(2), (4) Date: Oct. 14, 2011

(87) PCT Pub. No.: WO2010/109990
PCT Pub. Date: Sep. 30, 2010

(65) Prior Publication Data
US 2012/0025769 A1 Feb. 2, 2012

(30) Foreign Application Priority Data

Mar. 26, 2009 (JP) ................. 2009-076785

(51) Int. Cl.
*H01M 10/46* (2006.01)
*G01R 31/36* (2006.01)
(Continued)

(52) U.S. Cl.
CPC ........... *G01R 31/3658* (2013.01); *B60L 3/0046* (2013.01); *B60L 11/18* (2013.01);
(Continued)

(58) Field of Classification Search
USPC .......................... 320/116, 118, 122, 104, 135
See application file for complete search history.

(56) References Cited

U.S. PATENT DOCUMENTS

| 6,762,588 | B2 * | 7/2004 | Miyazaki et al. ............. 320/116 |
| 7,091,695 | B2 * | 8/2006 | Miyazaki et al. ............. 320/116 |

(Continued)

FOREIGN PATENT DOCUMENTS

| JP | 2003-134684 A | 5/2003 |
| JP | 2003-134685 A | 5/2003 |

(Continued)

OTHER PUBLICATIONS

Japanese Office Action dated Nov. 12, 2013 w/ English translation (five (5) pages).

(Continued)

*Primary Examiner* — Edward Tso
(74) *Attorney, Agent, or Firm* — Crowell & Moring LLP

(57) ABSTRACT

A battery system for a vehicle is provided with discharge circuits (R1, 129A through 129D, 128A through 128D) that discharge battery cells (BC1 through BC4) via measurement lines of those battery cells (BC1 through BC4). A control circuit transmits to an integrated circuit (3A) a first discharge command that causes discharge of the odd numbered battery cells (BC1 and BC3) of a cell group (GB1), a first transmission command that causes transmission to the control circuit of the terminal voltages of only the odd numbered battery cells (BC1 and BC3) measured during execution of the first discharge command, a second discharge command that causes discharge of the even numbered battery cells (BC2 and BC4) of the cell group (GB1), and a second transmission command that causes transmission to the control circuit of the terminal voltages of only the even numbered battery cells (BC2 and BC4) measured during execution of the second discharge command; and, based on the these various terminal voltages transmitted from the integrated circuit (3A), the control circuit diagnoses abnormalities in the system that includes the battery cells, the measurement lines, and the discharge circuits.

20 Claims, 39 Drawing Sheets

(51) Int. Cl.
  *B60L 3/00* (2006.01)
  *B60L 11/18* (2006.01)
  *B60R 16/033* (2006.01)
  *H01M 10/48* (2006.01)
  *H02J 7/00* (2006.01)

(52) U.S. Cl.
  CPC ........ *B60L 11/1853* (2013.01); *B60L 11/1866* (2013.01); *B60L 2240/547* (2013.01); *B60L 2240/549* (2013.01); *B60R 16/033* (2013.01); *H01M 10/482* (2013.01); *H02J 7/0016* (2013.01); *Y02T 10/7005* (2013.01); *Y02T 10/7061* (2013.01)

(56) References Cited

U.S. PATENT DOCUMENTS

| | | | |
|---|---|---|---|
| 7,417,405 B2 * | 8/2008 | Carrier et al. | 320/116 |
| 8,212,571 B2 * | 7/2012 | Emori et al. | 324/522 |
| 8,432,132 B2 * | 4/2013 | Nakanishi | 320/116 |
| 2004/0155629 A1 * | 8/2004 | Kobayashi et al. | 320/127 |
| 2005/0242776 A1 | 11/2005 | Emori et al. | |
| 2009/0085516 A1 * | 4/2009 | Emori et al. | 320/118 |

FOREIGN PATENT DOCUMENTS

| | | |
|---|---|---|
| JP | 2005-168118 A | 6/2005 |
| JP | 2005-318751 A | 11/2005 |
| JP | 2006-294339 A | 10/2006 |
| JP | 2007-85847 A | 4/2007 |
| JP | 2007-129864 A | 5/2007 |
| JP | 2008-175804 A | 7/2008 |

OTHER PUBLICATIONS

International Search Report dated Apr. 13, 2010 (one page).

* cited by examiner

FIG.6

| 260 | ... | STGCV1 | | STGCV2 | | STGCV3 | | STGCV4 | | ... |
|---|---|---|---|---|---|---|---|---|---|---|
| DIAGNOSIS/ MEASUREMENT MODE | | CELL1 RES | CELL1 MEAS- UREMENT | CELL2 RES | CELL2 MEAS- UREMENT | CELL3 RES | CELL3 MEAS- UREMENT | CELL4 RES | CELL4 MEAS- UREMENT | |
| OPERATION DETAILS | ... | UPPER LIMIT COMPA- RISON | LOWER LIMIT COMPA- RISON | (CELL1 TERMINAL VOLTAGE MEAS- UREMENT) | UPPER LIMIT COMPA- RISON | LOWER LIMIT COMPA- RISON | (CELL2 TERMINAL VOLTAGE MEAS- UREMENT) | UPPER LIMIT COMPA- RISON | LOWER LIMIT COMPA- RISON | (CELL3 TERMINAL VOLTAGE MEAS- UREMENT) | UPPER LIMIT COMPA- RISON | LOWER LIMIT COMPA- RISON | (CELL4 TERMINAL VOLTAGE MEAS- UREMENT) | ... |
| MULTIPLEXER 118 CONNECTED TO: SA1 | ... | MA1 | MA1 | MA2 | MA2 | MA2 | MA2 | ... | | |
| SA2 | ... | OPEN | OPEN | MA3 | MA4 | MA5 | MA6 | OPEN | OPEN | ... |
| SA3 | ... | OPEN | OPEN | OPEN | OPEN | MA5 | MA6 | OPEN | OPEN | ... |
| SA4 | ... | OPEN | OPEN | OPEN | OPEN | MA6 | MA6 | MA7 | MA6 | ... |
| MULTIPLEXER 120 CONNECTED TO: SB1 | ... | MB1 | MB1 | MB2 | MB2 | MB4 | MB4 | MB5 | MB5 | ... |
| SB2 | ... | MB2 | MB2 | MB3 | MB3 | MB5 | MB5 | MB6 | MB6 | ... |
| SWITCH SC1 | ... | CONNE- CTED | OPEN | CONNE- CTED | OPEN | CONNE- CTED | OPEN | CONNE- CTED | OPEN | ... |
| SWITCH SD1 | ... | VH | VL | VH | VL | VH | VL | VH | VL | ... |
| DECISION CIRCUIT 164 | ... | COMPA- RE WITH UPPER LIMIT | COMPA- RE WITH LOWER LIMIT | NOT OPERA- TING | COMPA- RE WITH UPPER LIMIT | COMPA- RE WITH LOWER LIMIT | NOT OPERA- TING | COMPA- RE WITH UPPER LIMIT | COMPA- RE WITH LOWER LIMIT | NOT OPERA- TING | COMPA- RE WITH UPPER LIMIT | COMPA- RE WITH LOWER LIMIT | NOT OPERA- TING | ... |
| SETTINGS OF ABNOR- MALITY/NORMALITY FLAGS 166 AND 168 | ... | SET | SET | NOT OPERA- TING | SET | SET | NOT OPERA- TING | SET | SET | NOT OPERA- TING | SET | SET | NOT OPERA- TING | ... |

ELAPSED TIME →

| BSW 129A | 129B | 129C | 129D | 129E | 129F | b7 | b8 |
|---|---|---|---|---|---|---|---|

(8 BITS)

(b)

| ADDRESS | REQUEST COMMAND | CELL BC1 | CELL BC1 | CELL BC1 | CELL BC1 | CELL BC1 | CELL BC1 | STATES OF BSW | CHECK-SUM |
|---|---|---|---|---|---|---|---|---|---|

FIG.37

DECISION TABLE

| $V_{gs}$ | $V_{ds}$ | | | STATE OF BSW 1: ON, 0: OFF | BALANCING SWITCH EVALUATION |
|---|---|---|---|---|---|
| | $V_{dsL}$ | $V_{dsL}$ | $V_{dsH}$ | | |
| H | ○ | | | 1 | NG |
| H | | ○ | | 1 | OK |
| H | | | ○ | 0 | NG |
| L | ○ | | | 1 | NG |
| L | | ○ | | 1 | NG |
| L | | | ○ | 0 | OK |

BATTERY SYSTEM FOR VEHICLE

TECHNICAL FIELD

The present invention relates to a battery system for a vehicle.

BACKGROUND ART

With a battery system that employs a lithium battery, and in particular with a battery system for a vehicle, a method is known for performing diagnosis of over-charge and of over-discharge of the battery cells (for example, refer to Patent Document #1). Moreover, in relation to balancing circuits that are provided for reducing the differences in charge amounts between the battery cells, this battery system is also endowed with a function of diagnosing the operational state of such a system. Furthermore, a technique is known for detecting disconnections in connecting lines that between the battery cells and the circuitry for detecting the battery terminal voltages (for example, refer to Patent Document #2).

CITATION LIST

Patent Literature

Patent Document #1: Japanese Laid-Open Patent Publication 2005-318751;
Patent Document #2: Japanese Laid-Open Patent Publication 2006-294339.

SUMMARY OF THE INVENTION

Technical Problem

In this manner, with a battery system for a vehicle, it is necessary to monitor the states of the battery cells in order to adjust the charge amounts with the balancing circuits, and in order to perform diagnosis of over-charge and over-discharge. Furthermore not only is it necessary to monitor the states of the battery cells, but also it is necessary to enhance the reliability of the measurement system and so on, in order to enhance the overall reliability of the battery system. The problem for the present invention is to supply a battery system for a vehicle, whose reliability shall be high.

Solution to the Problem

According to the 1st aspect of the present invention, a battery system for a vehicle comprises: a battery unit in which a plurality of cell groups are electrically connected in series, with a plurality of battery cells being electrically connected in series in each cell group; integrated circuits provided for the cell groups respectively, each of which measures the terminal voltage of each battery cell included in its cell group via a measurement line, and outputs battery cell information; and a control circuit that monitors states of the battery cells based on battery cell informations from the integrated circuits; wherein each of the integrated circuits comprises a measurement circuit that measures respective terminal voltages of battery cells in its cell group, and discharge circuits provided for each battery cell, each of which discharges its battery cell via measurement lines for that battery cell; and the control circuit transmits to each of the integrated circuits: a first discharge command that causes odd numbered battery cells of its cell group to be discharged; a first transmission command that causes terminal voltages of only the odd numbered battery cells, measured during execution of the first discharge command, to be sent to the control circuit; a second discharge command that causes even numbered battery cells of its cell group to be discharged; and a second transmission command that causes terminal voltages of only the even numbered battery cells, measured during execution of the second discharge command, to be sent to the control circuit; and diagnoses abnormality of a system including the battery cells, the measurement lines, and the discharge circuits based on the terminal voltages sent from each of the integrated circuits.

It should be noted that each of the discharge circuits may comprise a semiconductor switching element that performs ON/OFF of discharge and a detection circuit that detects the switching state of the semiconductor switching element, and may diagnose whether disconnection of one or more of the measurement lines, abnormality of states of charge of one or more of the battery cells, or abnormality of one or more of the discharge circuits has occurred, based on the terminal voltages of the odd numbered battery cells, the terminal voltages of the even numbered battery cells, and the switching states.

The battery system for a vehicle according to the 1st aspect of the present invention may further comprise a serial communication system that comprises a first transmission path in which the plurality of integrated circuits are connected in series, a second transmission path for transmitting signals from the control circuit to a highest ranking one of the integrated circuits that are connected in series, and a third transmission path for transmitting signals from a lowest ranking one of the integrated circuits that are connected in series to the control circuit, wherein transmission of the first discharge command, the second discharge command, the first transmission command and the second transmission command from the control circuit to the plurality of integrated circuits, and sending of the terminal voltages from the plurality of integrated circuits to the control circuit, may be performed via the serial communication system.

According to the 2nd aspect of the present invention, a battery system for a vehicle comprises: a battery unit in which a plurality of cell groups are electrically connected in series, with a plurality of battery cells being electrically connected in series in each cell group; integrated circuits provided for the cell groups respectively, each of which measures the terminal voltage of each battery cell included in its cell group via a measurement line, and outputs battery cell information; and a control circuit that monitors the states of the battery cells based on battery cell information from the integrated circuits; wherein each of the integrated circuits comprises: a measurement circuit that measures respective terminal voltages of the battery cells in its cell group: discharge circuits provided for each battery cell, each of which includes a semiconductor switching element for flowing a discharge current via measurement lines for that battery cell; and detection circuits that detect switching states of the semiconductor switching elements; and wherein the control circuit transmits to the integrated circuits discharge commands that command discharge operation by the discharge circuits, and diagnoses whether disconnection of one or more of the measurement lines, abnormality of states of charge of one or more of the battery cells, or abnormality of one or more of the of the discharge circuits has occurred, based on the terminal voltages measured during execution of the discharge commands and on the switching states.

It should be noted that the control circuit may transmit to each of the integrated circuits: a first discharge command that causes odd numbered battery cells of its cell group to be discharged; a first transmission command that causes terminal voltages only of the odd numbered battery cells, measured during execution of the first discharge command, to be sent to the control circuit; a second discharge command that causes even numbered battery cells of its cell group to be discharged; and a second transmission command that causes terminal voltages of only the even numbered battery cells, measured during execution of the second discharge command, to be sent to the control circuit; and may diagnose whether disconnection of one or more of the measurement lines, abnormality of the states of charge of one or more of the battery cells, or abnormality of one or more of the of the discharge circuits has occurred, based on the terminal voltages sent from each of the integrated circuits.

Further, detection by the detection circuits may be performed in each cycle of a predetermined detection cycle.

Yet further, the measurement circuits may measure the terminal voltages on a predetermined measurement cycle; and the predetermined detection cycle may have a same period as the measurement cycle.

Advantageous Effect of the Invention

According to the present invention, it is possible to enhance the reliability of a battery system for a vehicle.

BRIEF DESCRIPTION OF THE DRAWINGS

FIG. 6 is a figure for explanation of the diagnostic operation in a first embodiment;

FIG. 34 is a schematic figure for explanation of a data format: (a) shows a broadcast command, and (b) shows returned data outputted from an integrated circuit;

FIG. 37 is a figure showing a decision table;

DESCRIPTION OF THE EMBODIMENTS

Each of the drive system provided with a battery system, the battery system, the in-vehicle battery system, the battery module, the cell controller that is used in that battery module, and the circuit boards and their circuit components such as integrated circuits and so on that are included in that cell controller, all of which are explained below in connection with the embodiments, is endowed with high reliability. Moreover, investigations have been made for employment of the system explained below in manufacturing production, along with its circuit boards and their circuit components such as integrated circuits and so on, and various other problems (not only in connection with enhancement of the reliability) have been resolved. Representative such problems will be described below.

Enhancement of the Reliability

Figure 13:
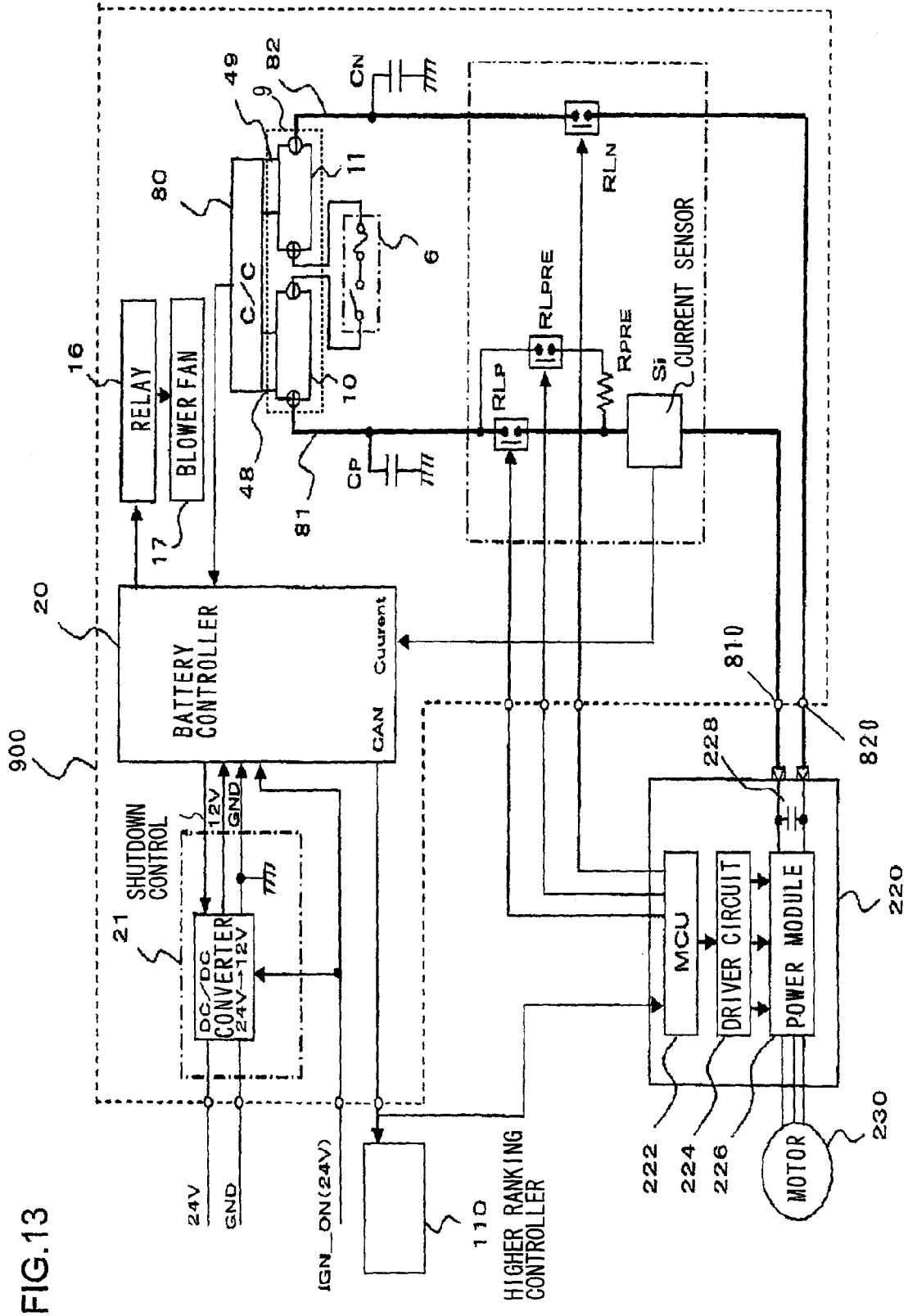
FIG. 13 is a circuit diagram showing an example in which the battery system for a vehicle according to this embodiment is applied as a drive system for a rotating electrical machine for a vehicle.

Main structural elements of a vehicle drive system that will be described hereinafter used in FIG. 13 are a battery module, an inverter device, and a rotating electrical machine 230 (hereinafter termed the "motor"), and this system is built so that the inverter device 220 and the battery module 900 described above are capable of exchanging information via a communication circuit. In particular, the system is built so that the results of diagnostics upon the battery module 900 are sent to a control circuit 222 (hereinafter termed the "MCU") of the inverter device 220, and so that very important information such as abnormal states of the inverter device 220 and the battery module 900 and so on are shared. The battery module 900 includes relays RLP and RLN that connect or cut off the electric circuit between a lithium battery and the inverter device 220, and these relays RLP and RLN are controlled by the MCU 222 of the inverter device 220. Since the MCU 222 of the inverter device 220 is able to control the relays RLP and RLN on the basis of the states of the motor 230, of the inverter device 220, and of the module 900, accordingly the reliability of the system as a whole is enhanced. Furthermore, the MCU 222 of the inverter device 220 is able to control the electrical power consumed by the motor and the electrical power that is generated, by controlling the inverter in correspondence to its control of the relays RLP and RLN, so that high security and high reliability are obtained.

The battery module 900 includes, as main structural components, a battery unit 9 that includes lithium battery cells, a cell controller 80, and a battery controller 20. The cell controller 80 performs measurement and diagnosis of the terminal voltages of the lithium battery cells included in the battery unit 9, and discharge operation for adjusting their states of charge SOC. And the battery controller 20 receives the measurement results and diagnosis results of the cell controller 80, and performs management of the battery module 900. By functions being apportioned in this manner, the reliability and the security of the battery module 900 are enhanced.

The cell controller 80 includes a plurality of integrated circuits that have the function of detecting the terminal voltages of the plurality of lithium battery cells included in the battery unit 9. A battery module that uses lithium cells differs from a unit cell, by the aspect that measurement of the terminal voltages of its lithium battery cells at high reliability is very important from the standpoint of security. On the other hand, a device that is intended for deployment on a vehicle will be used in an environment that may be at a high temperature or at a low temperature for a long period of time as compared to the environment in which a device for general industrial application is typically used, and it is necessary to give consideration to the rigors of the environment in which such a device is to be mounted. In the embodiments explained below, each of the integrated circuits is provided with a diagnosis circuit that diagnoses whether or not the terminal voltage of the corresponding lithium battery cell is being measured correctly, and each of the integrated circuits repeatedly executes this diagnosis on a fixed cycle. The integrated circuits, and the cell controller 80 that uses these integrated circuits, have the construction described above, and thereby the integrated circuits described above and the cell controller 80 described above are endowed with high reliability.

As described above, while public known examples related to diagnosis of deterioration of the lithium battery cells and diagnosis of the discharge circuitry for the lithium battery cells can be found, the requirement for diagnosis related to the operation of measurement of the terminal voltages of the lithium battery cells has not been considered. However it will be understood that, from the point of view of further enhancing the reliability and the security, it is also desirable to perform diagnosis of the measurement operations of the integrated circuits. In the embodiments explained below, each of the integrated circuits has a construction in which it is repeatedly diagnosed, by a diagnosis circuit, whether or not the measurement operation for the corresponding terminal voltage is being performed correctly, for example whether or not the selection of a terminal voltage of a lithium battery cell by a multiplexer is being performed normally. Accordingly, it is possible to obtain integrated circuits whose reliability is extremely high.

Simplification of the Integrated Circuits

Figure 4:
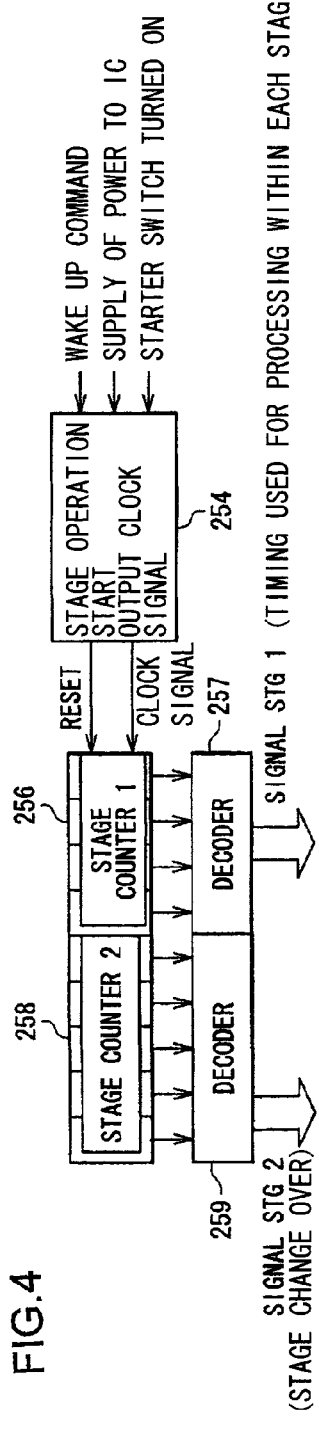
FIG. 4 is a figure for explanation of the timing of diagnostic operation and measurement operation, and for explanation of items for diagnosis operation.

In the embodiments explained below, as shown in FIG. 4, a construction is adopted with which it is possible for the integrated circuits to implement measurement of the terminal voltages of the lithium battery cells and repeated diagnosis on a synchronized cycle, and with which the integrated circuits are able to implement overall control of the measurement and control of the diagnosis, so that, in addition to enhancing the reliability and the security, it is also possible comparatively to simplify the circuit structure of the integrated circuits.

And in the embodiments explained below, as shown in FIG. 4, it is possible to implement a plurality of diagnosis operations upon the integrated circuits in synchronization with the measurement operation, so a structure results in which overall diagnosis of the integrated circuits as a whole is implemented, and with which it is possible to maintain high reliability in relation to the integrated circuits. It should be understood that, by a plurality of diagnosis operations, is meant diagnosis of the balancing switches of the integrated circuits, diagnosis of their analog to digital converters, diagnosis of their multiplexers, diagnosis of their digital comparison circuits, and so on. In other words, while a diagnosis function has also been supplemented in addition to the basic function of the integrated circuits, a construction is adopted with which the overall operation of the integrated circuits with respect to their functions and their overall circuit structure proceeds in an integrated manner, and with which the integrated circuits are comparatively simplified for their increased functionalities.

Reduction of the Time Taken for Abnormality Diagnosis

With a battery module for in-vehicle use that employs lithium cells, it is desirable to detect any abnormality in a short period of time, and to deal with such an abnormality as quickly as possible. On the other hand, along with increase in the amount of electrical power that is used, the number of lithium battery cells incorporated in the battery unit becomes greater, and the number of integrated circuits that are used also becomes greater. In addition to abnormality diagnosis for the lithium battery cells, if each of the integrated circuits also performs diagnosis upon itself, then the completion a large number of diagnosis items in a short period of time becomes a very important problem.

In the embodiments explained below, when once measurement operation and diagnostic operation have started, each of the integrated circuits is built to repeat both of these independently upon a fixed cycle, and to carry out measurement operation and diagnostic operation. Accordingly, even if the number of the lithium battery cells or the number of the integrated circuits is very great, it is still possible to complete the measurement operation and the diagnostic operation for the battery system and the battery module in a short period of time. For example, it is possible to carry out the above described measurement and diagnosis within a short period of time, even when it is necessary to start the vehicle and to commence traveling within a short time period. Thus traveling on the basis of the result of diagnosis becomes possible, so that it is possible to maintain high security.

Moreover, with respect to abnormalities of the integrated circuits or of the lithium battery cells, the battery module and battery system, and further the drive system shown in FIG. 13 are capable of deal with the abnormalities by applying such as rapid reduction of the amount of electrical power transferred by the battery module and rapid opening of a relay. Along with each of the integrated circuits performing its abnormality diagnosis independently, transmission and reception circuitry is provided that, when an abnormality has been detected, can rapidly output a signal that gives notice of that abnormality. This transmission and reception circuitry is endowed with an OR function, such as that shown by way of example with an OR circuit 288. In other words each integrated circuit is endowed with the function of, upon receipt of an abnormality signal, outputting an abnormality signal without any relationship to its own diagnosis result, and moreover with the function of outputting an abnormality signal when it detects an abnormality in connection with its own operation, even if it is not receiving any abnormality signal. Accordingly, a higher ranking control circuit such as the battery controller 20 or the like is rapidly able to become aware of the result of abnormality diagnosis for the entire plurality of mutually related integrated circuits, by being informed of the result of the above described abnormality signal that has arrived from the integrated circuits. Moreover, since it is possible to obtain the overall results of diagnosis even without any specific command for an abnormality signal to be transmitted specially, accordingly there is the beneficial effect of keeping down increase in the processing load upon the higher ranking control circuit.

Enhancement of the Productivity

Figure 26:
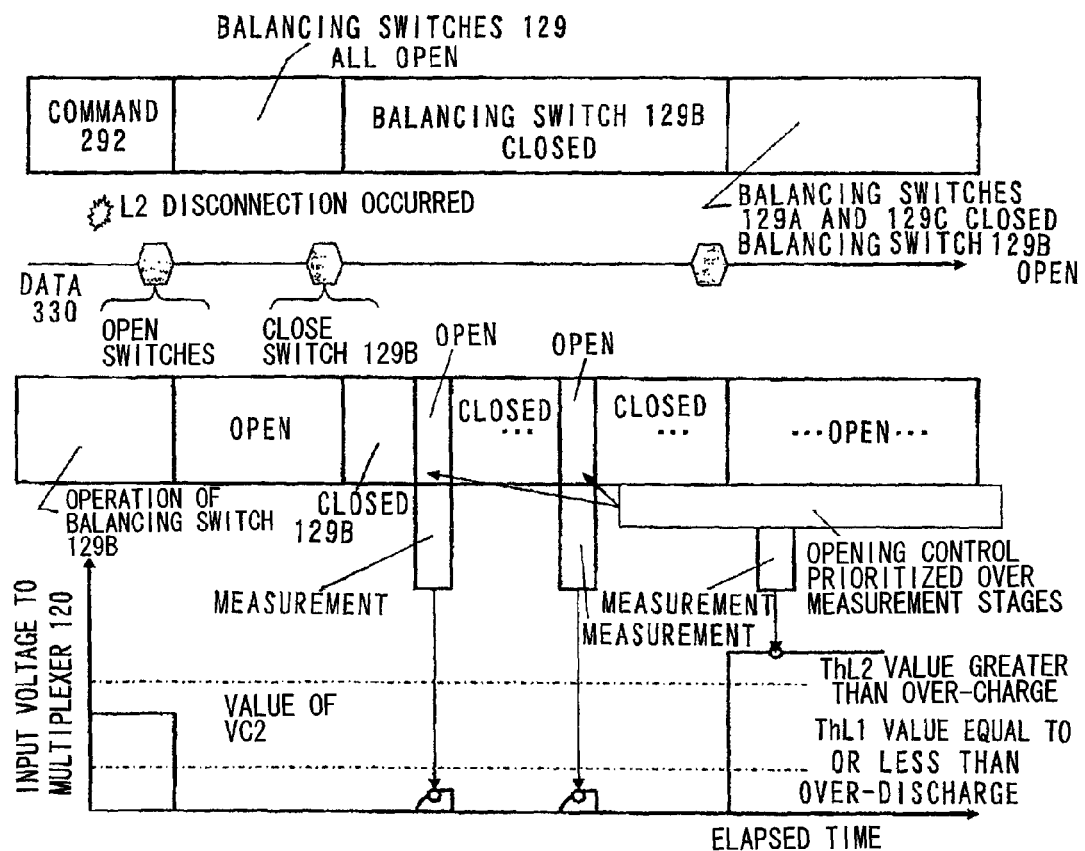
FIG. 26 is an explanatory figure showing an interruption period of a signal from a discharge control circuit, when it is desired to prioritize control of the balancing switches over control to adjust the states of charge.
Figure 27:
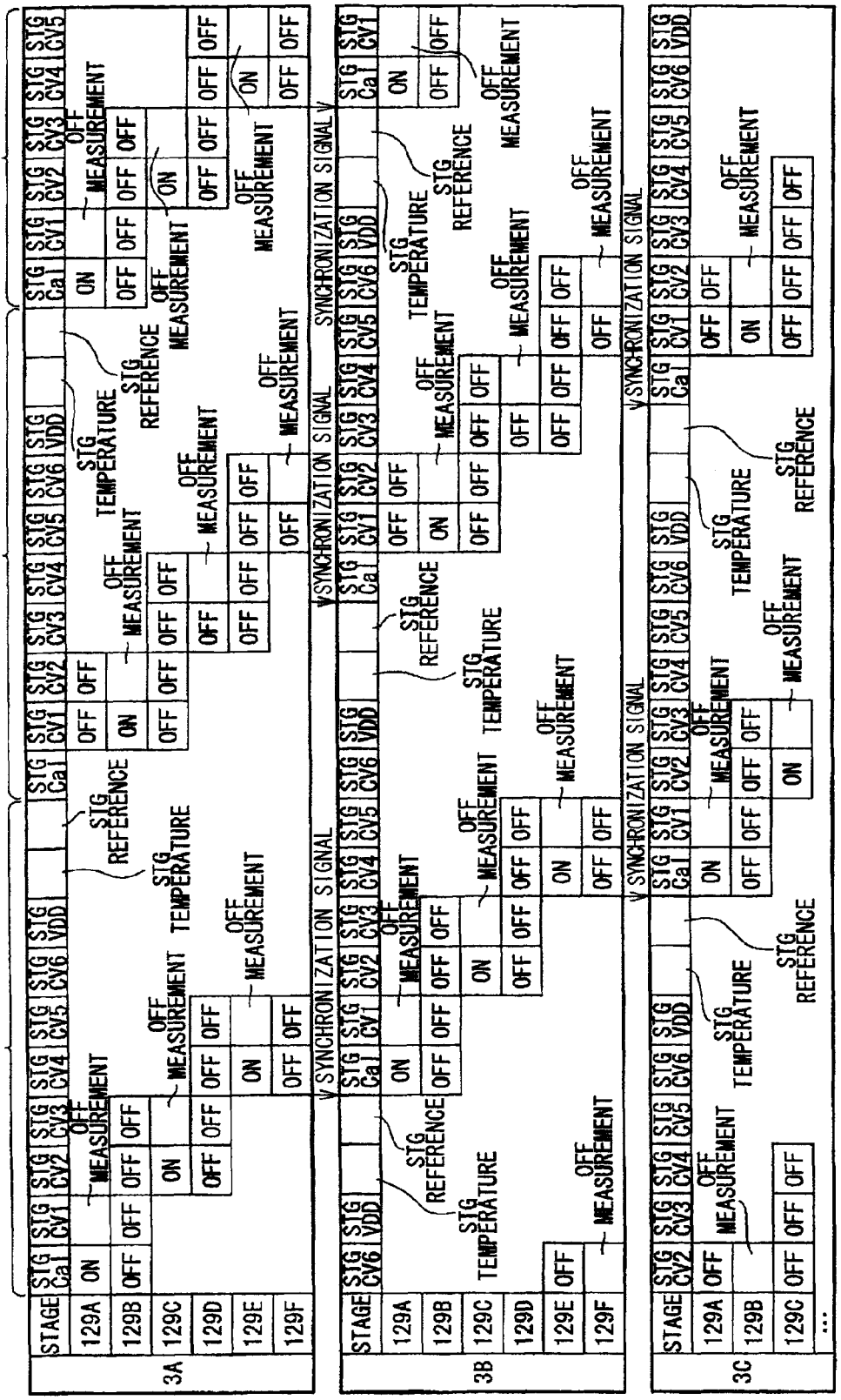
FIG. 27 is an explanatory figure showing an interruption period of a signal from a discharge control circuit, when it is desired to perform priority control of the balancing switches over control to adjust the states of charge.

In the embodiments explained below, integrated circuits are mounted upon the board of a cell controller 80, and resistors R1 through R4 for adjusting the states of discharge and for adjusting the SOCs of the lithium battery cells, as well as capacitors C1 through C6 for reduction of noise as shown in FIGS. 26 and 27, are also mounted upon the board of the cell controller 80. The productivity is enhanced because a construction is adopted in which the integrated circuits, these resistors R1 through R4 for adjusting the states of discharge, and the capacitors C1 through C6 are all mounted together upon the board of the cell controller 80. Moreover, the reliability and the security are further enhanced by arranging these circuit components close to one another.

In the following, embodiments for implementation of the present invention will be explained with reference to the figures.

Explanation of the Cell Controller

Figure 1:
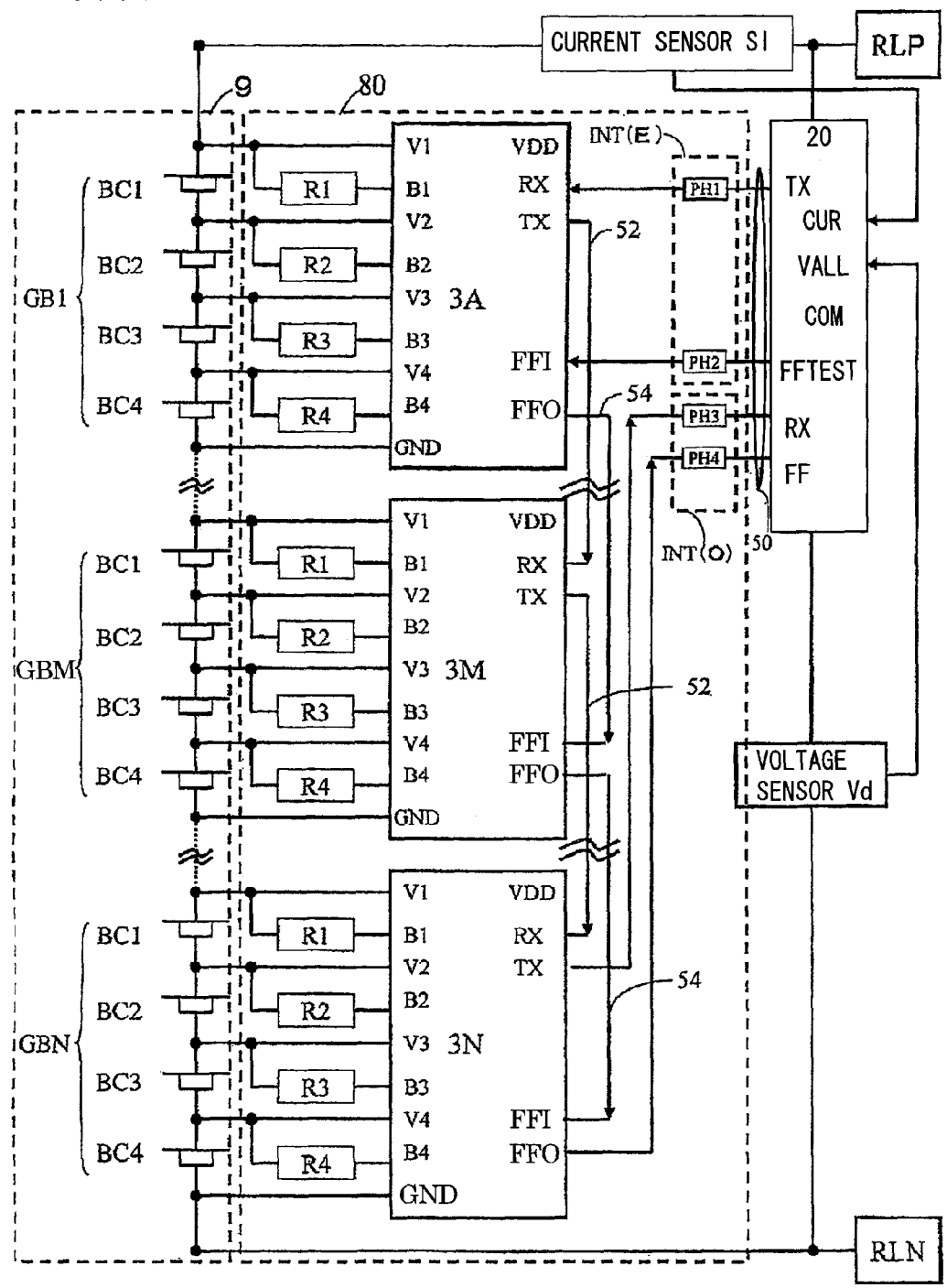
FIG. 1 is a figure showing an embodiment of a battery system for a vehicle according to the present invention, and is a block diagram showing a battery unit 9, a cell controller 80, and a battery controller 20.

FIG. 1 is a figure for explanation of a battery unit 9 of a battery system for a vehicle that is used for driving a rotating electrical machine of the vehicle, and of a cell controller 80 (sometimes abbreviated hereinafter as "C/C").

The battery unit 9 includes a plurality of groups of battery cells (hereinafter termed "cell groups") GB1, ... GBM, ... GBN that are connected in series. And each of these cell groups includes a plurality of battery cells BC1 through BC4 that are connected in series. Accordingly, the plurality of battery cells included in the battery unit 9 are connected in series. In this embodiment, according to circumstances, a large number of battery cells, such as for example several tens to several hundreds, may be included. In this embodiment, the battery cells are lithium ion cells.

The terminal voltage of each of these lithium battery cells changes according to the state of charge of that battery cell. For example, in the situation in which the state of charge is around 30%, the voltage is about 3.3 volts, while in the charged situation in which the state of charge is around 70% the voltage becomes about 3.8 volts. And sometimes it is the case that, in the over-discharged state when the cell has been discharged beyond its normal operational state, for example, the voltage can become less than or equal to 2.5 volts. Furthermore, sometimes it is the case that, in the over-charged state when the cell has been charged beyond its normal operating range, the voltage can become greater than 4.2 volts. It is possible to ascertain the state of charge SOC of each of the plurality of battery cells BC1 through BC4 that are connected in series by measuring the terminal voltage of that cell.

In this embodiment, in order to make it easy to perform measurement of the terminal voltages of the battery cells BC1 through BC12, it is arranged for four through six battery cells to constitute one cell group. In this embodiment, each of the cell groups shown in FIG. 1 (the cell group BG1 and the cell groups GBM and GBN) consists of four battery cells BC1 through BC4. While further cell groups incorporating battery cells are also present between the cell group BG1 and the cell group GBM, and between the cell group GBM and the cell group GBN, these are omitted from FIG. 1 in order to avoid troublesome explanation of structures that are essentially similar.

The cell controller is provided with integrated circuits 3A, ... 3M, ... 3N corresponding respectively to the cell groups GB1, ... GBM, ... GBN that make up the battery unit 9. In order to detect the terminal voltages of the battery cells, each of these integrated circuits is provided with voltage detection terminals. The terminals V1 through GND of each of the integrated circuits are respectively connected to the positive electrodes and the negative electrodes of each of the battery cells that make up the corresponding cell group. Moreover, each of the integrated circuits is provided with transmission and reception terminals for signal transmission, and, as will be explained hereinafter, these transmission and reception terminals of the integrated circuits are connected in series, and are connected to the battery controller 20 via a signal transmission path. This will be explained in further detail in the following discussion.

The cell controller 80 is provided with a plurality of these integrated circuits corresponding to the various cell groups, for example with from a few to several tens thereof. In FIG. 1, these integrated circuits (subsequently sometimes referred to as "ICs") are shown as 3A, . . . 3M, . . . 3N. It should be understood that, while further integrated circuits of similar structure are present between the integrated circuit 3A and the integrated circuit 3M, and between the integrated circuit 3M and the integrated circuit 3N, these are omitted from FIG. 1 in order to avoid troublesome explanation of structures that are essentially similar.

Each of the integrated circuits 3A, . . . 3M, . . . 3N detects the voltages of the battery cells (hereinafter sometimes referred to as "battery cells") BC1 through BC4 that make up its respectively corresponding one of the cell groups GB1, . . . GBM, . . . GBN. Moreover, in order to make the states of charge SOC (State Of Charge) of all the battery cells of all the cell groups uniform, each of the integrated circuits 3A, . . . 3M, . . . 3N is provided with state of charge adjustment resistors R1 through R4 for adjusting the SOCs of the battery cells BC1 through BC4 individually, these resistors being connected in parallel with the corresponding battery cells via switching elements. The switching elements will be described hereinafter in connection with FIG. 2.

Furthermore, each of the integrated circuits 3A, 3M, 3N is endowed with the function of detecting abnormality in the states of the battery cells BC1 through BC4 included in its respectively corresponding cell group GB1, . . . GBM, . . . GBN. All of these integrated circuits have the same construction, and each of them includes (1) a terminal voltage measurement circuit, (2) a state of charge adjustment circuit, and (3) an abnormal state detection circuit. In this embodiment, by an abnormal state is meant over-charge or over-discharge of a battery cell, abnormal elevation of the temperature of a battery cell, or the like.

The transmission and reception of signals between the integrated circuits 3A, 3M, and 3N and the higher ranking battery controller 20 is performed via a communication harness 50. It is arranged for the battery controller 20 to take the chassis potential of the vehicle as a ground (GND), and to operate upon a low potential less than or equal to 12 V. On the other hand, the integrated circuits 3A, 3M, and 3N are kept at different potentials from one another and operate at different potentials, since the potentials of the various battery cells that make up the corresponding cell groups are different. As previously described, the terminal voltages of the battery cells change on the basis of their SOCs. Due to this, the potential of each cell group of the battery unit 9 with respect to its lowest potential changes on the basis of the SOCs. Since each of the integrated circuits 3A, 3M, and 3N detects the terminal voltages of the battery cells of the corresponding cell group of the battery unit 9, and performs discharge control or the like in order to adjust the states of charge SOC of the battery cells of the corresponding cell group, accordingly changing the reference potential of the integrated circuit on the basis of the corresponding cell group means that the voltage difference applied to the integrated circuit becomes smaller. Applying a low voltage difference to the integrated circuit has the beneficial effects that it is possible for the withstand voltage of the integrated circuit to be smaller, and that the security and the reliability and so on are enhanced; and accordingly, in this embodiment, it is arranged to change the reference potential of the integrated circuits on the basis of the potential of the cell group to which it is related. By connecting a GND terminal of each of the integrated circuits (that constitutes its reference potential) to somewhere on one of the battery cells of the cell group to which that integrated circuit is related, it becomes possible to change the reference potential of that integrated circuit on the basis of the potential of the cell group to which it is related. In this embodiment, the terminal of the battery cell of each cell group that is at the lowest potential is connected to the GND terminal of the corresponding integrated circuit.

Furthermore, in order to generate a reference voltage and a power supply voltage internally to each of the integrated circuits for operating the internal circuitry of the integrated circuits, the terminal V1 of each of the integrated circuits is connected to the positive terminal of the battery cell of the corresponding cell group that is at the highest potential, and the GND terminals of the integrated circuits are connected to the negative terminals of the battery cells of the corresponding cell groups that are at the lowest potential. With this type of structure, each of the integrated circuits operates by receiving the potential difference, in other words the voltage, between the highest potential and the lowest potential of its cell group. It is arranged to apportion the electrical power consumed by each of the integrated circuits equally between the battery cells of the battery unit 9, and this also has the advantageous effect of suppressing imbalance of the SOCs.

The potential relationships of the power supply system of the battery controller 20 and the power supply system of the cell controller 80 are different, and moreover the values of their voltages greatly differ. Due to this, the communication harness 50 that is connected to the battery controller 20 is needed to be electrically insulated from the transmission paths 52 and 54 by which the transmission and reception terminals of the integrated circuits 3A, 3M, and 3N. Because of this, insulating circuits for electrical insulation are provided on both the input sides and the output sides of the transmission paths 52 and 54 configured by the integrated circuits.

The insulation circuit provided on the input sides of the transmission paths 52 and 54 is shown as an input side interface INT(E), while the insulation circuit provided on their output sides is shown as an output side interface INT(O). These interfaces INT(E) and INT(O) include circuits that convert electrical signals once into optical signals and then convert them back into electrical signals, and information is transmitted via these circuits. As a result, electrical insulation is maintained between the electrical circuitry of the battery controller 20 and the electrical circuitry of the cell controller 80. The interface INT(E) on the input side incorporates photocouplers PH1 and PH2. The photocoupler PH1 is provided between a transmission terminal TX of the battery controller 20 and a reception terminal RX of the integrated circuit 3A on the high potential side. And the photocoupler PH2 is provided between a transmission terminal FF-TEST of the battery controller 20 and a reception terminal FFI of the integrated circuit 3A. These photocouplers PH1 and PH2 within the input side interface INT(E) maintain electrical insulation between the transmission terminals TX and FF-TEST of the battery controller 20 described above, and the reception terminals RX and FFI of the integrated circuit 3A.

In a similar manner, photocouplers PH3 and PH4 of an output side interface INT(O) are provided between the reception terminals of the battery controller 20 and the integrated circuit 3N on the low potential side, and these photocouplers PH1 and PH2 maintain electrical insulation between the reception terminals of the battery controller 20 and the integrated circuit 3N. To explain this matter in more detail, the photocoupler PH3 is provided between a transmission terminal TX of the integrated circuit 3N and a reception terminal RX of the battery controller 20, while the photocoupler PH4 is provided between a transmission terminal FFO of the integrated circuit 3N and a reception terminal FF of the battery controller 20.

Signals transmitted from the transmission terminal TX of the battery controller 20 are received at its the reception terminal RX via the integrated circuits 3A, . . . 3M, . . . 3N along a loop shaped communication path. In other words, a signal that is transmitted from the transmission terminal TX of the battery controller 20 is received by the reception terminal RX of the integrated circuit 3A via the photocoupler PH1 in the input side interface INT(E), is then transmitted from the transmission terminal TX of the integrated circuit 3A . . . and received by the reception terminal RX of the integrated circuit 3M, is then transmitted from the transmission terminal TX of the integrated circuit 3M . . . and received by the reception terminal RX of the integrated circuit 3N, and is then transmitted from the transmission terminal TX of the integrated circuit 3N and received by the reception terminal RX of the battery controller 20 via the photocoupler PH3 of the output side interface INT(O). Serial communication is performed via this type of loop shaped communication path. It should be understood that measurement values such as the terminal voltages of the battery cells and their temperatures and so on are received by the battery controller 20 via this serial communication. Moreover, the integrated circuits 3A through 3N are constructed so that, when they receive a command via this transmission path, they automatically go into the "wake-up" state. Accordingly, when a communication command 292 that will be described hereinafter is transmitted from the battery controller 20, each of the integrated circuits 3A through 3N changes over from its sleep state to its operational state.

Each of the integrated circuits 3A through 3N also performs abnormality diagnosis, and, if there is an abnormality, transmits a 1-bit signal via the following transmission path. If one of the integrated circuits 3A through 3N has determined that an abnormality is present in itself, or if it has received a signal indicating an abnormality from the previous one of the integrated circuits at its reception terminal FFI, then it transmits an abnormality signal from its transmission terminal FFO. On the other hand, if such a signal indicating an abnormality that was already being received at its reception terminal FFI disappears, or if the integrated circuit decides that its own determined abnormality is now normal, then it stops transmitting an abnormality signal from its transmission terminal FFO. In this embodiment, this abnormality signal is a 1-bit signal. While the battery controller 20 does not transmit any abnormality signal to the integrated circuits, in order to check that the transmission path for abnormality signals is operating correctly, it transmits a test signal (i.e. a pseudo-abnormality signal) from a terminal FFTEST of the battery controller 20. This transmission path will now be explained.

This test signal that is a pseudo-abnormality signal is transmitted from the transmission terminal FFTEST of the battery controller 20 via the photocoupler PH2 of the input side interface INT(E) to the reception terminal FFI of the integrated circuit 3A. Upon receipt of this signal, a signal (hereinafter referred to as an abnormality signal) that indicates an abnormality is transmitted from the transmission terminal of the integrated circuit 3A, is transmitted in order via the subsequent integrated circuits, and is transmitted to the reception terminal FFI of the integrated circuit 3M. And the abnormality signal continues to be transmitted sequentially in this manner, and is finally transmitted to the reception terminal FF of the battery controller 20 from the transmission terminal FFO of the integrated circuit 3N via the photocoupler PH4 of the output side interface INT(O). Thus, if this transmission path is operating normally, the pseudo-abnormality signal that was transmitted from the battery controller 20 returns back to the reception terminal of the battery controller 20 via the above transmission path. Accordingly it is possible for the battery controller 20 to check the communication path by sending and receiving a pseudo-abnormality signal in this manner, so that the reliability of the system is enhanced. Moreover, as described above, by any integrated circuit that has detected an abnormal state sending an abnormality signal to the next integrated circuit even though it has not received any such transmission request from the battery controller 20, this abnormal state is rapidly transmitted to the battery controller 20. Accordingly it is possible rapidly to undertake countermeasures against the abnormality.

While, in the explanation described above, the transmission of the signal was performed from the integrated circuit 3A corresponding to the group in the battery unit 9 that was at the highest potential in the direction of the integrated circuit 3N corresponding to the cell group at the lowest potential, this is only one possible example. Conversely, it would also be possible to arrange for the signal to be transmitted from the battery controller 20 to the integrated circuit 3N corresponding to the group in the battery unit 9 that is at the lowest potential, thereafter to be transmitted in order to the integrated circuits (including the integrated circuit 3M) corresponding to the cell groups at higher potentials in sequence, and finally to be transmitted from the integrated circuit 3A corresponding to the cell group that is at the highest potential via the interface INT to the battery controller 20. By constructing the transmission path according to change of potential in this manner, i.e. from the highest potential to the lowest potential or from the lowest potential to the highest potential, it becomes unnecessary to provide any insulation means such as photocouplers or the like between the integrated circuits, and accordingly it is possible to construct a transmission path having a simple structure at a low cost.

The DC power supply system shown in FIG. 1 supplies DC electrical power to a load such as an inverter device or the like via a positive electrode side relay RLP and a negative electrode side relay RLN. The opening and closing of these relays RLP and RLN is controlled from the battery controller 20 or the inverter device, if one of the integrated circuits has detected an abnormality.

The battery controller 20 receives the output of a current sensor Si, and thus detects the current that is being supplied to the inverter device from the battery unit 9 as a whole. Moreover, the battery controller 20 detects the DC voltage that is being supplied to the inverter device from the battery unit 9 according to the output of a voltage sensor Vd.

The Integrated Circuits

Figure 2:
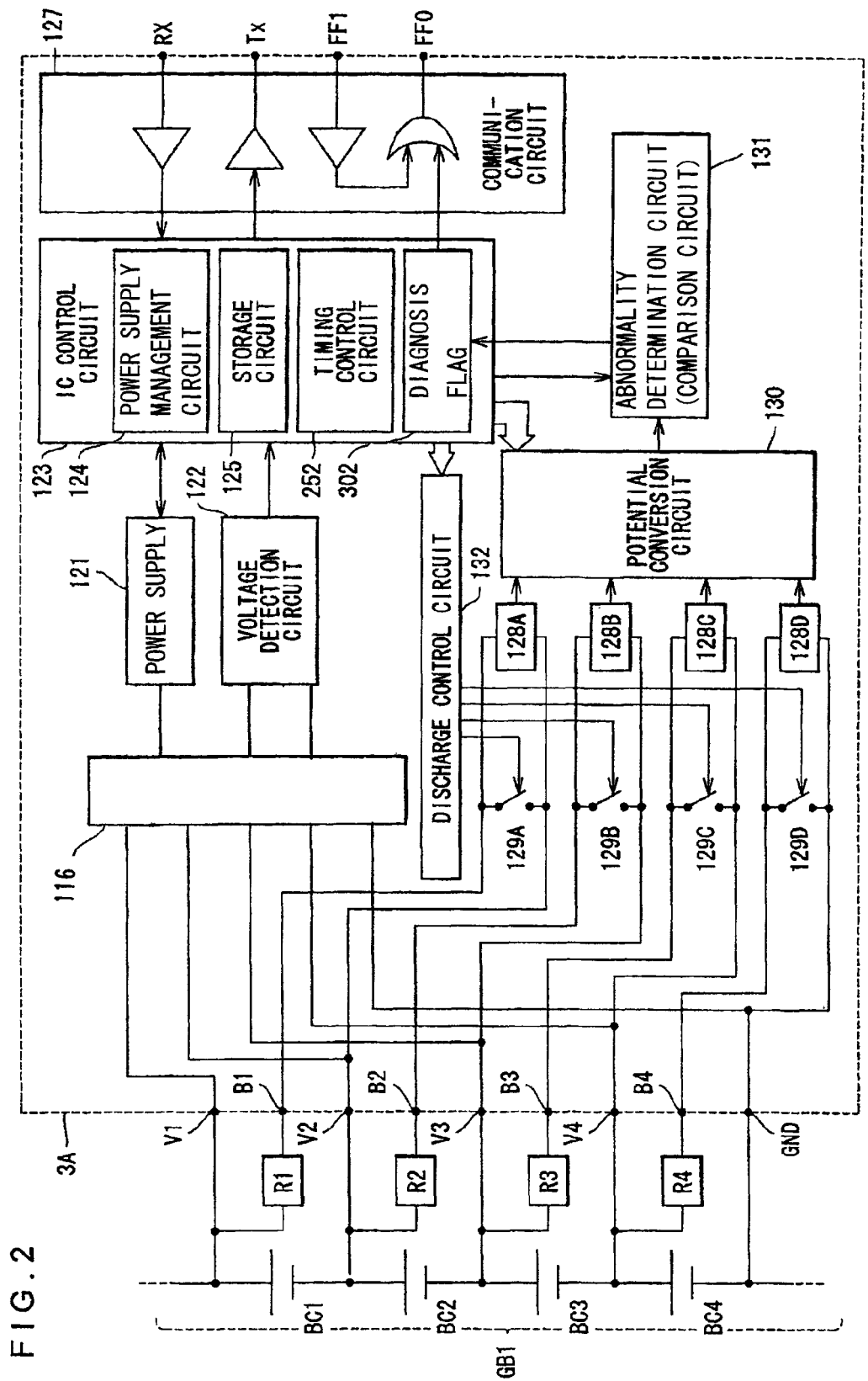
FIG. 2 is a block diagram showing the details of an integrated circuit 3A.

FIG. 2 is an electronic circuit block diagram, showing an example of the integrated circuit 3A. As described above, each of the integrated circuits 3A, . . . 3M, . . . 3N has the same construction. Accordingly, the structures of the integrated circuits other than the integrated circuit 3A are the same as the structure shown in FIG. 2. The integrated circuit 3A shown in FIG. 2 is connected to the battery cells BC1 through BC4 included in the cell group GB1 of the battery unit 9 that corresponds to this integrated circuit. While this integrated circuit 3A is explained as a representative example, the integrated circuits other than the integrated circuit 3A are also connected to respectively corresponding cell groups of the battery unit 9, and perform similar operations. It should be understood that while, as shown in FIG. 1, the integrated circuit 3A and the resistors R1 through R4 are provided to the cell controller 80, in FIG. 2 the reference symbol 80 is omitted.

The input side terminals of the integrated circuit 3A are connected to the battery cells BC1 through BC4 that make up the cell group GB1. The positive terminal of the battery cell BC1 is connected via the input terminal V1 to an input circuit 116. This input circuit 116 includes a multiplexer, as will be described hereinafter. And the positive terminal of the battery cell BC2, that is also the negative terminal of the battery cell BC1, is connected to the input circuit 116 via an input terminal V2; the positive terminal of the battery cell BC3, that is also the negative terminal of the battery cell BC2, is connected to the input circuit 116 via an input terminal V3; and the positive terminal of the battery cell BC4, that is also the negative terminal of the battery cell BC3, is connected to the input circuit 116 via an input terminal V4. Moreover, the negative terminal of the battery cell BC4 is connected to the GND terminal of the integrated circuit 3A.

The power supply circuit 121 is, for example, built as a DC/DC converter, and converts electrical power from the battery cells BC1 through BC4 to a predetermined constant voltage. These voltages are supplied to various circuits within the integrated circuit 3A as supply of driving power, and to a comparison circuit for state determination as a comparison reference voltage.

The voltage detection circuit 122 includes a circuit that converts the voltage between the terminals of each of the battery cells BC1 through BC4 to a digital value. These voltages between terminals that have been converted to digital values are sent to an IC control circuit 123, and are stored in an internal storage circuit 125. These voltages are employed for diagnosis and so on, and are also transmitted from a communication circuit 127 to the battery controller 20 shown in FIG. 1.

The IC control circuit 123, along with having a calculation function, also includes the storage circuit 125, a power supply management circuit 124, and a timing control circuit 252 that performs detection of voltages of various types and state diagnosis on a periodic basis. The storage circuit 125 may be built, for example, as a register circuit, and stores the voltages between the terminals of the battery cells BC1 through BC4 detected by the voltage detection circuit 122 in correspondence with those battery cells BC1 through BC4, and also holds other detected values so that they can be read out to addresses determined in advance. And the power supply management circuit 124 manages the state of the power supply circuit 121.

The communication circuit 127 is connected to the IC control circuit 123. The IC control circuit 123 receives signals from the exterior of this integrated circuit 3A via this communication circuit 127. For example, communication commands from the battery controller 20 are received at the RX terminal via the photocoupler PH1 of the input side interface INT(E). These communication commands are sent from the communication circuit 127 to the IC control circuit 123, the contents of these communication commands are decoded therein, and processing is performed corresponding to the contents of these communication commands. These communication commands include, for example, communication commands that request the measured values of voltage between the terminals of the battery cells BC1 through BC4, communication commands that request discharge operation in order to adjust the states of charge of the battery cells BC1 through BC4, communication commands that start the operation of the integrated circuits such as 3A (wake-up commands), communication commands that stop their operation (sleep commands), communication commands that request address setting, and so on.

In FIG. 2, the positive terminal of the battery cell BC1 is connected to a terminal B1 of the integrated circuit 3A via the resistor R1. And a balancing switch 129A is provided between this terminal B1 and the terminal V2. An operational state detection circuit 128A is connected in parallel with the balancing switch 129A for detecting the operational state of this switch. And the opening and closing of this balancing switch 129A is controlled by a discharge control circuit 132. In a similar manner, the positive terminal of the battery cell BC2 is connected to a terminal B2 of the integrated circuit 3A via the resistor R2, and a balancing switch 129B is provided between this terminal B2 and the terminal V3. An operational state detection circuit 128B is connected in parallel with the balancing switch 129B for detecting the operational state of this switch. And the opening and closing of this balancing switch 129B is controlled by the discharge control circuit 132.

Moreover, the positive terminal of the battery cell BC3 is connected to a terminal B3 of the integrated circuit 3A via the resistor R3, and a balancing switch 129C is provided between this terminal B3 and the terminal V4. An operational state detection circuit 128C is connected in parallel with the balancing switch 129C for detecting the operational state of this switch. And the opening and closing of this balancing switch 129C is controlled by the discharge control circuit 132. Furthermore, the positive terminal of the battery cell BC4 is connected to a terminal B4 of the integrated circuit 3A via the resistor R4, and a balancing switch 129D is provided between this terminal B2 and the terminal GND. An operational state detection circuit 128D is connected in parallel with the balancing switch 129D for detecting the operational state of this switch. And the opening and closing of this balancing switch 129D is controlled by the discharge control circuit 132.

These operational state detection circuits 128A through 128D detect the voltages between the two ends of the respective balancing switches 129A through 129D repeatedly on a predetermined cycle, and thus detect whether or not the balancing switches 129A through 129D are operating normally. These balancing switches 129A through 129D are switches for adjusting the states of charge of the battery cells BC1 through BC4. If there is some abnormality with any of these balancing switches, then there is a fear that it may not be possible to control the states of charge of the battery cells, or that one of the battery cells may become over-charged or over-discharged. A detection of abnormality for the balancing switches 129A through 129D may for example be made if, despite that some one of the balancing switches supposed to be in a state of continuity, a terminal voltage for the corresponding battery cell is shown between the terminals of that balancing switch. In this case, the balancing switch is not going into the continuous state on the basis of its control signal. On the other hand if, despite that some one of the balancing switches supposed to be in the open state, the voltage between the terminals of that balancing switch has a low value as compared to the terminal voltage of the corresponding battery cell, then in this case the balancing switch has become continuous without any relationship to its control signal. Voltage detection circuits built from differential amps and so on are used for the operational state detection circuits 128A through 128D of these balancing switches, and the decision described above is performed by comparison with a predetermined voltage by an abnormality determination circuit 131 that will be described hereinafter.

The balancing switches 129A through 129D may be built, for example, with MOSFETS, and perform the operation of discharging electrical power that has been accumulated in the respectively corresponding battery cells BC1 through BC4. An electrical load such as an inverter or the like is connected to the battery unit 9 in which the large number of battery cells are connected in series, and the supply of current to this electrical load is performed by all of this large number of battery cells that are connected in series together. Moreover, in the state in which the battery unit 9 is being charged up, a current from the electrical load is supplied to all of the large number of battery cells that are connected in series together. If the large number of battery cells that are connected in series are at different states of charge (SOC), then the supply of current to the electrical load is limited by that battery cell, among the large number of battery cells, that is in the most discharged state. On the other hand, when current is being supplied from the electrical load, then the supply of current is limited by that battery cell, among the large number of battery cells, that is in the most highly charged state.

Because of this, for example, for those battery cells, among the large number of battery cells that are connected in series, whose state of charge is higher than the average state, the balancing switches 129 connected to those battery cells are put into the continuous state, so that discharge currents flow via the resistors connected in series therewith. Due to this, the states of charge of all the battery cells that are connected in series are controlled in the direction mutually to approach one another. Furthermore, as another method, there is also a method of taking that battery cell that is in the most discharged state as a reference cell, and of determining discharge time periods on the basis of the differences of the states of charge from that of the reference cell. There are various other methods of adjusting the states of charge SOC. It is possible to obtain the states of charge by performing calculations on the basis of the terminal voltages of the battery cells. Since there is a correlation relationship between the states of charge of the battery cells and the terminal voltages of the battery cells, accordingly it is possible to bring the states of charge of the battery cells together by controlling the balancing switches 129 so as to bring the terminal voltages of the battery cells together.

The voltages between the sources and the drains of the FETs that constitute the balancing switches are detected by the operational state detection circuits 128A through 128D, and are outputted to a potential conversion circuit 130. Since the potentials of the sources and the drains of the various FETs are each different with respect to the reference potential of the integrated circuit 3A and it is difficult to perform comparison decisions for them just as they are, accordingly these potentials are arranged by the potential conversion circuit 130, and subsequently abnormality determination is performed by the abnormality determination circuit 130. Moreover, the potential conversion circuit 130 also has a function of selecting a balancing switch 129 to be diagnosed on the basis of a control signal from the IC control circuit 123. The voltage of the balancing switch 129 that has been selected is sent to the abnormality determination circuit 131. And, on the basis of a control signal from the IC control circuit 123, the abnormality determination circuit 131 compares the voltage between the terminals of the balancing switch 129 that is to be diagnosed, i.e. the signal from the potential conversion circuit 130, with a decision voltage, and makes a decision as to whether or not there is any abnormality with the balancing switches 129A through 129D.

A command signal for making the balancing switch 129 corresponding to a battery cell that is to be discharged go to continuous is sent from the IC control circuit 123 to the discharge control circuit 132. And, on the basis of this command signal, the discharge control circuit 132 outputs a signal corresponding to a gate voltage that makes the balancing switch 129A through 129D (that is built from a MOSFET as described above) go to continuous. And the IC control circuit 123 executes the discharge operation described above, upon receipt by communication from the battery controller 20 of FIG. 1 of a command for a discharge time period corresponding to that battery cell.

The abnormality determination circuit 131 detects the presence or absence of abnormality of the balancing switches 129A through 129D.

The IC control circuit 123 outputs any abnormality of the balancing switches 129A through 129D from the 1-bit transmission terminal FFO of the communication circuit 127, and transmits this to the battery controller 20 via the communication circuits 127 of the other integrated circuits. Moreover, the IC control circuit 123 transmits information specifying the abnormality of the balancing switches 129A through 129D and information that specifies the balancing switch in which abnormality is present to the battery controller 20 via the transmission terminal TX of the communication circuit 127.

The Communication Means

Figure 3:
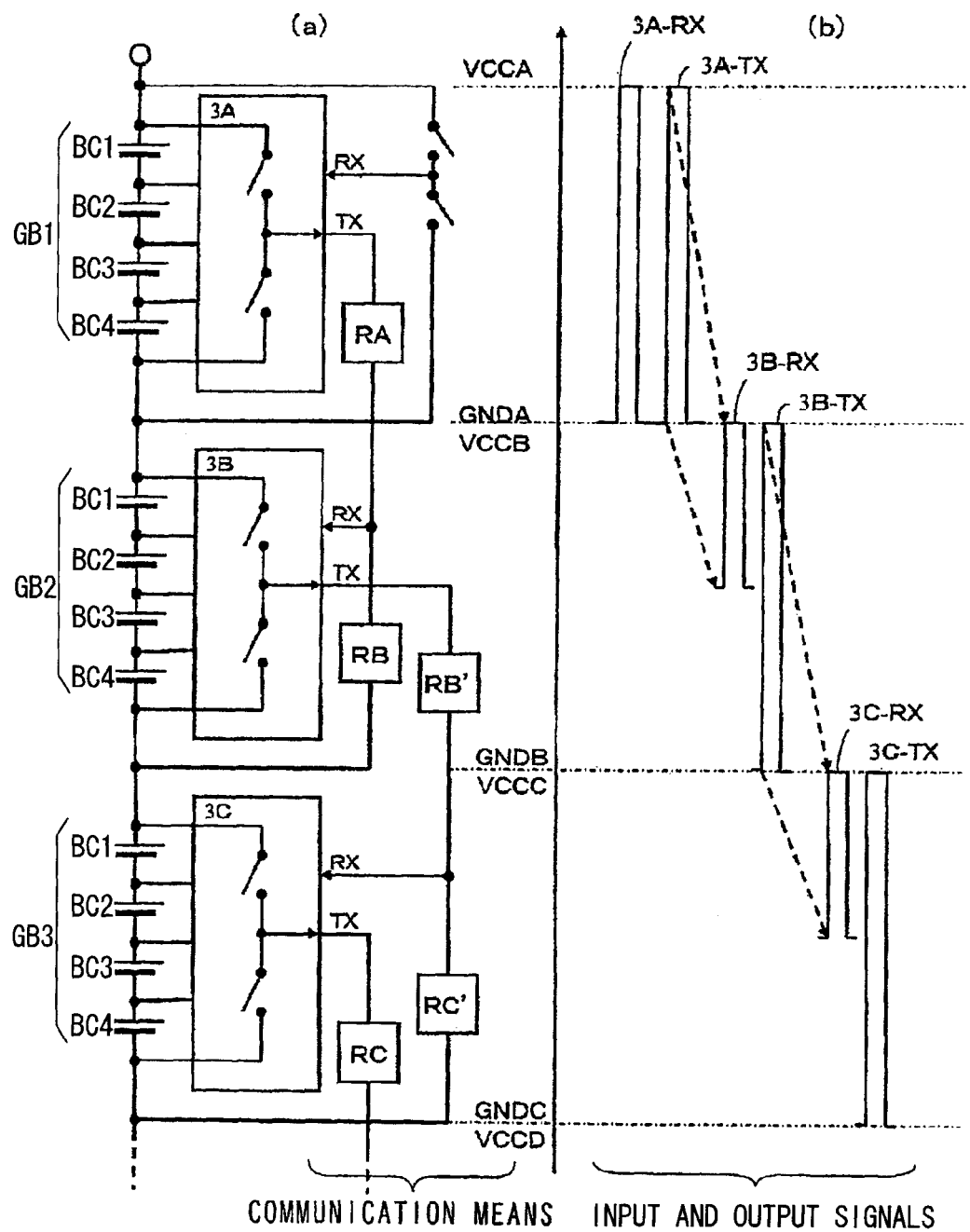
FIG. 3 is an explanatory figure showing an example of a method for transmission and reception of communication commands by integrated circuits.

FIG. 3 is an explanatory figure showing the method for transmission and reception of communication commands by the integrated circuits 3A, ... 3M, ... 3N. FIG. 3(a) shows the structure of the communication means, and FIG. 3(b) shows the potential levels of input and output signals. The signal 3A-RX denotes the signal received by the terminal RX of the integrated circuit 3A, while the signal 3A-TX denotes the signal transmitted from the terminal TX of the integrated circuit 3A; the signal 3B-RX denotes the signal received by the terminal RX of the integrated circuit 3B, while the signal 3B-TX denotes the signal transmitted from the terminal TX of the integrated circuit 3B; and the signal 3C-RX denotes the signal received by the terminal RX of the integrated circuit 3C, while the signal 3C-TX denotes the signal transmitted from the terminal TX of the integrated circuit 3C.

The signal 3A-TX is voltage divided by a resistor RA within the integrated circuit 3A and a resistor RB within the integrated circuit 3B, and thereby the signal 3B-RX is created. And the signal 3B-TX is voltage divided by a resistor RB' within the integrated circuit 3B and a resistor RC' within the integrated circuit 3C, and thereby the signal 3C-RX is created. Subsequently, in a similar manner, voltage division is performed by resistors internal to the integrated circuits connected in series in the communication path, and thereby the potentials of the received signals are determined.

FIG. 3(b) shows the potential levels of the signal 3A-RX, the signal 3A-TX, the signal 3B-RX, the signal 3B-TX, the signal 3C-RX, and the signal 3C-TX.

Towards the cell group more downstream than the cell group GB1 whose voltage level is the most significant, it is arranged for a threshold value voltage to be set to a voltage equal to half of the total voltage of four battery cells added to the total voltage of two battery cells. In other words, when a signal 3A-TX as shown in FIG. 3(b) is outputted from the integrated circuit 3A, then the input signal of the integrated circuit 3B is equal to a voltage obtained by voltage-dividing this signal 3A-TX by the resistors RA and RB. The input signal of the integrated circuit 3B becomes as shown by the signal 3B-RX in FIG. 3(b), and, when seen from the ground level GNDB of the integrated circuit 3B, its high level=VCCB that is the voltage of four of the battery cells, while its low level becomes the voltage of two of the battery cells. Since, when the threshold value is set to halfway between high and low, the potential of the threshold value becomes halfway between the potential of two of the battery cells (low level) and the potential of four of the battery cells (high level), accordingly it is set to half of the value obtained by adding together the potential of two battery cells added together and the potential of four battery cells added together.

The reason that this is done is in order to avoid the inconvenience of the low level of the signal from the TX terminal of the integrated circuit 3A becoming half of the total voltage applied to the integrated circuit 3B, if an attempt is made to decide upon the above described signal with the same threshold value as the integrated circuit 3A, while taking the voltages of the battery cells managed by the integrated circuit 3B as a reference. In other words, as a threshold value of each of the integrated circuits, the voltage of those cell that are related to that integrated circuit (the voltage of four cells) is set as a reference. If the threshold value for the integrated circuit 3A is set to halfway between the high and the low of the signal 3A-RX=(VCA−GNDA)/2, then this becomes half of the voltage of four of the cells. In a similar manner, if the threshold value for the integrated circuit 3B as well is set to half of the voltage of four of the cells=(VCCB−GNDB)/2, then the inconvenience occurs that it becomes equal to the low level of the signal 3B-RX, and this is undesirable. If, in order to avoid this type of inconvenience, for the integrated circuits 3B and subsequently, the threshold value is set as described above, then the levels of the threshold values become halfway between the highs and the lows of the signals RX. It should be understood that, while the signal levels described above have been explained under the supposition that the signal is transmitted from the high potential side to the low potential side, it would also be possible to perform level shifting by resistance division in a similar manner in the case of signal transmission from the low potential side to the high potential side.

Diagnosis and Measurement: (1) Summary of the Operating Schedule

FIG. 4 is a figure for explanation of the timing of the measurement operation. The integrated circuit 3A shown in FIG. 2 is endowed with the function of performing both measurement operation and diagnostic operation, and it performs measurement repeatedly at an operational timing shown in FIG. 4 while also performing diagnosis synchronized with this measurement. It should be understood that while, in FIGS. 1 and 2 described above, an embodiment is shown in which the cell groups GB1 through GBN of which the battery unit 9 is made up include four battery cells each, the integrated circuits 3A through 3N are circuits that can handle six battery cells each. Accordingly, the number of battery cells that make up each of the cell groups GB1 through GBN can be increased up to a maximum of six. Due to this, in the drawing of FIG. 4 that shows the operational timing, it is assumed that the cell groups consist of six battery cells.

The numbers of battery cells that make up each of the cell groups GB1 through GBN of FIG. 1 are set in the respective integrated circuits 3A through 3N that are provided to correspond to those cell groups GB1 through GBN. Due to this, each of the integrated circuits 3A through 3N generates a stage signal that corresponds to the number of battery cells in the cell group to which it is related. By employing this type of structure, along with increasing the freedom of design, it becomes possible to change the number of battery cells making up the cell groups GB1 through GBN, and, along with increasing the freedom of design, it becomes possible to perform processing at high speed.

FIG. 4 is a figure for explanation of the timings of the diagnostic operations and the measurement operations. The timings of the measurement operations and the measurement cycle, and also the timings of the diagnostic operations, are managed by a stage counter that consists of a start circuit 254, a first stage counter 256, and a second stage counter 258. The stage counters 256 and 258 generate control signals (timing signals) that manage the overall operation of the integrated circuit 3A. These stage counters 256 and 258 are not actually separate, but here, for the ease of understanding, they are shown as being separate. The stage counters 256 and 258 may be conventional counters, or may be shift registers.

When (1) a communication command that requests wakeup arrives from the transmission path and is received at the terminal RX, or (2) the power supply voltage of the ICs of the integrated circuit reaches a predetermined voltage, or (3) a signal is received that indicates that a starter switch (key switch) of the vehicle is turned on, then the start circuit 254 outputs reset signals to the first and second stage counters 256 and 258 and puts these stage counters 256 and 258 into their initial states, and outputs a clock signal of a predetermined frequency. In other words, the integrated circuit 3A executes measurement operation and diagnostic operation upon the conditions (1) through (3) described above. On the other hand, when a communication command that requests sleeping is received from the transmission path, or when no communication command can be received for greater than or equal to some predetermined time period, then the start circuit 254 stops the output of the clock signal at the timing that the stage counters 256 and 258 are returned to their reset states, in other words to their initial states. Since the progression through the stages is stopped by stopping this output of the clock signal, accordingly the execution described above of the measurement operations and the diagnostic operations goes into the stopped state.

Upon receipt of the clock signal from the start circuit 254, the first stage counter 256 outputs a counted value that controls the processing timings in each interval of a stage STG 2 (each of an interval [RES of STGCa1] through [measurement of STGPSBG] that will be described hereinafter). And a decoder 257 generates a timing signal STG1 that controls the processing timings in each interval of the stage STG2. According to the progress of the counted value of the second stage counter 258, the corresponding interval shifts from the left to the right of the operation table 260. And the stage signal STG2 that specifies each of these intervals is outputted from the decoder 259, according to the counted value of the second stage counter 258.

The first stage counter 256 is a lower ranking counter, while the second stage counter 258 is a higher ranking counter. With the counted value of the second stage counter 258 at "0000", and while the counted value of the first stage counter 256 is "0000" through "1111", a signal specifying a RES interval of a stage STGCa1 (hereinafter termed [STGCa1 RES]) is outputted from the decoder 259. And processing of various types to be performed during the interval [STGCa1 RES] is executed on the basis of the signal of the decoder 257 that is outputted on the basis of the counted value "0000" through "1111" of the first stage counter 256.

It should be understood that while, in FIG. 4, the first stage counter 256 is described in a simplified manner as being a 4-bit counter, if for example this first stage counter 256 is an 8-bit counter, then, if it is supposed that different processing operations are to be performed for each count, it becomes possible to deal with processes of 256 types. The same holds for the second stage counter 258 as for the first stage counter 256; a large number of processes can be handled by making a large counted number possible.

When the counted value of the first stage counter 256 becomes "1111" the interval [RES of STGCa1] ends, and the counted value of the second stage counter 258 becomes "0001" and the interval [measurement of STGCa1] starts. And various types of processing are executed on the basis of the signal outputted from the decoder 257 on the basis of the counted value "0000" through "1111" of the first stage counter 256. Then when the counted value of the first stage counter 256 becomes "1111" the interval [measurement of STGCa1] ends, and the counted value of the second stage counter 258 becomes "0010" and the interval [STGCV1 RES] starts. Next when in this interval [STGCV1 RES] the counted value of the first stage counter 256 becomes "1111" the interval [STGCV1 RES] ends, and the counted value of the second stage counter 258 becomes "0011" and the interval [STGCV1 measurement] starts.

In this manner, the operating interval shifts rightwards starting from the interval [STGCAL RES] in order according to the count of the second stage counter 258, and the main operation ends at the end of the interval [STGPSBG measurement]. After this, when the count of the second stage counter increases, the interval [STGCa1 RES] starts for a second time.

It should be understood that since, in the embodiment shown in FIG. 2, each of the cell groups GB1 through GBN of the battery unit 9 consists of four battery cells, accordingly the stage STGCV5 and the stage STGCV6 of the table 260 are not used, or the processing skips so that the stage STGCV5 and the stage STGCV6 do not exist. Moreover, if the contents of the second stage counter 258 is forcibly set to a specified counted value, then the processing in the interval that corresponds to that counted value is executed.

Diagnosis and Measurement: (2) Diagnosis and Measurement at Each Stage

Next, the details of the measurement and diagnosis described in the various stages of the row 260Y1 of the operation table 260 of FIG. 4 will be explained. As previously described, each stage has a RES interval and a measurement interval: diagnostic operation is performed in the RES interval, while measurement operation, diagnostic operation, and diagnosis of the subject that was measured on the basis of the value that has been measured are performed in the measurement interval. Each of the circular marks shown in the rows 260Y3 to 260Y9 of the table 260 means that the diagnosis item described in the respective row is being executed in the interval marked by that circular mark. These diagnosis items are diagnosed by control devices included in the integrated circuits, in other words by the measurement systems or the battery cell discharge control systems shown in FIG. 2 themselves.

It should be understood that, in the RES interval for each stage, not only is diagnosis for the item shown by the circular mark performed, but also initialization of the analog/digital converter 122A used for measurement is performed. In this embodiment, in order to reduce the influence of noise, analog/digital converters 122A are used of the charge/discharge type in which capacitors are employed. Discharge of the charges accumulated in these capacitors while previous operations were being performed and so on is also carried out in these RES intervals. And, in the measurement interval for each stage of the row 260Y2, measurement is executed using the analog/digital converter 122A, and diagnosis of the subject that was measured is performed on the basis of the value that has been measured.

In the RES interval of the stage STGCa1, principally the self-diagnosis shown in the rows 260Y3 through 260Y9 is performed. In other words, the diagnosis described in the row 260Y6 of the input circuit 116 that functions as a multiplexer (HVMUX), the diagnosis described in the row 260Y7 of the change over circuit of the input circuit 116 that performs change over operation (HVMUX signal selection), and the items described in the row 260Y9, i.e. diagnosis of the selection signals for the portions that perform digital comparison operation internal to the integrated circuit (the selection signals for a present value storage circuit 274 and a reference value storage circuit 278 in FIG. 5), and so on are performed.

In the measurement interval of the stage STGCa1, the items described in the row 260Y3, i.e. measurement of the drain voltages of the balancing switches 129 for adjusting the states of charge of the battery cells and diagnosis of the balancing switches 129, are performed. Moreover, together therewith, the item described in the row 260Y5, i.e. diagnosis of the digital comparison circuitry internal to the integrated circuit, is also performed. And as described in the row 260Y8, diagnosis is performed as to whether or not the circuit that generates a threshold value for detecting the states of the battery cells (over-charge or over-discharge) is normal or not. Supposing that this circuit that generates this threshold value has become abnormal, then it becomes impossible to perform over-discharge diagnosis correctly. Furthermore, in the measurement interval of the stage STGCa1, the diagnoses of the row 260Y7 and the row 260Y9 are also performed. It should be understood that the diagnosis items described in the row 260Y7 and the items described in the row 260Y9 are executed in the RES interval and in the measurement interval of all of the stages. This diagnosis execution cycle is only one example; instead of diagnosis each time around the main cycle, it would also be acceptable to perform diagnosis at longer intervals.

In the measurement intervals of the stage STGCV1 to the stage STGCV6, the terminal voltages of the battery cells are measured in order, and diagnosis is performed as to whether or not each of the battery cells is in the over-charged state or the over-discharged state. In order for the over-charged state or the over-discharged state not actually to become established, this diagnosis of over-charge or over-discharge is set to have a certain security width. It should be understood that, if there are four battery cells in each of the groups GB1 through GBN as shown in FIGS. 1 and 2, then the stage STGCV5 and the stage STGCV6 are skipped. In the measurement interval of the stage STGVDD, the output voltage of the power supply circuit 121 shown in FIG. 2 is measured. And in the measurement interval of the stage STGTEM, the output voltage of the temperature sensor is measured. Moreover, in the measurement interval of the stage STGPSBG, the reference voltage is measured.

In relation to the diagnostic operation, in the RES intervals of the stage STGCV1 through the stage STGPSBG, similar diagnostic operations are performed to those in the RES interval of the stage STGCa1. Moreover, in the measurement intervals of the stage STGCV1 through the stage STGTEM, for all of the intervals, the diagnosis items shown in the row 260Y7 and in the row 260Y9 are executed. And in the stage STGTEM, diagnosis is performed as to whether the analog circuitry internal to the integrated circuits, the analog/digital converter, and the circuit that generates the reference voltage, i.e. the diagnosis items described in the row 260Y4, is overall operating normally or not. Moreover, the diagnosis items shown in the row 260Y7 and in the row 260Y9 are also executed. The voltage that is outputted from the reference voltage generation circuit is an already known voltage value, and if the result of measurement of this voltage value does not fall within a predetermined range, then it is possible to determine that there is some abnormality with the circuitry described above, so that it is possible to diagnose that a state is present according to which control must be stopped.

Figure 5:
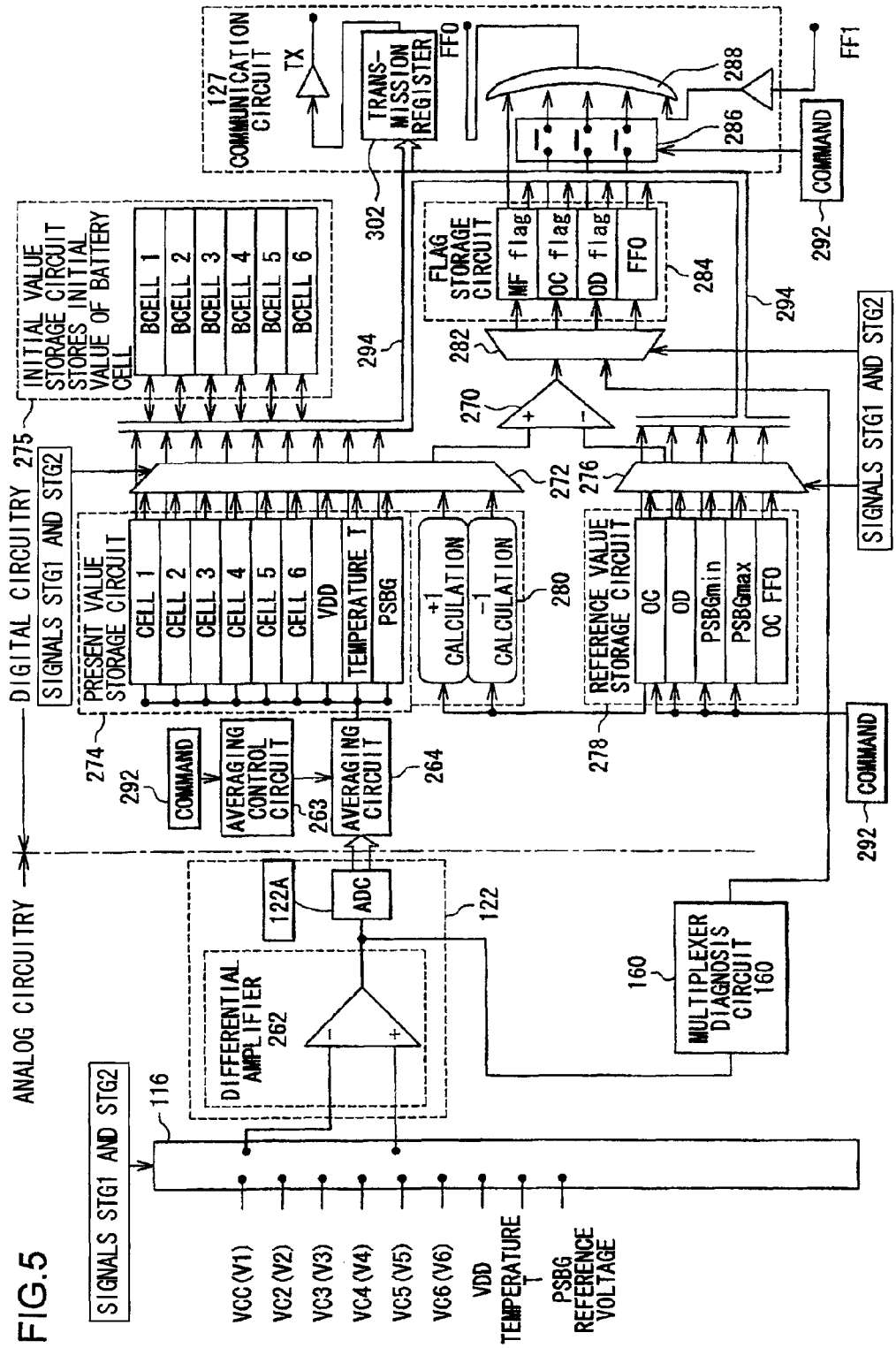
FIG. 5 is a figure for explanation of circuitry related to diagnostic operation and measurement operation.

Diagnosis and Measurement: (3) Measurement of the Terminal Voltages of the Battery Cells FIG. 5 is a figure showing the measurement circuitry and the diagnosis circuitry. The input circuit 116 is a circuit that fulfils the role of a multiplexer, and it incorporates multiplexers 118 and 120 that will be described hereinafter. The signals STG1 and STG2 are inputted to this input circuit 116 from the decoders 257 and 259 as shown in FIG. 4, and selection operation is performed by the multiplexers on the basis of these signals. In diagnosis of the multiplexers (HVMUX), the output signal of a differential amplifier 262 of the voltage detection circuit 122 is inputted to a diagnosis circuit 160, and this performs diagnosis as will be described hereinafter. Furthermore, when for example measuring the voltage of the battery cell BC1, by selecting the terminal V1 and the terminal V2, the voltage of the battery cell BC1 is outputted from the input circuit 116 to the voltage detection circuit 122. Now the measurement of the terminal voltage of the battery cells will be explained.

The voltage detection circuit 122 includes the differential amplifier 262 and an analog/digital converter 122A. It should be understood that, since the battery cells BC1 through BC4 (or BC1 through BC6) are connected in series, accordingly the negative potentials of their negative terminals are different. Due to this, the differential amplifier 262 is used in order to regulate them to a reference potential (the GND potential within the integrated circuits 3A through 3N). The output of the differential amplifier 262 is converted to a digital value by the analog/digital converter 122A, and is outputted to an averaging circuit 264. This averaging circuit 264 obtains the average value of a predetermined number of measurement results. In the case of the battery cell BC1, this average value is stored in a register CELL1 of the present value storage circuit 274. The averaging circuit 264 calculates the average value of a number of measurements held in an averaging control circuit 263, and stores its output in the present value storage circuit 274 described above. When the averaging control circuit 263 commands "1", the output of the analog/digital converter 122A is stored in the register CELL1 of the present value storage circuit 274 just as it is without being averaged. But, when the averaging control circuit 263 commands "4", the results of four measurements for the terminal voltage of the battery cell BC1 are averaged together, and this average value is stored in the register CELL1 of the present value storage circuit 274. For calculating the average value of four measurements it is necessary first to perform the measurement according to the stage of FIG. 4 four times, but, upon and after the fourth time measurement is performed, by using in the calculation the four measurement values that are the newest among the results of measurement, it becomes possible for the averaging circuit 264 to perform an averaging calculation each time measurement is performed. By providing the averaging circuit 264 that performs averaging of a predetermined number of measurements as described above, it is possible to eliminate the negative influence of noise. The DC electrical power of the battery unit 9 shown in FIG. 1 is supplied to an inverter device, and is converted into AC electrical power. The continuity and interception operation for current when converting DC electrical power into AC electrical power with an inverter device is performed at high speed, and a large amount of noise is generated at this time, but, by providing the averaging circuit 264, there is the beneficial effect that it is possible to minimize the negative influence of this sort of noise.

The digital value of the terminal voltage of the battery cell BC1 that has thus been converted to digital form is stored in the register CELL1 of the present value storage circuit 274. The measurement operation described above is performed during the interval [measurement of STGCV1] of FIG. 4. Thereafter, in the time period shown as measurement of the stage STGCV1, diagnostic operation is performed on the basis of the measured value. For this diagnostic operation, both over-charge diagnosis and over-discharge diagnosis are performed. First, the digital value for the terminal voltage of the battery cell BC1 is stored in the register CELL1 of the present value storage circuit 274. Next, the digital multiplexer 272 reads out the terminal voltage of the battery cell BC1 from the register CELL1 of the present value storage circuit 274, and sends it to a digital comparator 270. Moreover, a digital multiplexer 276 reads out an over-charge decision reference value OC from the reference value storage circuit 278, and sends it to the digital comparator 270. The digital comparator 270 compares together the terminal voltage of the battery cell BC1 from the register CELL1 and the over-charge decision reference value OC, and sets a flag [MFflag] in a flag storage circuit 284 that indicates an abnormality, if the terminal voltage of the battery cell BC1 is greater than the over-charge decision reference value OC. Moreover, a flag [OCflag] that indicates over-charge is also set. Actually control is performed so that an over-charged state does not occur, so this type of state almost never happens. However, this diagnosis is executed repeatedly in order to guarantee the reliability.

After the over-charge diagnosis, diagnosis of over-discharge is next performed. The digital multiplexer 272 reads out the terminal voltage of the battery cell BC1 from the register CELL1 of the present value storage circuit 274, and sends it to the digital comparator 270. And the digital multiplexer 276 reads out an over-discharge decision reference value OD from the reference value storage circuit 278, and sends it to the digital comparator 270. The digital comparator 270 compares together the terminal voltage of the battery cell BC1 from the register CELL1 and the over-discharge decision reference value OD, and sets the flag [MFflag] in the flag storage circuit 284 that indicates an abnormality, if the terminal voltage of the battery cell BC1 is smaller than the over-discharge decision reference value OD. Moreover, a flag [OCflag] that indicates over-discharge is also set. In the same manner as with the case of over-charge described above, actually control is performed so that an over-charged state does not occur, so this type of state almost never happens. However, this diagnosis is executed repeatedly in order to guarantee the reliability.

The above explanation is measurement and diagnosis related to the battery cell BC1 in the measurement interval of the stage STGCV1 of FIG. 4. In a similar manner, in the next stage STGCV2, the input circuit 116 of FIG. 5 selects the terminal voltage of the battery cell BC2, and outputs it to the voltage detection circuit 122. This terminal voltage is digitally converted by the voltage detection circuit 122, its average value is calculated by the averaging circuit 264, and this is stored in the register CELL2 of the present value storage circuit 274. And the digital comparator 270 compares together the terminal voltage of the battery cell BC2 that has been read out from the register CELL2 by the digital multiplexer 272 and the above described over-charge decision reference value OC, and next compares the terminal voltage of the battery cell BC2 with the over-discharge decision reference value OD. And the digital comparator 270 makes a decision as to abnormal state by this comparison of the over-charge decision reference value and by this comparison of the over-discharge decision reference value, and if an abnormal state is present, then it sets the flag [MFflag] in the flag storage circuit 284 that indicates an abnormality, and sets the flag [OCflag] or the flag [ODflag] that indicates the cause of the abnormality.

Subsequently, in a similar manner, in the measurement interval of the stage STGCV3 of FIG. 4, measurement of the terminal voltage of the battery cell BC3 and diagnosis of over-charge or over-discharge are performed, and then in the measurement interval of the stage STGCV4 measurement of the terminal voltage of the battery cell BC4 and diagnosis of over-charge or over-discharge are performed.

Diagnosis and Measurement: (4) Diagnosis

In the following, among the items for which diagnosis is performed in the RES intervals of the various stages shown in FIG. 4, the multiplexer diagnosis shown in the row 260Y6 will be explained.

Figure 30:
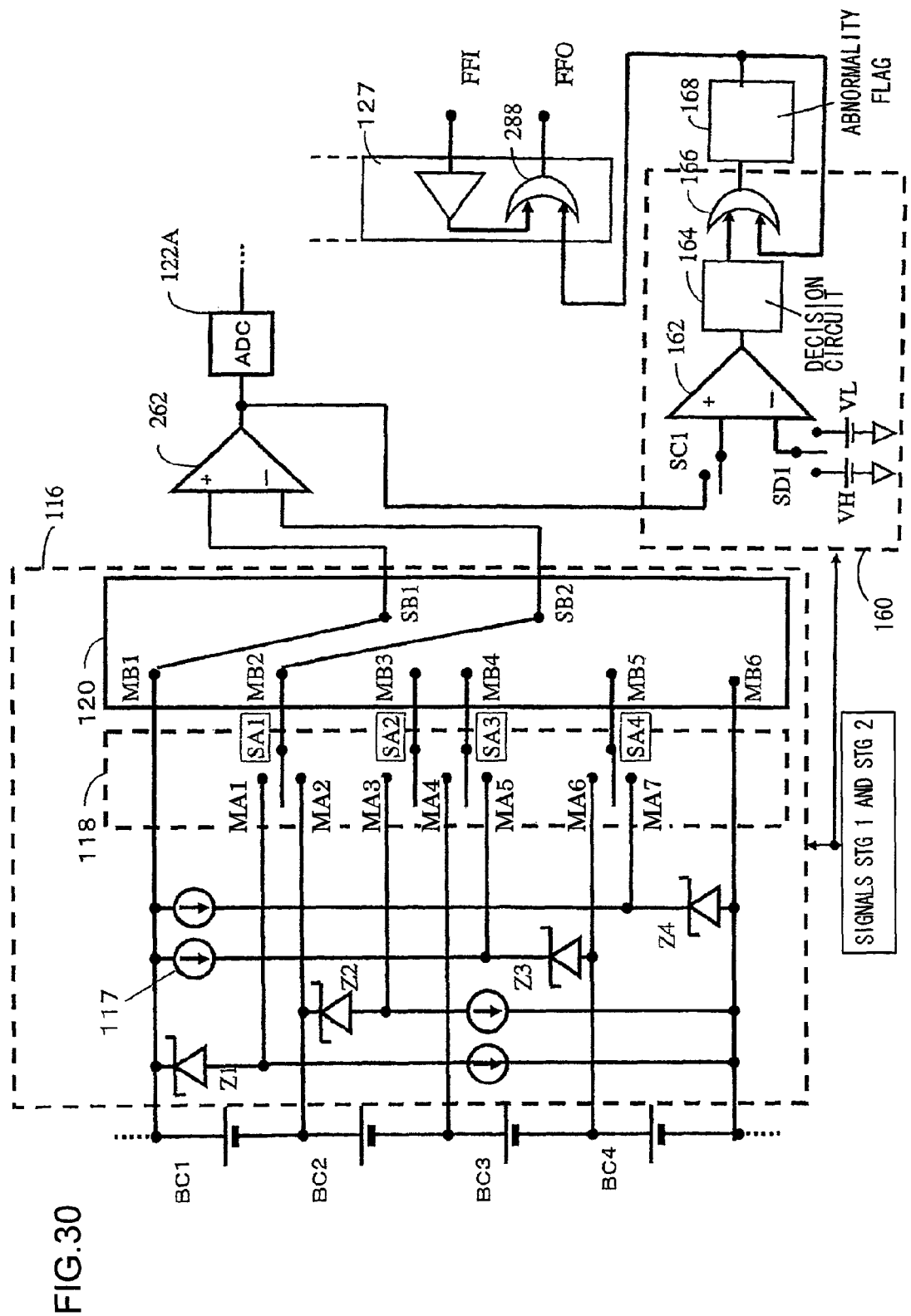
FIG. 30 is a figure for explanation of a first embodiment of multiplexer diagnosis.

The operation for multiplexer diagnosis will now be explained with reference to FIGS. 6, 30, and 34. FIG. 30 is a figure showing circuitry within the circuit shown in FIG. 5 related to multiplexer diagnosis. The input circuit 116 is internal to the integrated circuits 3A through 3N shown in FIG. 1, and incorporates the multiplexers 118 and 120. Z1 through Z4 are constant voltage generation elements or circuits of a per se known type that generate constant voltage; Zener elements may be used for these. Each of the Zener elements Z1 through Z4 generates a constant voltage Vz between its two ends due to the current of a constant current circuit 117. Here, the Zener voltages Vz of the Zener elements Z1 through Z4 are set to be equal.

The diagnosis circuit 160 is provided with a voltage comparison circuit 162, a decision circuit 164, an OR circuit 166, and voltage sources VH and VL. The signals STG1 and STG2 are inputted to the input circuit 116 and to the diagnosis circuit 160, and the operation of switches (to be described hereinafter) that are provided to the input circuit 116 and to the diagnosis circuit 160 is performed according to commands in these signals STG1 and STG2. It should be understood that, in FIG. 30, the multiplexer 120 is shown in its state in the stage STGCV1.

The diagnosis of the multiplexer 120 is performed during all of the intervals (i.e. both the RES intervals and the measurement intervals) of all of the stage STGCa1 through the stage STGPSBG, as shown in the row 260Y6 of FIG. 4. Here, as a representative of these, the intervals of the stages STGCV1 through STGCV4 will be explained. In the measurement interval of each of the stages STGCV1 through STGCV4, measurement of the terminal voltage of the corresponding battery cell is performed after having performed the diagnosis of the multiplexer 120 and having confirmed that the multiplier 120 is operating normally. Taking the same approach for the measurement intervals of the stage STGCa1 and the stage STGVDD through the stage STGPSBG, the measurement is performed after having confirmed normal operation of the multiplier 120.

FIG. 6 is a figure for explanation of the operation in the stages from the stage STGCV1 through the stage STGCV4, and herein the operation proceeds from the left to the right as time elapses. In other words, this type of switch connection operation is commanded to the input circuit 116 and the diagnosis circuit 160 by the signals STG1 and STG2. First, the stage STGCV1 will be explained. In relation to the multiplexer 120, in both the RES interval and the measurement interval of this stage STGCV1, a switch SB1 is connected to its contact point MB1, while a switch SB2 is connected to its contact point MB2. On the other hand, in relation to the multiplexer 118, in the RES interval a switch SA1 is connected to its contact point MA1, while in the measurement interval this switch SA1 is connected to its contact point MA2. The other switches SA2 through SA4 of the multiplexer 118 are in their open states during all of the intervals.

The explanation now refers to FIGS. 30 and 34. In the RES interval of the stage STGCV1 the switch SA1 is connected to its contact point MA1, and the Zener voltage Vz of the Zener element Z1 is inputted to the multiplexer 120. And the output voltage of the multiplexer 120 at this time is inputted via the differential amplifier 262 to the voltage comparison circuit 162. It should be understood that, since the battery cells BC1 through BC4 (or BC1 through BC6) are connected in series, accordingly the negative potentials of their negative terminals are different. Due to this, as described above, the differential amplifier 262 is used in order to regulate them to a reference potential (the GND potential within the integrated circuits 3A through 3N).

In the interval [STGCV1 RES] in which multiplexer diagnosis is performed, the switch SC1 of the voltage comparison circuit 162 is connected. And in order to check whether or not the output voltage Vm of the multiplexer 120 and the Zener voltage Vz that is inputted agree with one another, in other words whether or not the multiplexer 120 is operating normally, the switch SD1 is connected to the voltage source VH for upper limit comparison. The voltage VH generated by the voltage source VH is set to be higher than the above described Zener voltage Vz (that is an already known voltage). From the output of the voltage comparison circuit 162, if Vm>VH, in other words if the output voltage Vm and the inputted Zener voltage Vz are not in agreement with one another, then the decision circuit 164 takes this as meaning that the switch connection state of the multiplier 120 is not normal, and outputs an abnormality signal.

Next, the switch SD1 is connected to the voltage source VL for lower limit comparison. The voltage VL generated by the voltage source VL is set to be lower than the above described Zener voltage Vz (that is an already known voltage). From the output of the voltage comparison circuit 162, if Vm<VL, in other words if the output voltage Vm and the inputted Zener voltage Vz are not in agreement with one another, then the decision circuit 164 outputs an abnormality signal. It should be understood that here, since abnormality determination is performed by inputting the output of the differential amplifier 262 to the voltage comparison circuit 162, accordingly it is possible for an abnormality to be detected by the decision circuit 164, not only if an abnormality has occurred in the multiplexer 120, but also if an abnormality has occurred in the multiplexer 118 or in the differential amplifier 262.

If an abnormality signal is inputted from the decision circuit 164, then the OR circuit 166 of the diagnosis circuit 160 outputs an abnormality signal to the abnormality flag storage circuit 168. As a result, the abnormality flag is set in the abnormality flag storage circuit 168. This abnormality flag storage circuit 168 is the same as the register MFflag of the flag storage circuit shown in FIG. 5. When the abnormality flag is set, the abnormality flag storage circuit 168 outputs an abnormality signal to the OR circuit 166 and to the OR circuit 288 of the communication circuit 127. Due to this, when the abnormality flag is stored in the flag storage circuit 168, an abnormality signal is outputted from the OR circuit 166 even if a normal signal is being outputted from the decision circuit 164.

While detailed circuitry for this function is not shown in the figures, it should be understood that it is possible to reset the abnormality flag that has been set in the abnormality flag storage circuit 168 by a command sent via the communication circuit 127.

When the abnormality flag is stored in the abnormality flag storage circuit 168, an abnormality signal is sent continuously to the OR circuit 288. A signal from another one of the integrated circuits is inputted to the OR circuit 288 via the input terminal FFI. The OR circuit 288 outputs an abnormality signal from the output terminal FFO if an abnormality signal is being inputted from the other integrated circuit via the input terminal FFI, or if an abnormality signal is being inputted from the abnormality flag storage circuit 168. In other words, a signal that indicates normality is only outputted to the output terminal FFO under the conditions that a signal that indicates normality is being inputted to the input terminal FFI, and moreover that no abnormality flag is being stored in the abnormality flag storage circuit 168.

When on the basis of the signals STG1 and STG2 the transition from the interval [STGCV1 RES] to the interval [STGCV1 measurement] takes place, as shown in FIG. 6 that is an operational figure, along with the switch SA1 of the multiplexer 118 being connected to its contact point MA2, the switches SC1 and SD1 of the diagnosis circuit 160 are put into their open states, and thereby measurement of the terminal voltage of the battery cell BC1 is performed. At this time, the decision circuit 164 is in the non-operational state, and no normality/abnormality signal is being outputted from the decision circuit 164 to the OR circuit 166. Since, in this manner, it is arranged to perform measurement of the terminal voltage by changing over the switch SA1 of the multiplexer 118 while keeping the switched state of the multiplexer 120 (for which a normal result of multiplexer diagnosis has been reached) just as it is without alteration, accordingly it is possible to perform measurement of the terminal voltage of the battery cell BC1 in a reliable manner. It should be understood that the details of this terminal voltage measurement will be described hereinafter.

Figure 31:
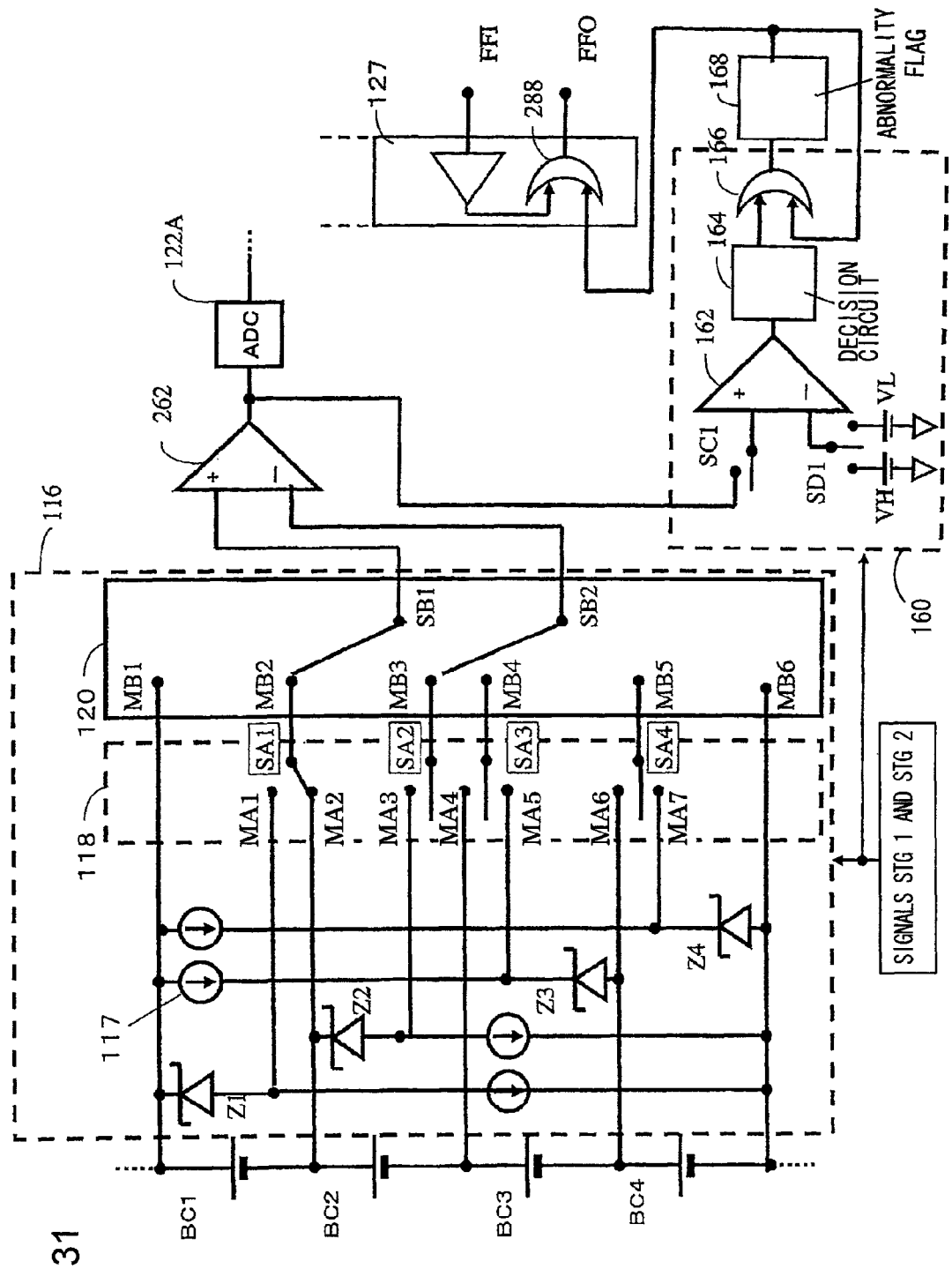
FIG. 31 is a figure for explanation of operation in a RES interval of a stage STGCV2.

When the interval [STGCV1 measurement] ends, transition to the RES interval of the stage STGCV2 takes place. In this stage STGCV2, as shown in FIG. 31, the switch SB1 is connected to the contact point MB2, while the switch SB2 is connected to the contact point MB3. As shown in FIG. 6, this switched state is maintained during both the RES interval and the measurement interval. On the other hand, in relation to the multiplexer 118, during the RES interval, the switch SA1 is connected to the contact point MA2, while the switch SA2 is connected to the contact point MA3. Moreover, during the measurement interval, the switch SA1 is connected to the contact point MA2, while the switch SA2 is connected to the contact point MA4. The other switches SA3 and SA4 of the multiplexer 118 are kept in their open states in both intervals.

In the interval [STGCV2 RES] in which multiplexer diagnosis is performed, the switch SC1 of the voltage comparison circuit 162 is connected. And, in order to check whether or not the output voltage Vm of the multiplexer 120 is equal to the Zener voltage Vz that is inputted, in other words in order to check whether or not the multiplexer 120 is operating normally, the switch SD1 is connected to the voltage source VH for upper limit comparison (i.e. to the voltage VH). As described above, this voltage VH is set to be higher than the above described Zener voltage Vz (that is an already known voltage). The decision circuit 164 outputs an abnormality signal if, from the output of the voltage comparison circuit 162, it is found that Vm>VH.

Next, the switch SD1 is connected to the voltage source VL for lower limit comparison (i.e. to the voltage VL), and the voltage VL, that is set to be lower than the above described Zener voltage Vz (that is an already known voltage), is inputted to the voltage comparison circuit 162. The decision circuit 164 outputs an abnormality signal if, from the output of the voltage comparison circuit 162, it is found that Vm<VL. The processing after an abnormality signal is outputted from the voltage comparison circuit 162 is the same as in the RES interval of the stage STGCV1 as described above, and accordingly will here be omitted.

When the interval [STGCV2 RES] ends and the transition to the interval [STGCV2 measurement] takes place, as shown in FIG. 6 that is an operational figure, along with the switch SA2 of the multiplexer 118 being connected to the contact point MA4, the switches SC1 and SD1 of the diagnosis circuit 160 are put into their open states, and measurement of the terminal voltage of the battery cell BC2 is performed. In the terminal voltage measurement of the interval [STGCV2 measurement] as well, since the switched state of the multiplexer 120 (for which a normal result of multiplexer diagnosis has been reached) is maintained just as it is without alteration, and since the measurement of terminal voltage is performed by changing over the switch SA2 of the multiplexer 118, accordingly it is possible to perform measurement of the terminal voltage of the battery cell BC2 in a reliable manner.

In the stage STGCV3, as shown in FIG. 6, in both the RES interval and the measurement interval, the switch SB1 is connected to the contact point MB4, while the switch SB2 is connected to the contact point MB5. On the other hand, in relation to the multiplexer 118, in the RES interval the switch SA3 is connected to the contact point MA5, while the switch SA4 is connected to the contact point MA6. Moreover, in the measurement interval, the switch SA3 is connected to the contact point MA4, while the switch SA4 is connected to the contact point MA6. The other switches SA1 and SA2 of the multiplexer 118 are kept in their open states in both of these intervals. And in the interval [STGCV3 RES] the diagnosis of the multiplexer 120 is performed in a similar manner to the case of the interval [STGCV2 RES] described above. When the interval [STGCV3 RES] ends, the terminal voltage of the battery cell BC3 is measured in the interval [STGCV3 measurement].

In the stage STGCV4, as shown in FIG. 6, in both the RES interval and the measurement interval, the switch SB1 is connected to the contact point MB5, while the switch SB2 is connected to the contact point MB6. On the other hand, in relation to the multiplexer 118, in the RES interval the switch SA4 is connected to the contact point MA7, while in the measurement interval the switch SA4 is connected to the contact point MA6. The other switches SA1 through SA3 of the multiplexer 118 are all kept in their open states in both of these intervals. And, in relation to the switches SC1 and SD1, similar operation is performed to that in the stages STGCV1 through STGCV3 described above, so that diagnosis of the multiplexer 120 and measurement of the terminal voltage of the battery cell BC4 are performed.

In both the stage STGCV3 and the stage STGCV4, the switched state of the multiplexer 120 (that has been diagnosed by the multiplexer diagnosis as being normal) is maintained just as it is without alteration, and it is arranged to measure the terminal voltages by changing over the switches of the multiplexer 118. Due to this, it is possible to perform measurement of the terminal voltages of the battery cells BC3 and BC4 in a reliable manner.

Diagnosis and Measurement: (5) Storage of the Initial Data

With the DC power supply system shown in FIG. 1, supply of current from the battery unit 9 to the inverter device is not performed while the vehicle is in the stopped state and before the driver starts driving the vehicle. Since the states of charge (i.e. the SOCs) of the battery cells are obtained accurately when terminal voltages of the battery cells are used that are measured in the state in which no charge or discharge current is flowing in the battery cells, accordingly the integrated circuits start their measurement operations individually on the basis of actuation of the key switch of the vehicle, or on the basis of a communication command 292 from the battery controller for wake-up or the like. When the measurement operation and the diagnostic operation for the battery cells by the integrated circuits explained in FIG. 5 has been started and a number of measurements have been performed and are held in the averaging control circuit 263, then calculation is performed by obtaining an average of the measured values with the averaging circuit 264. The result of this calculation is first stored in the present value storage circuit 274. Each of the integrated circuits independently performs measurement for all of the battery cells in the group to which that integrated circuit is related and calculation of the average values of the results of those measurements, and the results of these calculations are stored in the registers CELL1 through CELL6 of the present value storage circuits 274 of the respective integrated circuits.

In order to ascertain the state of charge (SOC) of each of the battery cells accurately, it is desirable to measure the terminal voltage of each of the battery cells in the state in which no charge or discharge current is flowing in the battery cells. As described above, by the integrated circuits starting their measurement operation individually, before supply of current from the battery unit 9 to the inverter device, each of the integrated circuits measures the terminal voltage of all the battery cells with which it has a relationship, and the results are stored in the registers CELL1 through CELL6 of the present value storage circuit 274. Since the measurement values stored in the present value storage circuit 274 are subsequently rewritten by new measurement results, accordingly the measurement results before the start of supply of current are shifted from the registers CELL1 through CELL6 of the present value storage circuit 274 to registers BCELL1 through BCELL6 of the initial value storage circuit 275, and are stored in the initial value storage circuit 275. Since the measurement values before the start of supply of current from the battery unit 9 to the inverter device are stored in the initial value storage circuit 275 in this manner, accordingly the processing for calculating the state of charge (SOC) and so on can be deferred, while preferentially executing the processing for diagnosis at a higher level of priority. After the processing at higher priority level has been executed, and after supply of current from the battery unit 9 to the inverter device has been started, it becomes possible to calculate the states of change of the battery cells on the basis of the measurement values stored in the initial value storage circuit 275, and it becomes possible to perform control for adjusting the states of charge (SOCs) on the basis of accurate state detection. In some cases the driver of the vehicle may wish to start off the operation of the vehicle from rest as quickly as possible, so that, as explained above, it is desirable to be able to supply current to the inverter device as quickly as possible.

In the embodiment shown in FIG. 5, it is possible to implement diagnosis of over-charge and over-discharge by the digital comparison circuit 270 and also diagnosis of leakage currents and so on at the timing that the measurement values before the start of supply of current to the inverter device (that is an electrical load such as that described above) are stored in the present value storage circuit 274. Due to this, it is possible to ascertain any abnormal state before the supply of DC electrical power to the inverter device. If an abnormal state is occurring, then it is possible to detect abnormality by this diagnosis before the supply of current, so that it becomes possible to institute countermeasures such as not providing supply of DC electrical power to the inverter device, or the like. Furthermore since, by the values stored in the present value storage circuit 274 being shifted to the initial value storage circuit 275, the values measured before the supply of current are continuously stored in the dedicated initial value storage circuit 275, accordingly the security is enhanced, and the superbly beneficial effect is obtained that that it is possible to ascertain very accurate states of charge (SOCs).

Communication Commands

Figure 7:
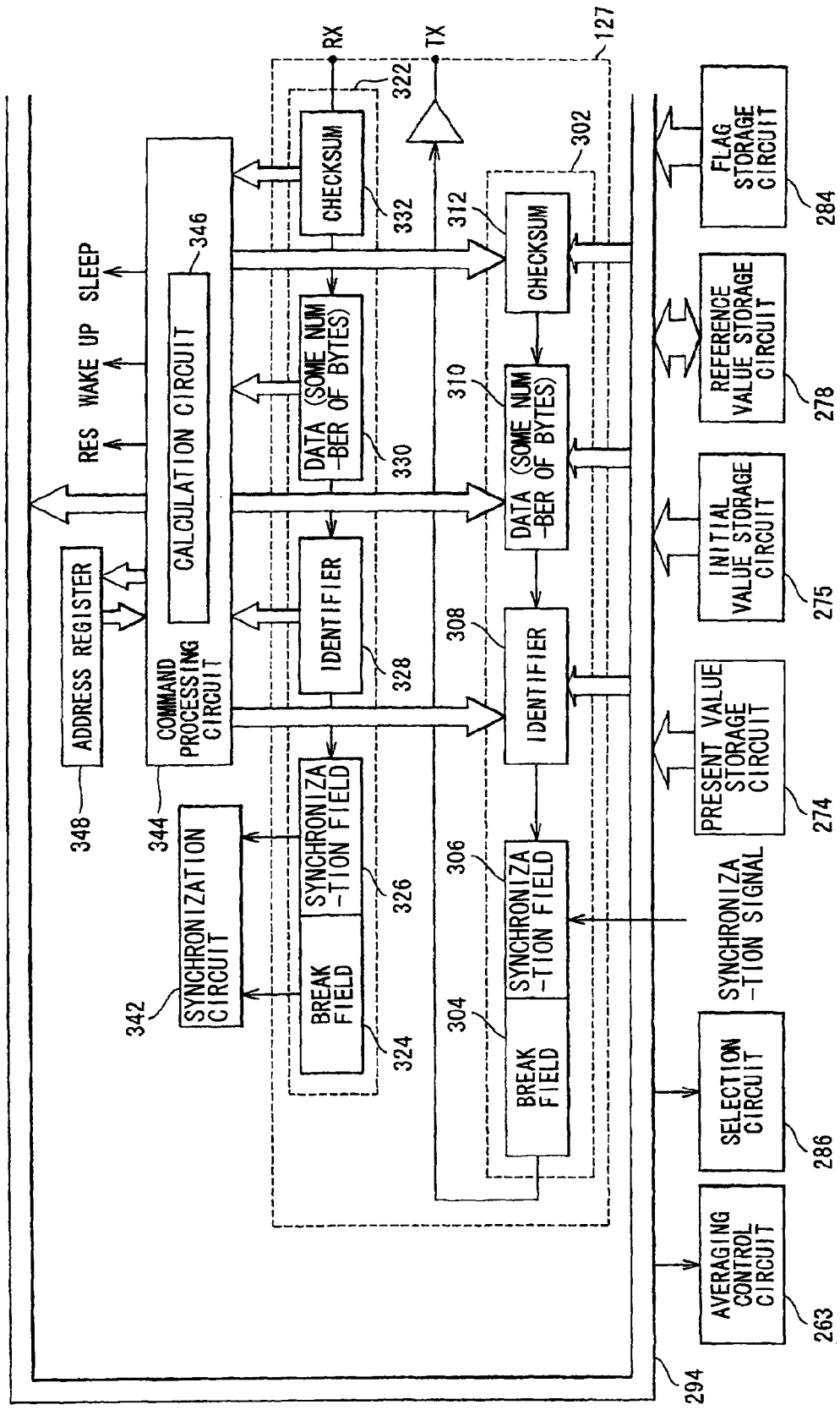
FIG. 7 is a figure for explanation of an example of a communication circuit that performs transmission and reception of communication commands and that is provided internally to an integrated circuit.

FIG. 7 is a circuit diagram for explanation of the circuitry and the operation of the communication circuit 127 provided internally to the integrated circuit 3A shown in FIG. 2 that performs transmission and reception of communication commands, and its operation will now be explained in terms of the circuit structure of the integrated circuit 3A, as a representative of the integrated circuits. As described above, the structure and operation of the other integrated circuits is the same. Communication commands sent from the battery controller 20 are received at a reception terminal RX possessed by the communication circuit 127, and have in all 5 portions, each of which consists of 8 bits; and these 5 bytes constitute a single basic structure. However, according to the explanation hereinafter, in some cases the communication commands may be longer than 5 bytes, so that they should not be considered as being particularly limited to 5 bytes. These communication commands are inputted from the terminal RX to a reception register 322, in which they are stored. It should be understood that this reception register 322 is a shift register, and signals that are inputted serially from the terminal RX are shifted in the order of input to the reception register 322, with the header portion of each communication command being stored in a break field portion 324 that is a header portion of the register, while the remainder is stored sequentially.

As described above, in a communication command 292 that is stored in the reception register 322, the 8 bits of its header are the break field 324 that consists of a signal indicating that a signal has arrived. The second 8 bits are a synchronization field 326 consisting of a signal that serves the function of establishing synchronization. The third 8 bits are an identifier 328 that specifies a subject address specifying which of the integrated circuits 3A, . . . 3M, . . . 3N is the subject of this command, and that specifies the details of the command. The fourth 8 bits are data 330 specifying the contents of this communication (i.e. its control contents), and contain data that is required for executing this command. This portion is not limited to being a single byte. And the fifth 8 bits are a checksum 332 for checking whether or not any error has occurred in the transmission and reception operation, and thereby it is possible to detect whether or not it has been impossible to perform accurate transmission due to noise or the like. Thus, in this manner, a communication command from the battery controller 20 consists of the five portions: the break field 324, the synchronization field 326, the identifier 328, the data 330, and the checksum 312. If each of these consists of one byte, then the communication command consists of five bytes, and this is the basic five byte structure, but the data 330 is not limited to being only a single byte; according to requirements, in some cases, it may be further increased in size.

The synchronization field 326 is used for establishing synchronization between the transmitted clock signal on the transmission side and on the reception side. The timing at which each pulse of the synchronization field 326 arrives is detected by the synchronization circuit 342, and synchronization by the synchronization circuit 342 is thus matched to the timing of each pulse of the synchronization field 326. The reception register 322 receives the following signal at this matched timing. By doing this, it is possible to select accurately the timing for comparing together the signal that is arriving and a threshold value for determining the truth value of that signal, and the beneficial effect is obtained that it is possible to reduce errors in the transmission and reception operation.

As shown in FIG. 1, a communication command 292 is sent from the battery controller 20 to the terminal RX of the integrated circuit 3A, then is sent from the terminal TX of the integrated circuit 3A to the terminal RX of the next integrated circuit . . . is sent to the terminal RX of the next integrated circuit 3M, is sent from the terminal TX of the integrated circuit 3M to the terminal RX of the next integrated circuit . . . is sent to the terminal RX of the next integrated circuit 3N, and finally is sent from the terminal TX of the integrated circuit 3N to the terminal RX of the battery controller 20. In this manner the communication command 292 is communicated in series through the transmission and reception terminals of the integrated circuits by using the transmission path 52 that is connected in the shape of a loop.

While the circuitry of the integrated circuit 3A has been explained as a representative of all the integrated circuits, the structure and operation of the other integrated circuits is the same, as mentioned above. When a communication command 292 is transmitted to the terminal RX of the integrated circuit 3A, this communication command 292 that has been received by this integrated circuit is transmitted from its terminal TX to the next integrated circuit. In the operation described above, each integrated circuit that receives the communication command 292 decides, with its command processing circuit 344 of FIG. 7, whether or not it is itself the subject of this communication command 292, and, if it is itself the subject, then it performs processing on the basis of the communication command. The processing described above is sequentially performed by each of the integrated circuits on the basis of transmission and reception of the communication command 292.

Accordingly, even if the communication command 292 stored in the reception register has no relationship with the integrated circuit 3A, still it is necessary for the integrated circuit 3A to perform transmission to the next integrated circuit on the basis of the communication command 292 that has been received. The contents of the identifier portion 328 of the communication command that has been received is read by the command processing circuit 344, and thereby the integrated circuit 3A decides whether not it is itself the command subject of this communication command 292. If the integrated circuit 3A is not itself the command subject of the communication command 292, then it transfers the contents of the identifier portion 328 and the data 330 just as it is to an identifier portion 308 and a data portion 310 of a transmission register 302. Moreover, it completes the signal for transmission in the transmission register 302 by inputting the checksum 312 for checking upon erroneous transmission and reception operation, and transmits it from the terminal TX. The transmission register 302 is a shift register that has the same structure as the reception register 322.

But if the subject of the communication command 292 that has been receives is this integrated circuit itself, then it executes one or more commands on the basis of the communication command 292. This command execution will be explained hereinafter.

Sometimes it is the case that the subject of a communication command 292 that is received relates to all of the integrated circuits, including this integrated circuit itself. For example, the RES command, the wake-up command, and the sleep command are commands of this type. When a RES command is received, the details of this command are decoded by the command processing circuit 344 and a RES signal is outputted. When this RES signal is generated, the data held by each of the present value storage circuit 274, the initial value storage circuit 275, and the flag storage circuit 284 is at its initial value of "zero". While the contents of the reference value storage circuit 278 of FIG. 5 is not "zero", it would also be acceptable to arrange for it to become "zero". However, if the contents of the reference value storage circuit 278 is changed to "zero", then it is necessary rapidly to set the value of the reference value storage circuit 278 that is to become the reference value for diagnosis, since the measurement and diagnosis shown in FIG. 4 are individually executed by each of the integrated circuits after generation of the RES signal. In order to avoid this complication and difficulty, a structure is adopted in which the contents of the reference value storage circuit 278 is not changed by the RES signal. Since the values of the reference value storage circuit 278 are not data of a type that is frequently changed, accordingly it is acceptable to employ the previous values. If it is necessary for this data to be changed, then each item thereof can be individually changed by another communication command 292. The value stored in the averaging control circuit 263 by the RES signal is a predetermined value, for example 16. In other words, the circuit 263 is set to calculate the average of 16 measured values, if this value is not changed by a communication command 292.

When a wake-up command is outputted from the command processing circuit 344, the start circuit 254 of FIG. 4 starts its operation, and the operations of measurement and diagnostics are started. Due to this, the electrical power consumed by the integrated circuit itself increases. On the other hand, when a sleep command is outputted from the command processing circuit 344, the start circuit 254 of FIG. 4 stops its operation, and the operations of measurement and diagnostics are stopped. Due to this, the electrical power consumed by the integrated circuit itself decreases remarkably.

Next, the writing and changing of data by a communication command 292 will be explained with reference to FIG. 5. The identifier 328 of the communication command 292 (see FIG. 9) specifies the integrated circuit that is to be selected. If the data 300 is a command to write data to the address register 348 or to the reference value storage circuit 278, or is a command to write data to the averaging control circuit 263 or to the selection circuit 286, then the command processing circuit 344 specifies the subject for writing on the basis of the contents of the command, and writes the data 330 into the register of the subject to be written.

The address register 348 is a register in which the address of this integrated circuit itself is stored, and its own address is determined by the contents thereof. The contents of this address register 348 is set to zero by the RES signal, and so the address of this integrated circuit itself becomes the "zero" address. When the contents of this address register is newly changed by some command, the address of this integrated circuit itself changes to this changed contents.

Apart from the stored contents of the address register 348 being changed by a communication command 292, as described above, the stored contents of the reference value storage circuit 278, or the contents of the flag storage circuit 284, of the averaging control circuit 263, or of the selection circuit 286, which are shown in FIG. 5, can also be changed. When a subject of change related to these is designated, then the contents of the data 330 that is the value for change is sent to the circuitry of the subject for change via the data bus 294, and its stored contents are changed. The circuit of FIG. 5 then executes its operation on the basis of these changed contents.

A command for transmission of data stored internally to the integrated circuit is also included in the communication commands 292. Designation of the subject for transmission is performed by the command in the identifier 328. For example, if a register internal to the present value storage circuit 274 or the reference value storage circuit 278 is designated, then the contents stored in this designated register is stored in the circuit for data 310 of the transmission register 302 via the data bus 294, and is transmitted as the requested data contents. By doing this, it becomes possible for the battery controller 20 of FIG. 1 to input a measurement value from the required integrated circuit, or a flag that shows its state.

The Address Setting Method for the Integrated Circuits

The address registers 348 of the integrated circuits 3A, ... 3M, ... 3N described above are built with volatile memory whose reliability is high, and these integrated circuits are made so that it is possible to perform new address setting of these volatile memories if their contents should be deleted, or if it is considered that it is not possible to maintain the reliability of their stored contents. For example, when the cell controller 80 starts to operate, commands for initialization of the address registers 348 are transmitted from, for example, the battery controller 20. Upon these commands, the address registers 348 of the integrated circuits are initialized, and then are set to the address "zero", for example, and thereafter an address is newly set for each of the integrated circuits. This setting of a new address for each of the integrated circuits 3A, ... 3M, ... 3N is performed by address setting commands being transmitted from the battery controller 20 to each of the integrated circuits 3A, ... 3M, ... 3N.

Since a circuit structure is employed in which it is possible to set an address for each of the integrated circuits 3A, ... 3M, ... 3N by a command, the beneficial effect is obtained that it is possible to manage without any terminals for setting an address for each of the integrated circuits, and without any external wiring connected to such terminals. Moreover, since the address setting is performed by processing communication commands, the freedom of control is increased.

Figure 8:
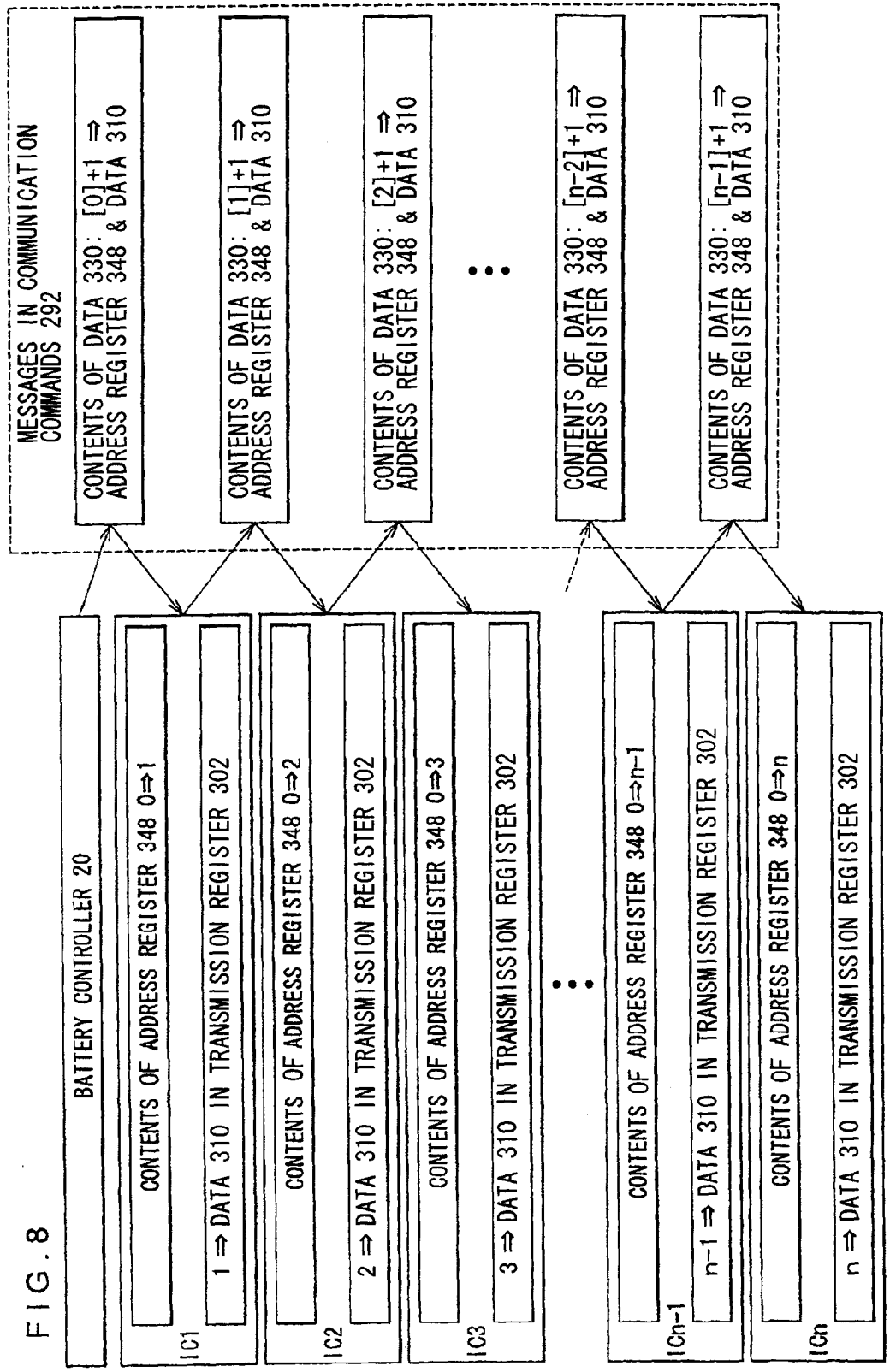
FIG. 8 is an explanatory figure for clarification of an example of a procedure for setting address registers in the integrated circuits by communication commands from the battery controller.
Figure 9:
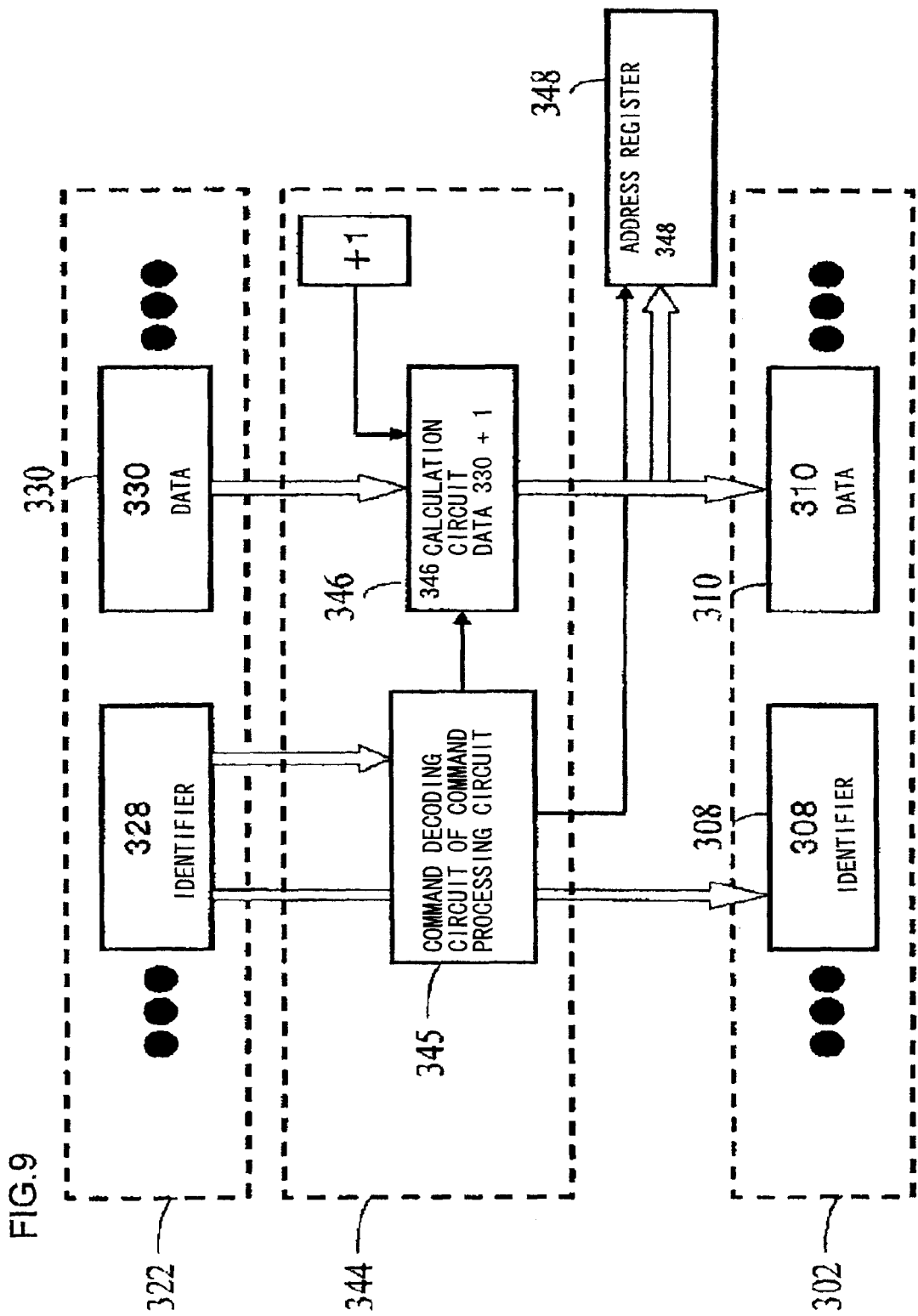
FIG. 9 is an explanatory figure for clarification of the operation of the circuit of FIG. 7 on the basis of transmitted communication commands.

FIG. 8 is an explanatory figure for clarification of one example of the procedure for setting the address registers of each of the integrated circuits 3A, ... 3M, ... 3N by communication commands 292 from the battery controller 20. And FIG. 9 is an explanatory figure for clarification of the operation of the circuit of FIG. 7 on the basis of transmission of the communication commands 292 of FIG. 8. Transmission and reception of communication commands 292 in order by each of the integrated circuits 3A, ... 3M, ... 3N is shown for the integrated circuits IC1, IC2, ... IC(n-1), IC(n). Setting is performed by the following method so that the integrated circuits IC1, IC2, IC3, . . . IC(n-1), IC(n) acquire the addresses 1, 2, 3, ... n-1, n respectively. While, in order to simplify the following explanation and aid understanding, the symbols denoting the ICs and the address numbers that they acquire are shown as being the same, there is no need for them to agree with one another in this way.

FIG. 8 shows the flow of messages by communication commands between the battery controller 20 and the integrated circuit ICs, and shows the contents of the data stored in the internal address register 348 of each of the integrated circuit ICs and the contents of the data 310 stored in the data and transmission register 302. Initially, for example, a communication command 292 is transmitted to set the address registers 348 of all of the integrated circuits of the cell controller 80 to their initial states, so that the address registers 348 of the integrated circuits are set to "zero" that is their initial value. This step is omitted from FIG. 8. By this operation the initial value, for example "zero", is stored in the address registers 348 of the integrated circuits IC1, IC2, IC3, ... IC(n-1). In FIG. 9, when this communication command 292 to set the address registers of all of the integrated circuits to their initial states is received by the integrated circuit IC1, this communication command 292 is stored in the reception register 322 of the integrated circuit IC1. And the command decoding circuit 345 of the command processing circuit 344 reads the contents of the identifier 328, and initializes the address register 348 on the basis of the message to set the address register 348 to its initial state. The contents of the identifier 328 is set just as it is into the identifier 308 of the transmission register 302, and is sent to the next integrated circuit IC2. Upon receipt of the communication command 292 to set its address register 348 to its initial state, each of the integrated circuit ICs in order performs this type of operation, and thus the address registers 348 of all of the integrated circuit ICs are initialized. Finally, this command returns from the integrated circuit IC(n) to the battery controller 20, and thus the battery controller 20 is able to confirm that the address registers 348 of all of the integrated circuit ICs have been initialized.

On the basis of the confirmation described above, the address setting for each of the integrated circuit ICs is performed as follows. In concrete terms, first, the battery controller 20 transmits a communication command that carries the message "take the subject address for command execution as "zero", and the value of the data 330 as "zero", add "1" to the value of the data 330, and set this into the address register 348 and into the data for transmission 310". This communication command 292 is inputted to the reception register 322 of the integrated circuit IC1 that is at the beginning position in the transmission path 52, and the portion of this communication command 292 that is the identifier 328 is read into the command decoding circuit 345. Since the address register 348 of the integrated circuit IC1 is at "zero" at the time point of reception, accordingly the operations are executed of (1) setting the value resulting from adding "1" to the contents "zero" of the data 330 into the address register 348, and (2) setting the above described addition result into the data field 310 of the transmission register 302.

Based on decoding by the command decoding circuit 345 shown in FIG. 9, the calculation circuit 346 performs the operations of reading in the value "zero" of the data 330 and adding "1" to this value. The result "1" of this calculation is set into the address register 348, and is also set into the data 310. This operation will now be explained with reference to FIG. 8. When the integrated circuit IC1 receives the communication command 92 from the battery controller 20, the address register 348 of the integrated circuit IC1 becomes "1", and in a similar manner the data 310 becomes "1". The data 310 of the communication command 292 is changed to "1" by the integrated circuit IC1, and then this command 292 is sent to the integrated circuit IC2. The identifier 308 of the communication command 292 transmitted from the integrated circuit IC1 is the same as when transmitted by the battery controller 20, while the contents of its data is changed.

Since "zero" is being held in the address register 348 of the integrated circuit IC2, accordingly as shown in FIG. 9, in this integrated circuit IC2 as well, in a similar manner, the calculation circuit 346 adds "1" to the value "1" of the data 330, and sets this into the address register 348 and into the data 310. Thus the address register 348 of the integrated circuit IC2 is changed from "0" to "2". As shown in FIG. 8, along with the address register 348 of the integrated circuit IC2 being changed from "0" to "2", the data 310 of its transmission register 302 is also changed to "2", and is transmitted to the next integrated circuit IC3. In this manner the address register 348 of the integrated circuit IC3 is changed from "0" to "3", and the data 310 of its transmission register 302 is also changed to "3".

Subsequently, this type of operation is sequentially repeated, so that the address register 348 of the integrated circuit IC(n−1) is changed from "0" to "n−1", and also the data 310 in its transmission register 302 is changed to "n−1", and this is transmitted to the next integrated circuit IC(n). The address register 348 of the integrated circuit IC(n) is changed from "0" to "n", and also the data 310 in its transmission register 302 is changed to "n". Then the communication command 292 returns from the integrated circuit IC(n) to the battery controller 20. By the fact that the data 330 of this communication command 292 that has returned is changed to "n", the battery controller 20 is able to confirm that the entire address setting operation has been performed correctly.

In this manner, 1, 2, 3, 4, . . . n−1, and n are sequentially set into the address registers 348 of each of the integrated circuits IC1, IC2, IC3, IC4, . . . IC(n−1), and IC(n) respectively.

In this embodiment it is possible to perform the address setting operation described above in a reliable manner, since each of the integrated circuits is endowed with the function of resetting its address register 348 to the initial value (zero).

Another Embodiment of the Address Setting

Using FIG. 10, another embodiment will now be explained of transmitting a communication command 292 from the battery controller 20 to the integrated circuits IC1, IC 2, IC 3, IC 4, . . . , IC(n−1), ICn shown in FIG. 9, so as to set their addresses sequentially.

First it will be supposed that, in a similar manner to the operation described with reference to FIGS. 8 and 9, a communication command 292 whose content is the message "set the address registers 348 of all of the integrated circuits of the cell controller 80 to their initial values, for example to "zero" is transmitted from the battery controller 20, so that the address registers 348 of all of the integrated circuits are set to "zero". Next, in a step #1 of FIG. 10, a communication command 292 is transmitted from the battery controller 20 having as contents the message "taking the integrated circuit whose address is "zero" (the initial value) as a subject, change the contents of its address register 348 to "1", and set the address of the subject integrated circuit in the transmitted communication command 292 to "1"". Here the feature "set the address of the subject integrated circuit in the transmitted communication command 292 to "1"" will not present any problem even if the address is some value other than "1". In other words, it can be executed even for some value other than "zero (the initial value)".

As shown in FIG. 1, the integrated circuit that initially receives the initial communication command 292 is the integrated circuit IC1 (i.e. 3A) that is positioned at the head of the transmission path 52. As shown in FIG. 7, the communication circuit 127 of this integrated circuit 1 holds this communication command 292 in its reception register 322. The address register 348 of this integrated circuit IC1 is already in the "zero (initial value)" state, so that the command processing circuit 344 decides, on the basis of the identifier 328, that this IC is the subject of execution described in the communication command 292. And, according to the message in the communication command 292, the contents of the address register 348 are changed to "1". Moreover, the contents of the identifier 308 of the transmission register 302 are changed, so that the address of the subject for execution of the communication command 292 is changed to "1". This communication command 292 that has been changed is then transmitted.

Since the contents of the address register 348 of the integrated circuit IC2 that next receives the communication command 292 is "zero (the initial value)", accordingly the command processing circuit 344 of this integrated circuit IC2 decides that this IC is not itself the subject of execution. And thus it sets the received communication command 292 into the transmission register 302 just as it is without alteration, and transmits this communication command to the next IC just as it is. And, in a similar manner, all of the further integrated circuits, i.e. the integrated circuit IC3 and subsequently, all decide that they are not the subjects of execution because the contents of their registers 348 are "zero (the initial value)", and accordingly do not execute the communication command 292, and this is returned to the battery controller 20.

Figure 10:
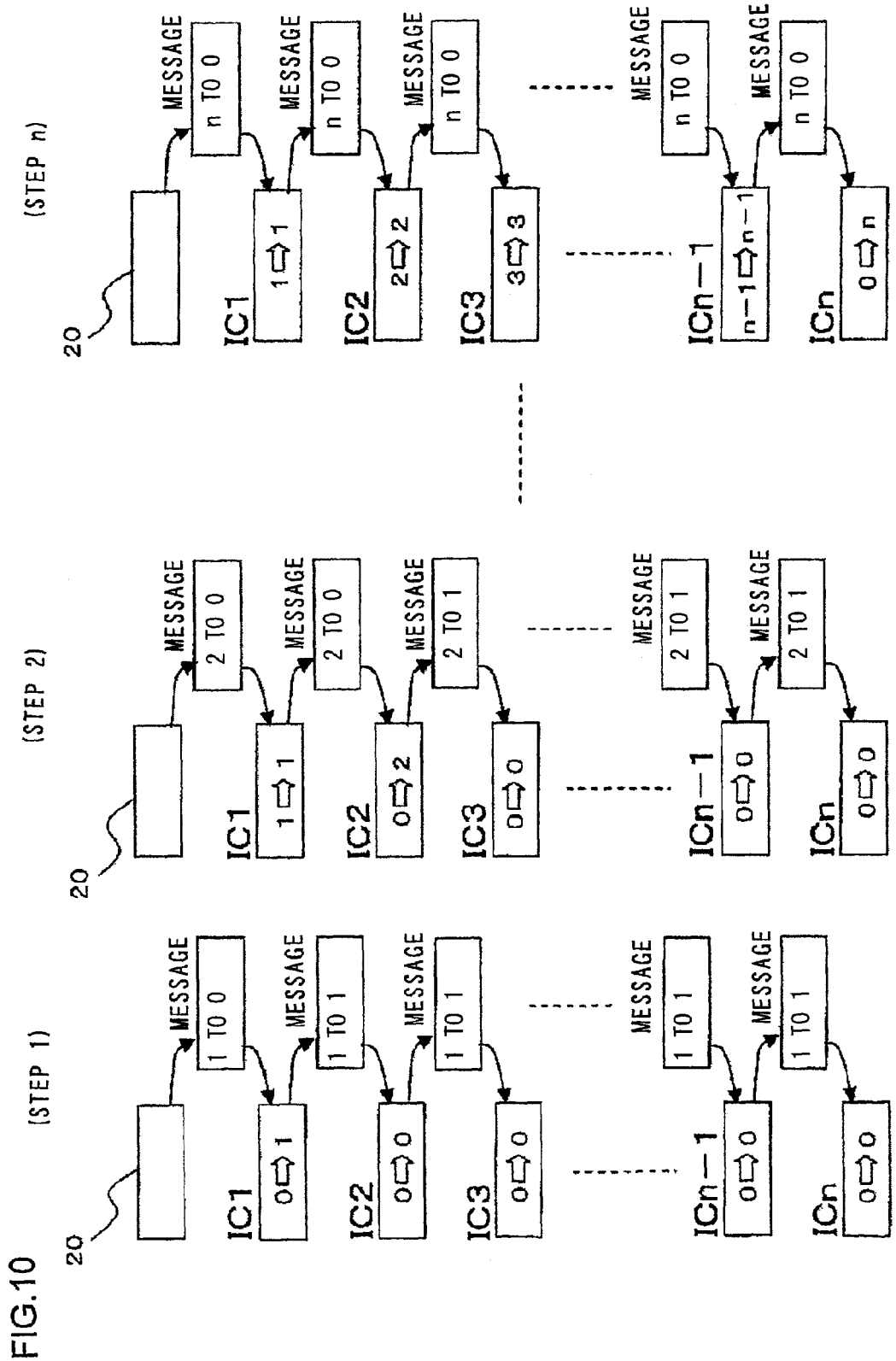
FIG. 10 is an explanatory figure of an embodiment of setting addresses sequentially on the basis of communication commands from a battery controller, for the integrated circuits shown in FIG. 9.

Upon confirmation of the return of this communication command 292, next, as shown in step #2 of FIG. 10, a communication command 292 is transmitted from the battery controller 20 having as contents the message "taking the integrated circuit whose address is "zero" (the initial value) as a subject, change the contents of its address register 348 to "2", and set the address of the subject integrated circuit in the transmitted communication command 292 to "2"". Here the feature "set the address of the subject integrated circuit in the transmitted communication command 292 to "2"" will not present any problem even if the address is some value other than "2". In other words there will be no problem, provided that the address setting is performed so that there is no duplication. Since the contents of the address register 348 of the integrated circuit IC1 that initially receives the communication command 292 is "1", accordingly the command processing circuit 344 of this integrated circuit IC1 decides that this IC is not itself the subject of execution, and this communication command 292 is transmitted to the next integrated circuit IC2 just as it is without alteration.

The address register 348 of the integrated circuit IC2 that next receives this communication command 292 is "zero", so that its command processing circuit 344 executes the communication command 292. And the contents of the address register 348 are set to "2"" and moreover the subject for execution of the communication command 292 is changed to "2" as it is transmitted onward. Since the contents of the address registers 348 of the integrated circuit IC3 and of all of the subsequent integrated circuits are "zero" so that they are not subjects for execution of the communication command 292, accordingly this command 292 is not executed further, but is returned to the battery controller 20 just as it is without further alteration.

Subsequently, in a similar manner, each time the battery controller 20 transmits a communication command 292, the contents of the address register 348 of the integrated circuit IC3 is changed from "zero" to "3", and next the contents of the address register 348 of the integrated circuit IC4 is changed from "zero" to "4". And the contents of the address register 348 of the integrated circuit ICn is changed from "zero" to "n".

Adjusting the States of Charge SOC

Figure 11:
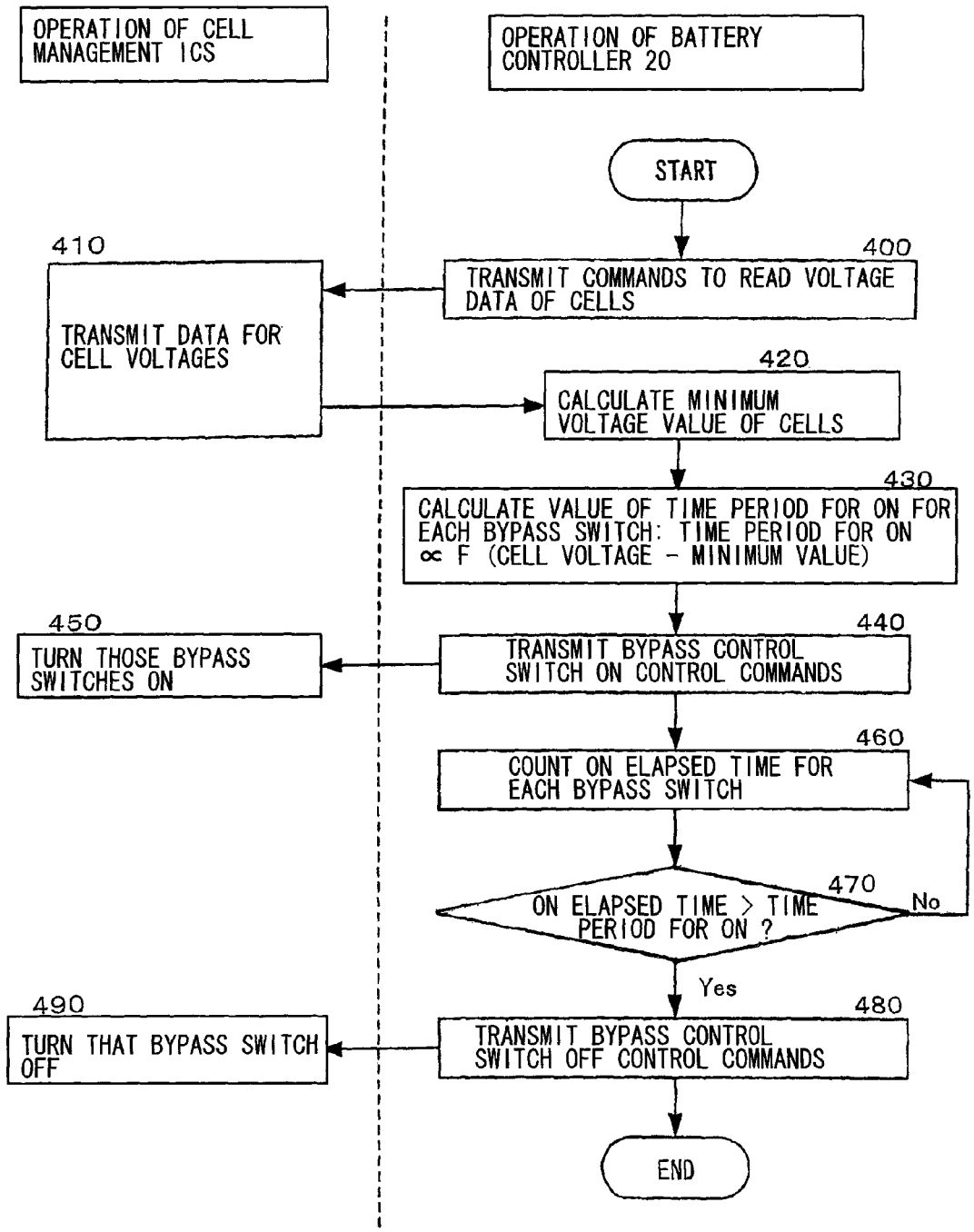
FIG. 11 is a figure showing an example of a processing flow that performs measurement of the states of charge of battery cells, and that performs discharge of any battery cells whose charge amounts are larger.

FIG. 11 shows the processing flow for measuring the states of charge SOC of the battery cells of the battery unit 9, for selecting any battery cell or cells whose charge amount is larger, for calculating a time period for discharge for each of these battery cells that has been selected, and for performing discharge thereof. The left side of this figure shows the operation of the integrated circuits, while the right side shows the operation by the main controller 20.

In FIG. 11, in a first step 400, a communication command 292 is transmitted from the battery controller 20 requesting the integrated circuit 3A that is the subject of the command to read in the voltages of its battery cells in the initial state. When the integrated circuit 3A receives this communication command 292, its command processing circuit 344 shown in FIG. 7 sets the stored contents of its initial value storage circuit 275 into the data 310 of the transmission register 302, and transmits the command 292 to the next integrated circuit (a step 410).

The battery controller 20 then designates the integrated circuits subsequent to the integrated circuit 3A in order, and performs reading in of the voltages of the battery cells in their initial states for all of the integrated circuits up to the integrated circuit 3N. As a result, the voltage values in the initial state of all of the battery cells of the battery unit 9 are read in from the initial value storage circuits 275 of the respective integrated circuits.

In a step 420, the battery controller 20 inputs the measured voltage of each of the battery cells of the entire battery unit 9, and, for example, calculates the state of charge SOC of each of the battery cells from the above described information that has been inputted. And it obtains the average value of those calculated values, and calculates time periods for continuity of the balancing switches 129A through 129D for those cells whose voltages are greater than that average value in a step 430. The way that these time periods for continuity of the balancing switches 129A through 129D are calculated is not to be considered as being limited to the method described above; there are various possible methods. Whatever method may be employed, time periods for continuity are determined for the balancing switches 129A through 129D that are related to those battery cells whose states of charge SOC are larger.

Then in a step 440, the battery controller 20 transmits the time periods for continuity for the balancing switches that have thus been obtained to the corresponding integrated circuits as communication commands 292.

In a step 450, each of the integrated circuits that has received such a time period for continuity makes the corresponding balancing switch continuous on the basis of that command.

In a step 460 the elapsed time of continuity of each of the balancing switches is measured. And then in a step 470 the time period for continuity of each of the balancing switches and its elapsed time of continuity are compared together, and it is decided whether the measured value of its elapsed time of continuity has reached its time period for continuity. For each of the balancing switches whose measured value of elapsed time of continuity has reached its time period for continuity, the flow of control proceeds to the next step 480, and this step 480 is executed.

In this step 480, the battery controller 20 transmits a communication command 292 that commands opening of a balancing switch, whose elapsed time of continuity has reached its calculated time period for continuity, to the corresponding integrated circuit.

And in a step 490, upon receipt of this communication command 292, the corresponding integrated circuit stops the drive signal from the switch drive circuit 133 of that balancing switch specified in the communication command 292, and thus puts that balancing switch into the opened state. Due to this, discharging of the corresponding battery cell is stopped.

Testing Whether or not there is any Abnormality with the Integrated Circuits Etc.

Figure 12:
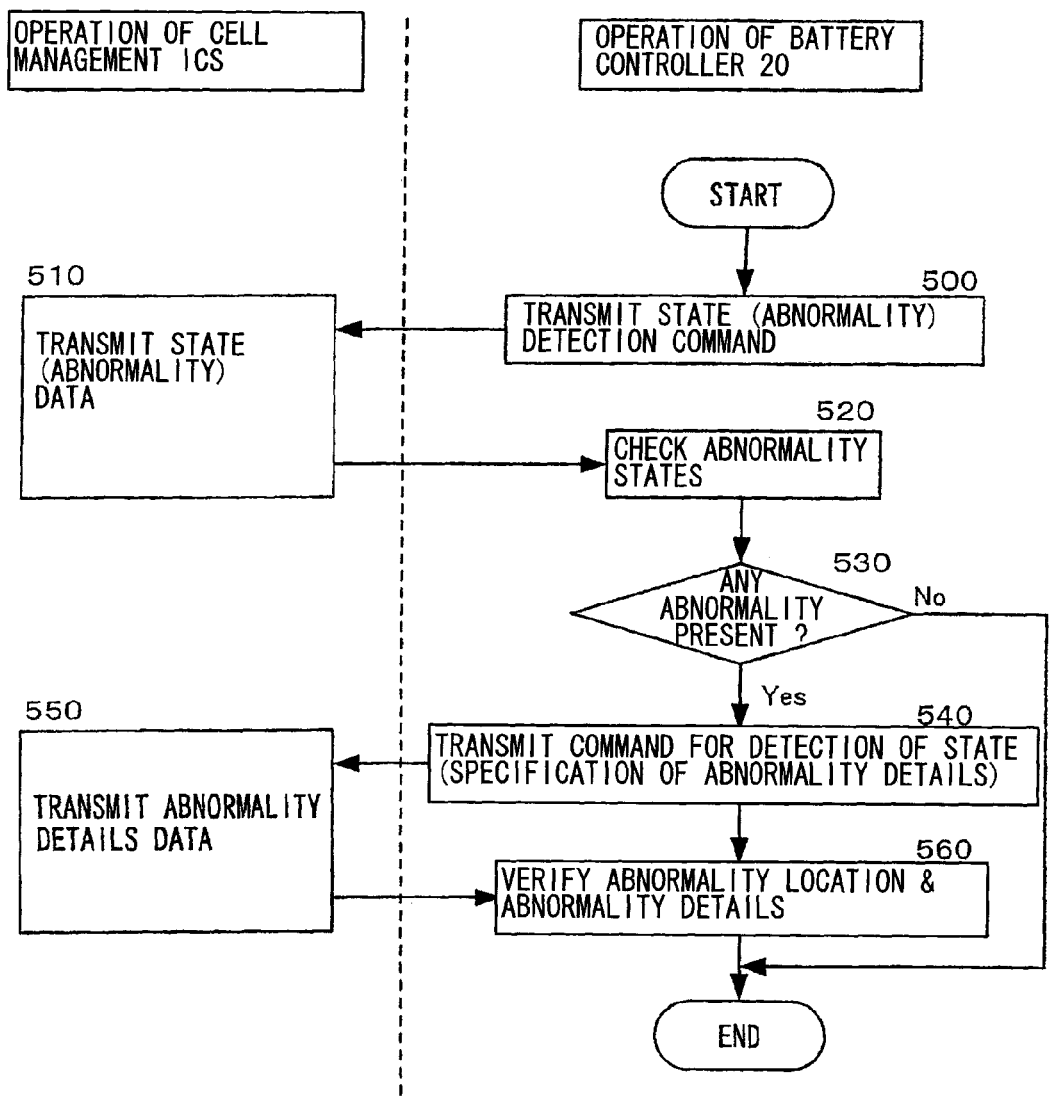
FIG. 12 is a figure showing an example of a processing flow for testing whether or not any abnormality has occurred with the integrated circuits or the battery cells.

FIG. 12 shows a processing flow for testing whether or not there is any abnormality with any of the integrated circuits 3A, . . . 3M, . . . 3N or with any of the battery cells. The left side in the figure shows the operation of the integrated circuits 3A, . . . 3M, . . . 3N, and the right side shows the operation of the main controller 20.

In a step 500, a communication command is transmitted from the battery controller 20 for detecting the (abnormality) state of the integrated circuit 3A. Next in a step 510 this communication command for (abnormality) state detection is transmitted from the integrated circuit 3A along to the integrated circuit 3N in order, and returns to the battery controller 20.

In a step 520, the battery controller 20 receives the respective (abnormality) state sent from each of the integrated circuits, and performs verification of the (abnormality) states that have arrived. And next in a step 530 the battery controller 20 makes a decision as to whether or not there is any abnormality with any one of the integrated circuits 3A, . . . 3M, . . . 3N, or whether there is any abnormality with any one of the battery cells BC1 through BC4. And if it has been determined that there is no abnormality in any of the integrated circuits nor in any of the corresponding battery cells, then the flow of this processing terminates. On the other hand, if it has been determined that there is some abnormality with any one of the integrated circuits 3A, . . . 3M, . . . 3N, then the flow of control proceeds to the step 540.

In this step 540, the battery controller 20 designates the address of the integrated circuit in which the abnormality is present, and transmits a communication command for state (abnormality details) detection, i.e. for specification of the abnormality details.

Then in a step 550 the integrated circuit that has been designated in the address and has received the above command transmits the measurement value or the result of diagnosis (i.e. the details of the abnormality), which caused the abnormal state. And then in a step 560 the battery controller 20 performs verification of the integrated circuit in which the abnormality has occurred and of the cause of the abnormality. The processing of FIG. 12 ends with the verification of the cause of the abnormality. Subsequently, according to the cause of the abnormality, it is decided whether or not to perform supply of DC electrical power from the lithium cells or whether to perform charging with electrical power that has been generated. If an abnormality is present, then a relay between the DC power supply system and the electrical load such as an inverter device or the like is put into its opened state, so that the supply of electrical power is stopped.

A Power Supply System for a Vehicle

FIG. 13 is a circuit diagram showing a case in which the DC power system described above on the basis of FIG. 1 is applied as the drive system for a rotating electrical machine of a vehicle. A battery module 900 includes a battery unit 9, a cell controller 80, and a battery controller 20. It should be understood that, in FIG. 13, the battery cells that make up the battery unit 9 are divided into two blocks, a high potential side block 10 and a low potential side block 11. This high potential side block 10 and low potential side block 11 are connected in series via a SD (Service Disconnect) switch 6 for maintenance and inspection, in which a switch and a fuse are connected in series.

The positive electrode of the high potential side block 10 is connected to the positive electrode of an inverter device 220 via a positive electrode side high power cable 81 and a relay RLP. And the negative electrode of the low potential side block 11 is connected to the negative electrode of the inverter device 220 via a negative electrode side high power cable 82 and a relay RLN. The high potential side block 10 and the low potential side block 11 are connected in series via the SD switch 6, and constitute a high power battery (the battery of this power supply system in which the two battery units 9 are connected in series) having, for example, a nominal voltage of 340 V and a capacity of 5.5 Ah. It should be understood that a fuse having a current rating of, for example, 125 A may be used as the fuse of the SD switch 6. It is possible to maintain a high level of security with this type of structure.

As previously described, the relay RLN is provided between the negative electrodes of the low potential side block 11 and of the inverter device 220, while the relay RLP is provided between the positive electrodes of the high potential side block 10 and of the inverter device 220. A resistor RPRE and a pre-charge relay RLPRE are connected in a parallel circuit with the relay RLP. A current sensor Si such as a Hall element or the like is inserted between the positive electrode side main relay RLP and the inverter device 220. This current sensor Si is housed within a junction box. It should be understood that the output line of the current sensor Si leads to the battery controller 20, and that this constitutes a structure with which the inverter device 220 can always monitor the flow rate of electricity supplied from this lithium battery DC power supply.

Relays of approximately 80 A rated capacity, for example, may be used for the relay RLP and the relay RLN, A relay of approximately 10 A rated capacity, for example, may be used for the pre-charge relay RLPRE. Moreover, a resistor of, for example, rated capacity of 60 W and resistance value of 50Ω may be used for the resistor RPRE, while an element of, for example, rated current of ±200 A may be used for the current sensor Si.

The negative electrode high power cable 82 and the positive electrode high power cable 81 described above are connected to the inverter device 220 that drives the motor 230 for this hybrid vehicle via the relay RLP and the relay RLN and output terminals 810 and 820. It is possible to maintain a high level of security with this type of structure.

The inverter device 220 includes a power module 226, an MCU 222, a driver circuit 224 for driving the power module 226, and a smoothing capacitor 228 of a high capacity of around 700 μF to around 2000 μF. The power module 226 is built as an inverter that converts the DC electrical power at 340 V supplied from the power supply, i.e. the high power battery, to three phase AC electrical power for driving a motor 230. For the smoothing capacitor 228 a film capacitor may be used, since it has more desirable characteristics than an electrolytic capacitor. A smoothing capacitor 228 that is mounted to a vehicle is subjected to influences from the environment in which the vehicle is located, and is used in a broad temperature range, from a low temperature of minus several tens of Celsius degrees to around 100 Celsius. When the temperature drops below zero degrees, the characteristics of an electrolytic capacitor and its capability for eliminating voltage noise decrease abruptly. Due to this, there would be a fear that severe noise would be applied to the integrated circuits shown in FIGS. 1 and 2. However the decrease in the characteristics of a film capacitor along with decrease of temperature is modest, so that it is still possible to reduce the voltage noise applied to the integrated circuits.

According to commands of a higher ranking controller 110, when the motor 230 is to be driven, after having changed over the relay RLN on the negative electrode side from its opened state to its closed state, the MCU 222 changes the pre-charge relay RLPRE over from its opened state to its closed state, and thus charges up the smoothing capacitor 228. After this charging, the MCU 222 changes the relay RLP on the positive electrode side from its opened state to its closed state, and thereby starts the supply of electrical power from the high tension battery of this power supply system 1 to the inverter device 220. It should be understood that the inverter device 220 controls the phase of the AC electrical power that is generated with respect to the rotor of the motor 230 by the power module 226, and operates the motor 230 as a generator during braking of this hybrid vehicle, in other words performs regenerative braking control, so as to regenerate the electrical power that is generated by this operation as a generator to the high power battery, thus charging up this high tension battery. The inverter device 220 operates the motor 230 as a generator if the state of charge of the battery unit 9 has decreased below a standard reference state. The three phase AC generated by the motor 230 is converted by the power module 226 into DC electrical power that is then supplied to the battery unit 9, that is a high power battery, and accordingly the battery unit 9 is charged.

As described above, the inverter device 220 includes the power module 226, and thereby the inverter device 220 performs conversion of electrical power between DC power and AC power. When, according to commands from the higher ranking controller 110, the motor is to operate as a motor, then the driver circuit 224 is controlled so that it controls the switching operation of the power module 226 in order to create a rotating magnetic field in the direction that leads with respect to the rotation of the rotor of the motor 230. In this case, DC electrical power is supplied from the battery unit 9 to the power module 226. On the other hand, the driver circuit 224 may be controlled so that it controls the switching operation of the power module 226 in order to create a rotating magnetic field in the direction that lags with respect to the rotation of the rotor of the motor 230. In this case electrical power is supplied from the motor 230 to the power module 226, and DC electrical power from the power module 226 is supplied to the battery unit 9. As a result, the motor 230 is caused to operate as a generator.

The power module 226 of the inverter device 220 performs operation to go continuous and discontinuous at high speed, thus performing conversion of electrical power between DC electrical power and AC electrical power. Since high currents are intercepted at high speed, accordingly large voltage fluctuations are engendered at this time due to the inductance possessed by the DC circuit. The high capacity smoothing capacitor 228 is provided in the DC circuit in order to suppress these voltage fluctuations. With such an inverter device 220 for onboard use, the generation of heat in the power module 226 is a serious problem, and, in order to keep this heat generation low, it is necessary to increase the operating speed of the power module 226 for going continuous and discontinuous. When this operating speed is increased, the leaps of voltage due to the above described inductance become greater, and a higher amount of noise is generated. Due to this, there is a tendency for the capacity of the smoothing capacitor 228 to be made larger.

In the state in which the inverter device 220 starts its operation, the charge in the smoothing capacitor 228 is approximately zero, and a large initial current might flow into the capacitor upon closing of the relay RLP. If the current initially flowing from the high power battery into the smoothing capacitor 228 were to be large, then there would be a danger of the negative electrode side main relay RLN and the positive electrode side main relay RLP fusing and being damaged. In order to solve this problem, after the relay RLN on the negative electrode side has changed from its opened state to its closed state, the MCU 222 keeps the relay RLP on the positive electrode side in its opened state without alteration while changing the pre-charge relay RLPRE from its opened state to its closed state, thus charging the smoothing capacitor 228 while limiting the maximum current with the resistor RPRE. After the smoothing capacitor 228 has charged up to a predetermined voltage, the initial state has been eliminated, and so the use of the pre-charge relay RLPRE and the resistor RPRE is terminated, and, as described above, both the relay RLN on the negative electrode side and the relay RLP on the positive electrode side are put into their closed states, and DC electrical power is supplied from the power supply system 1 to the power module 226. By performing this type of control, along with protecting the relay circuit, also it is possible to reduce the maximum current that flows in the lithium battery cells and the inverter device 220 to less than or equal to a predetermined value, so that it is possible to maintain high security.

The smoothing capacitor 228 is disposed close to the DC side terminals of the power module 226, since this aids with suppression of the noise voltage by reducing the inductance of the DC side circuit of the inverter device 220. Moreover, the smoothing capacitor 228 itself is built so as to be able to reduce the inductance. With this type of structure, there is a fear that momentarily a large current may flow when the initial charging current of the smoothing capacitor 228 is supplied, and that high temperature may be generated and cause damage. However, due to the pre-charge relay RLPRE and the resistor RPRE described above, it is possible to reduce the damage described above. While the control of the inverter device 220 is performed by the MCU 222, as described above, the control of the initial charging of the smoothing capacitor 228 is also performed by the MCU 222.

Respective capacitors CN and CP are inserted between the casing ground (that is at the same potential as the chassis of the vehicle), and the connection line between the negative electrode of the high power battery of the power supply system 1 and the relay RLN on the negative electrode side, and the connection line between the positive electrode of the high power battery and the relay RLP on the positive electrode side. These capacitors CN and CP operate to eliminate noise generated by the inverter device 220, and serve to prevent improper operation of the low voltage side circuitry and destruction of the ICs included in the cell controller 80 due to surge voltage. The inverter device 229 has noise elimination filters, but these capacitors CN and CP are inserted in order further to enhance the beneficial effect of preventing improper operation of the battery controller 20 and of the cell controller 80, and in order further to enhance the reliability of noise resistance of the power supply system 1. It should be understood that, in FIG. 13, the high tension circuit system of the power supply system 1 is shown by thick lines. A rectangular copper wire having a large cross section is used for these wires.

It should be understood that, in FIG. 13, a blower fan 17 is a fan for cooling the battery unit 9, and it is arranged for this fan to be operated via a relay 16. This relay 16 is turned ON and OFF by commands from the battery controller 20.

Operational Flow in the Power Supply System for the Vehicle

Figure 14:
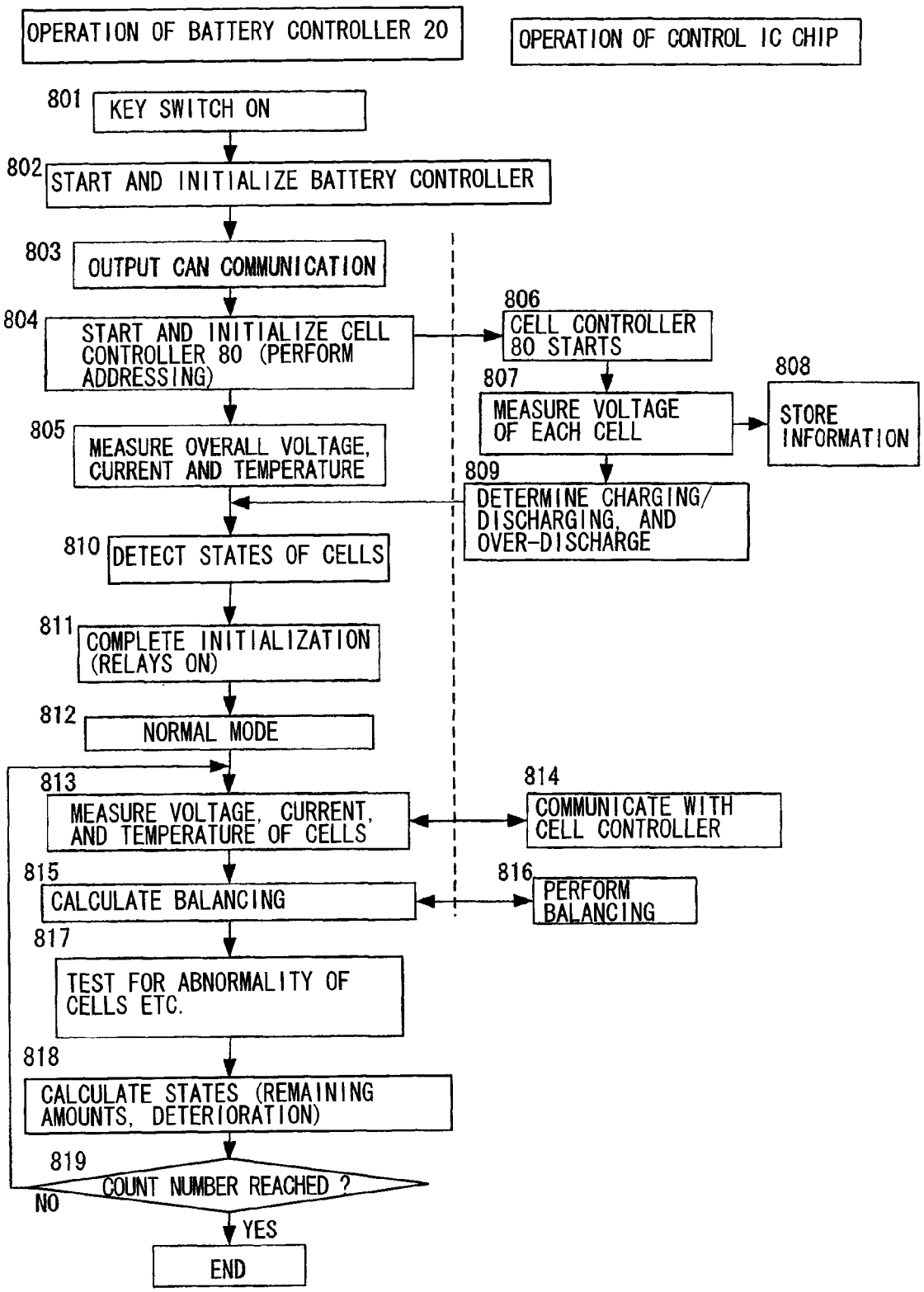
FIG. 14 is a figure showing an example of an operational flow of the battery system for a vehicle shown in FIG. 13.

FIG. 14 is a figure showing the operational flow in the power supply system for a vehicle shown in FIG. 13. In the following the steps of this flow will be explained in order.

In a step 801, the flow of control is transferred to a step 802 when the key switch of the vehicle is turned ON and operation for starting the engine is performed, or when, from the parking state of the vehicle, it goes into a state in which operation for traveling is performed, or when all of the integrated circuits transit from the sleep state to the wake-up state. In this step 802 the battery controller 20 is started, and initialization of the battery controller 20 is performed.

Then in a step 803 it is arranged to start CAN communication. Due to this, a so called empty message is outputted to each controller, and confirmation of the state of communication between the various control devices is performed. Then in a step 804 a communication command 292 for starting and initializing the cell controller 80 is transmitted from the battery controller 20.

Due to reception of the communication command 292, each of the integrated circuits 3A, . . . 3M, . . . 3N goes into the so called wake-up state. And, along with the start circuit 254 of FIG. 4 starting its operation on the basis of the output from the command processing circuit 344, as shown in FIG. 7, the address register 348 of each of the integrated circuits is initialized. Thereafter, as explained in connection with FIGS. 8 and 10, a new address is set in each of the integrated circuits IC.

Then in a step 805 the total voltage and current of all of the battery cells connected in series is detected by the voltage sensor Vd and the current sensor Si shown in FIG. 1, and their outputs are inputted to the battery controller 20. Furthermore, for example, measurement of temperature is performed by a temperature sensor not shown in the figures.

On the other hand, by the cell controller 80 receiving the communication command 292 in the step 804 for starting and initialization, and by each of the integrated circuits 3A, . . . 3M, . . . 3N receiving this communication command, the operation of the first stage counter 256 and of the second stage counter 258 shown in FIG. 4 starts (a step 806), and measurement as described in the operation table 260 is repeatedly executed (a step 807). In this step 807, as explained with reference to FIGS. 4 and 6, each of the integrated circuits measures the terminal voltages of the battery cells individually, and these measured values are stored in the present value storage circuit 274 and in the initial value storage circuit 275 (a step 808). From the results of measurement of the voltages of the battery cells in the step 807, in a step 809 each of the integrated circuits individually makes a decision as to charging and discharging, and over-discharge, of the battery cells. Since the diagnosis flag is set in the flag storage circuit 284 of FIG. 5 if there is some abnormality, accordingly the battery controller 20 is able to detect this diagnosis flag, and is able to detect the abnormality. And, since each of the integrated circuits performs measurement of the corresponding battery cell voltages and diagnosis of the battery cells individually, accordingly, even though the battery unit 9 is built up from a large number of battery cells, nevertheless it is possible to diagnose the states of all of the battery cells within a short period of time. As a result, it is possible to diagnose the states of all of the battery cells before the relay RLP and the relay RLN are turned on, so that it is possible to maintain high security.

In a step 810 it is checked that the states of all of the battery cells have been detected, and then in a step 811, along with completing the initialization, it is possible to detect that no abnormal state is present by checking that the diagnosis flag in the flag storage circuit 284 has not been set. When it has been confirmed that no abnormality is present, then the relay RLN shown in FIG. 13 is closed, and next the relay RLPRE is closed, and finally the relay RLP is closed. Due to this, the supply of DC electrical power from the battery module 9 to the inverter device 220 is started.

The elapsed time in the step 801 from the time point that the key switch is turned ON until it is possible to start supplying electrical power may be less than or equal to around 100 msec. By making it possible to supply DC electrical power in a short period of time in this manner, it becomes possible to respond effectively to demands from the driver.

Furthermore, during this short time interval, along with setting the addresses of the integrated circuits, measuring the voltages of all of the battery cells in the groups to which the integrated circuits correspond, and performing storage of all of those measurement results in the initial value storage circuit 275 described in connection with FIG. 5, it also becomes possible to complete abnormality diagnosis.

And measurement of the voltages of the battery cells is performed before the relays RLP, RLN, and RLPRE are turned ON, in other words before the inverter device 220 and the battery unit 9 are electrically connected together. Due to this, the measurement of the voltages of the battery cells is performed before supply of electrical power to the inverter device 220, and thus it becomes possible to obtain the states of charge SOC accurately from the terminal voltages of the battery cells measured before they supply any current.

Thereafter, in a step 812 the system goes into the normal mode, and in a step 813 measurement of the voltage, current, and temperature of the battery cells is performed. In this case, the measurement is performed via communication with the cell controller 80 in the step 812. It should be understood that the measurement of temperature is performed on the basis of the output from a temperature sensor not shown in the figures.

And, on the basis of the above described measurement values for the voltage and the current of each battery cell measured before supply of current, according to requirements, on the basis of the measured value of temperature, in a step 815 calculation of discharge time intervals (for balancing) is performed. And on the basis of the results of this calculation, time periods for continuity for controlling the balancing switches 129A, 129B, 129C, and 129D shown in FIG. 2 are transmitted to each of the integrated circuits.

Then in a step 816 each of the integrated circuits performs control to close its balancing switches on the basis of these time periods for continuity. This operation is performed according to the flow shown in FIG. 11 and described above.

Then in a step 817 testing is performed as to whether or not any of the integrated circuits 3A through 3N or any of the battery cells is abnormal. And next in a step 818, calculations for the states including the remaining amounts in the battery cells and deterioration thereof and so on are performed.

Then in a step 819 a decision is made as to whether, a count number has reached the time period for continuity calculated corresponding to each of the balancing switches 129A, 129B, 129C, and 129D. If no count number has been reached, then the flow of control returns to the step 813, and the balancing in the step 816, the testing in the step 817, and the calculation for the states of the battery cells in the step 818 are repeated.

And, when in the step 819 the count number has reached anyone of the time periods for continuity of the balancing switches 129A, 129B, 129C, and 129D, then, for the one of the balancing switches 129A, 129B, 129C, and 129D for which the count value has reached its time period for continuity, a command is transmitted from the battery controller 20 to the corresponding integrated circuit for putting it into the opened state in order to stop its discharge operation. Since control for closing the balancing switch and performing discharge is only performed for those battery cells in the battery unit 9 whose states of charge SOC are larger, accordingly the balancing switches are opened starting from the one for the battery cell whose state of charge SOC is smallest. As described above, the state of charge SOC of each of the battery cells of the battery unit 9 is calculated, and the time periods for continuity are calculated for each of the battery cells and are stored in the storage device of the battery controller 20. Since these time periods for continuity are determined so as to correspond to the states of charge SOC of the respective battery cells, accordingly normally they all have different time periods for continuity. Of course from the start there are some battery cells whose time periods for continuity are zero. Due to this, in the step 819 the time periods for continuity of the battery cells and the counted value are compared, and a command is transmitted to an integrated circuit that is controlling the discharge of a battery cell for which the time period for continuity has elapsed, in order to make it stop the discharge of the corresponding battery cell.

The Communication Completed Sequence

Figure 15:
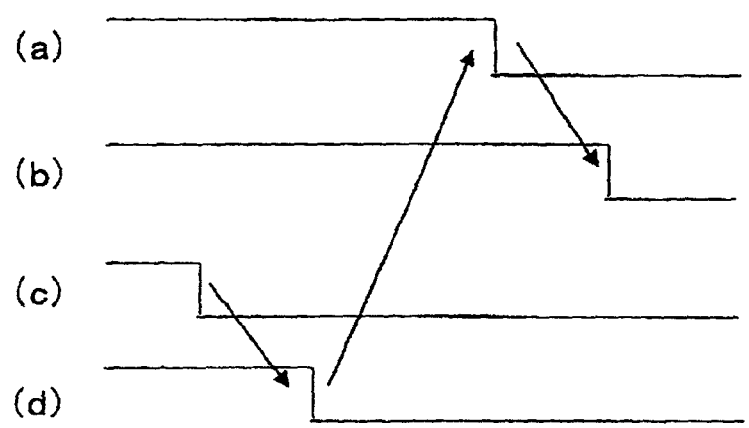
FIG. 15 is an explanatory figure showing an example of a sequence for termination of communication between the battery controller and the cell controller, in the battery system for a vehicle.

FIG. 15 is an explanatory figure showing a sequence that terminates communication between the battery controller 20 and the cell controller 80, in the power supply for a vehicle shown, for example, in FIGS. 1 and 13.

FIG. 15(a) is a figure showing the timing for stopping the supply of power to the power supply terminal (VC) of the battery controller 20. And FIG. 15(b) is a figure showing the timing for stopping the supply of power to the photocouplers PH1 and PH2 of the input side interface INT(E) that is an insulating circuit and to the photocouplers PH3 and PH4 of the output side interface INT(O) that is an insulating circuit. Moreover, FIG. 15(c) is a figure showing the timing for stopping transmission and reception from the battery controller 20 via the TX terminal and the RX terminal. Furthermore, FIG. 15(d) is a figure showing the timing of stopping of the signal from the battery controller 20 via the wake-up terminals.

As will be clear from this figure, first, the transmission and reception via the TX terminal and the RX terminal stops. Next, if the signals from the wake-up terminals from the battery controller 20 are being used for the system, the transmission of these signals stops. Next stopping of the supply of power to the power supply terminal (VC) of the battery controller 20 is performed, and stopping of the supply of power to the photocouplers PH1 and PH2 of the input side interface INT(E) and to the photocouplers PH3 and PH4 of the output side interface INT(O) is performed.

By performing the stopping of operation of the various sections described above in this type of sequence, it becomes possible to put all of the integrated circuits into the sleep state in a reliable manner.

Figure 16:
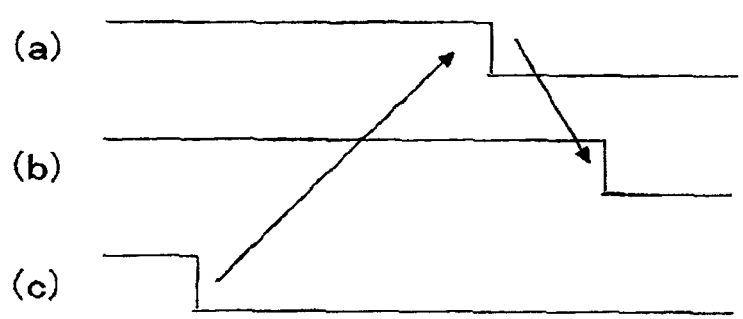
FIG. 16 is an explanatory figure showing another example of a sequence for termination of communication between the battery controller and the cell controller, in the battery system for a vehicle.

It should be understood that FIG. 16 is an explanation of a system in which the signals from the wake-up terminals, explained in FIG. 15 above, are not used. Since the signals from the wake-up terminals are not used, the signal stoppage in FIG. 15(d) is unnecessary. The rest of the sequence is the same as in the FIG. 15 case.

Structure of the Battery Cells of the Cell Groups Corresponding to the Integrated Circuits In the embodiment described above, the number of battery cells in each of the cell groups is the same, and four battery cells are connected to the integrated circuit 3A, ... 3M, ... 3N corresponding to each cell group. Each of the integrated circuits 3A, ... 3M, ... 3N obtains information such as voltage and so on from its corresponding four battery cells, Moreover, a structure is provided for performing control of the charging and discharging of these battery cells. Furthermore, each of the integrated circuits 3A, ... 3M, ... 3N is in charge of an equal number of battery cells.

Figure 17:
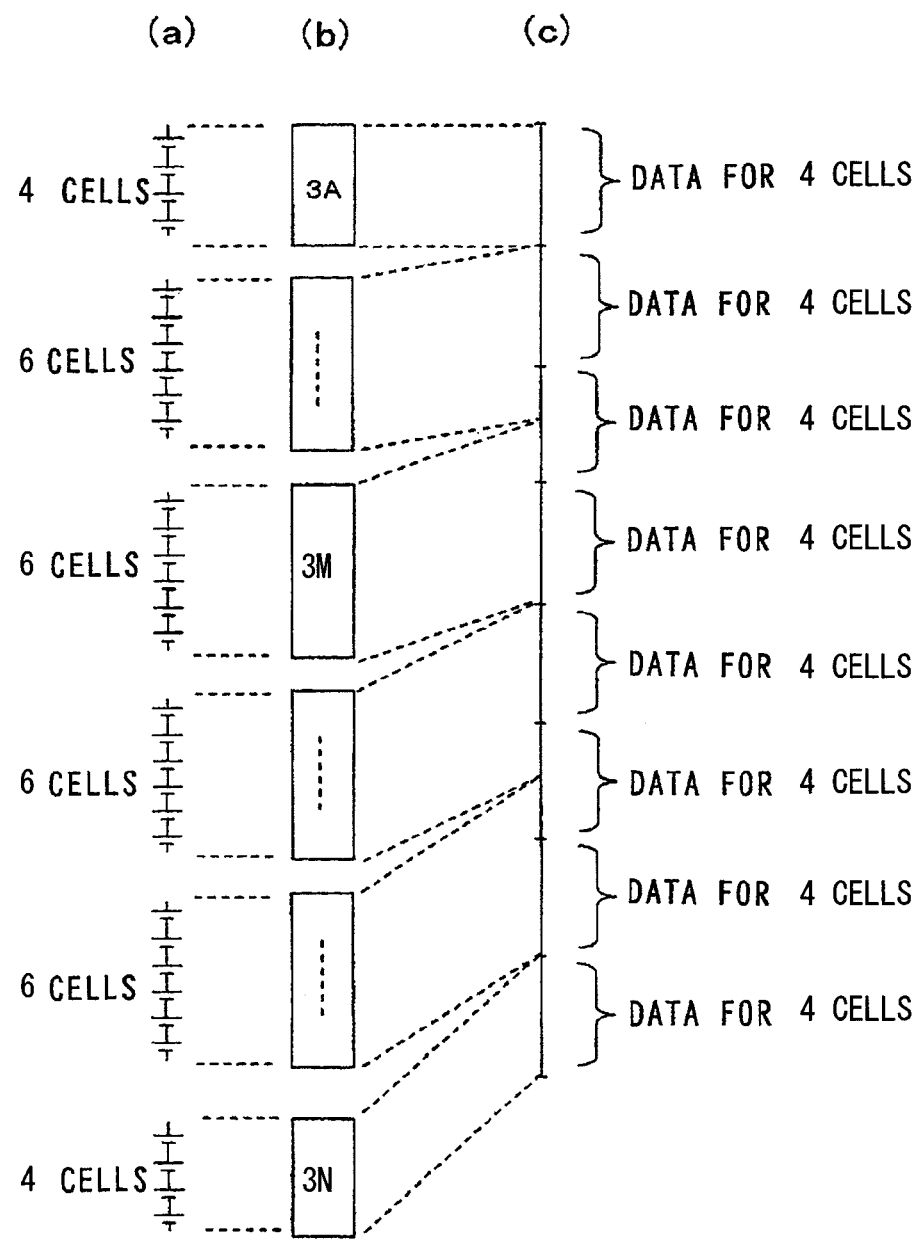
FIG. 17 is an explanatory figure for explanation of an example in which the numbers of battery cells in the various cell groups are different.

However sometimes, as shown in FIG. 17, it may be arranged for the number of battery cells in the various cell groups of the battery unit 9 to be different. Thus the number of battery cells that make up the battery unit 9 can be freely selected, and it is not necessary for it to be a multiple of the number of battery cells in the cell groups. FIG. 17(a) shows the number of battery cells in each cell group, while FIG. 17(b) shows the integrated circuits that correspond to the various cell groups. Thus there are different numbers of the present value storage circuits 274 internal to the integrated circuits, and of data related to the terminal voltages of the battery cells stored in the initial value storage circuits 275. When this data is transmitted to the battery controller 20 on the basis of a request from the battery controller 20, while it would be acceptable to transmit different numbers of data items in each case, it is also possible, as shown in FIG. 17(c), to redistribute it and to perform transmissions of a fixed number of data items. It becomes possible to increase the reliability of transmission by transmitting and receiving a fixed number of data items at one time in this manner.

As shown in FIG. 17(b), the number of battery cells in the cell groups related to each of the integrated circuits 3A, . . . 3M, . . . 3N may be different. And, as shown in FIG. 17(a), for example, there may be four battery cells in the cell group that is related to the uppermost integrated circuit 3A and four battery cells in the cell group that is related to the lowermost integrated circuit 3N, so that these cell groups have fewer battery cells than the other cell groups. The number of battery cells in each of the interior cell groups that is not a cell group at an end of the battery unit 9 (for example, six) is thus greater than the number of battery cells in the cell groups at the ends (for example, four).

The highest ranking integrated circuit 3A in terms of potential and the lowest ranking integrated circuit 3N in terms of potential are connected to the battery controller 20 via the insulating circuits including the photocouplers PH1, PH4 as described above. From the viewpoint of security and of price, it is desirable for the withstand voltage of the photocouplers PH1, PH4 to be made low. By reducing the number of battery cells in the cell groups related to the integrated circuits that are connected to the photocouplers PH1, PH4, it becomes possible to reduce the withstand voltage demanded for the photocouplers. For example, if six battery cells were to be connected to each of the highest ranking integrated circuit 3A and the lowest ranking integrated circuit 3N, then the withstand voltage required for the photocouplers via which those integrated circuits were connected to the battery controller 20 would need to be set higher than the maximum value of the terminal voltage of six battery cells. And when the number of cells is increased, along with this the required withstand voltage also increases.

In the example shown in FIG. 17, the number of battery cell terminal voltages stored in the highest ranking integrated circuit 3A and in the lowest ranking integrated circuit 3N is four. Thus data for four battery cells is to be communicated to the battery controller 20. Moreover, in the case of the integrated circuits other than those integrated circuits 3A and 3N, data for six battery cells is to be communicated to the battery controller 20.

In this embodiment, as shown in FIG. 17(c), it is arranged to transmit data for all of the battery cells sequentially as units of data for four battery cells together, i.e. as: a data unit for the four battery cells that are connected to the integrated circuit 3A; a data unit for the four battery cells, among the six battery cells that are connected to the next integrated circuit in sequence, that are disposed at the upper side thereof; a data unit for the two battery cells, among the six battery cells that are connected to that integrated circuit, that are disposed at the lower side thereof, and also for the two battery cells, among the six battery cells that are connected to the next integrated circuit in sequence, that are disposed at the upper side thereof; . . . and finally a data unit for the four battery cells that are connected to the lowermost integrated circuit 3N.

In the power supply system for a vehicle shown in FIG. 13, the amount of data that can be transferred at one time in relation to the communication between the battery controller 20 and the higher ranking controller 110 is limited (for example, the upper limit of data is the amount for four battery cells or the like). Accordingly, by employing the structure for the battery unit 9 shown in FIG. 17(c), it is arranged for it to be possible to send and receive signals whose amount does not exceed the limiting value described above, and it is arranged for it to be possible to perform transmission and reception of signals in a reliable manner.

In the embodiment described above, the number of battery cells that are connected to the uppermost integrated circuit 3A and to the lowermost integrated circuit 3N is made to be four, while the number of battery cells that are connected to the other integrated circuits is made to be six. However this is not to be construed as being limitative. For example similar beneficial effects could be obtained provided that the number of battery cells that are connected to the uppermost integrated circuit 3A and to the lowermost integrated circuit 3N is made to be smaller than the number of battery cells that are connected to the other integrated circuits, and, whichever one of these is the lower number, it is possible to lower the withstand voltage of the photocouplers of the one that is lower.

Moreover, in the embodiment described above, transmission and reception of data was performed sequentially in units of four battery cells, irrespective of the fact that different numbers of battery cells were connected to the various integrated circuits. However, the number of battery cell data items that is taken as a unit is not limited to being four. For example, a similar beneficial effect can be obtained even if it is arranged to transmit and receive, as a unit, data for a smaller number of battery cells than the greatest number of battery cells that are connected to each of the integrated circuits.

Diagnosis of the Battery Cells

The measurement of the battery cells and the diagnostic operation for over-charge and over-discharge thereof, performed during the internal processing operation of the integrated circuits 3A . . . 3M shown in FIG. 1, will now be explained. In the stages STGCV1 through STGCV6 described in the row 260Y1 of the operation table 260 of FIG. 4, the terminal voltage of each of the battery cells is inputted, and diagnosis thereof is performed. In the interval for measurement in the stage STGCV1, as already explained, the selection circuit 120 of FIG. 5 selects VCC (V1) and VC2 (V2). Due to this operation, the terminal voltage of the battery cell BC1 of FIG. 2 is selected, and is inputted to the analog/digital converter 122A, via the differential amplifier 262 that is endowed with a potential shift function. This terminal voltage is then converted into a digital value by the analog/digital converter 122A, and thereafter an average value thereof is calculated by the averaging circuit 264 on the basis of its measured values in a predetermined number of the newest measurements, including the measurement this time. This average value is stored in the register CELL1 of the present value storage circuit 274.

Then, on the basis of this measured value stored in the register CELL1 of the present value storage circuit 274, diagnosis of over-charge or over-discharge of the battery cell BC1 is performed in the measurement interval of the stage STGCV1 of FIG. 4. Before entering upon this diagnosis, reference values for diagnosis are transmitted to the integrated circuits from the battery controller 20, and a reference OC for diagnosis of over-charge is stored in one register of the reference value storage circuit 278 and moreover a reference OD for diagnosis of over-discharge is stored in another register of the reference value storage circuit 278. Furthermore, so as to be able to ascertain an abnormal state of over-charge even if no reference value can be transmitted by a communication command from the battery controller 20 or if an erroneous value has been stored in the reference value storage circuit 278 due to noise or some other cause, an over-charge reference value OC FFO is stored in advance that cannot be rewritten by any communication command 292.

Diagnosis of Over-Charge

After the measuring of the terminal voltage in the measurement section of the stage STGCV1, next the terminal voltage value that has been measured is compared with the over-charge decision value OC by the digital comparison circuit 270. In other words, by selection signals created by the decoder 257 and the decoder 259 on the basis of the outputs of the first stage counter 256 and of the second stage counter 258 of FIG. 4, the measured value for the register CELL1 is selected from among the plurality of measured values stored in the registers CELL1 through CELL6 of the present value storage circuit 274 and the register VDD and also the VDD value through the standard power supply (PSBG), and is inputted to the digital comparison circuit 270. Furthermore, in a similar manner, by selection signals created by the decoder 257 and the decoder 259 mentioned above, the over-charge diagnosis reference value OC is selected from among the plurality of reference values stored in the reference value storage circuit 278, and the measured value for the battery cell BC1 in the register CELL1 and this over-charge diagnosis reference value OC are compared together by the digital comparison circuit 270. The digital comparison circuit 270 outputs a comparison result indicating an abnormality when the measured value for the battery cell BC1 is greater than the over-charge diagnosis reference value OC. And, due to the selection signals created by the decoder 257 and the decoder 259 mentioned above, the digital multiplexer 282 selects the storage destination for the output of the digital comparison circuit 270. If the diagnosis result for the battery cell BC1 is that there is an abnormality, then this abnormality diagnosis result is stored in the register MFflag and the register OCflag of the flag storage circuit 284. In other words, MFflag and OCflag are put into their set states. An abnormality flag is outputted from the terminal FFO of the integrated circuit, and is transmitted to the battery controller 20.

Furthermore, in order to enhance the reliability, the digital comparison circuit 270 compares together the measured value for the battery cell BC1 and the over-charge diagnosis reference value OC FFO. If the measured value for the battery cell BC1 is greater than the over-charge diagnosis reference value OC FFO, then this is taken as being an abnormality related to over-charging, and this abnormality diagnosis result is stored in the register MFflag and the register OCflag of the flag storage circuit 284. When the abnormality flag is set in the flag storage circuit 284, it is transmitted to the battery controller 20 in a similar manner to that described above. Since the over-charge diagnosis reference value OC FFO is a reference value that cannot be rewritten from the controller 20, accordingly this over-charge diagnosis reference value OC FFO cannot change even if there is some abnormality in the program or the operation of the battery controller 20, and so it is possible to be sure that its reliability is high. Since the over-charge diagnosis reference value OC can be changed from the battery controller 20, it can be used for making a more detailed decision. Moreover since, as described above, the over-charge diagnosis reference value OC FFO is data of high reliability that is maintained irrespective of the state of the battery controller 20 and the state of the transmission path, accordingly it is possible to implement diagnosis of high reliability by performing diagnosis using these two different types of data.

Diagnosis of Over-Discharge

The processing in the measurement interval of the stage STGCV1 then continues to performing diagnosis of over-discharge of the battery cell BC1. The measured value for the battery cell BC1 stored in the register CELL1 of the present value storage circuit 274 and the reference value OD in the reference value storage circuit 278 are compared together by the digital comparison circuit 270. If the measured value for the battery cell BC1 is smaller than the reference value OD in the reference value storage circuit 278, then it is decided that an abnormality is present, and an abnormality signal is outputted. According to the selection signal based upon the outputs of the decoder 257 and of the decoder 259, the digital multiplexer 282 selects MFflag and ODflag of the flag storage circuit 284, and the abnormality signal outputted from the digital comparison circuit 270 is set into the register MFflag and into the register ODflag.

If MFflag is set by the diagnosis of the items described above, then this flag is outputted from the output terminal FFO via the OR circuit 288, and is transmitted to the battery controller 20.

The function of the selection circuit 286 can be changed by a communication command 292 from the battery controller 20, and thereby it is possible selectively to change which flags are included in the flags that are outputted from the terminal FFO. For example, it would be acceptable for the condition in which only MFflag of the flag storage circuit 284 is set to be considered as being indicative of an over-charge abnormality. In this case, the over-discharge abnormality diagnosis output of the digital comparison circuit 270 would not be set in the register MFflag, but would only be set in ODflag. It would also be possible to set whether or not ODflag is outputted from the terminal FFO to be determined by a setting condition of the selection circuit 286. In this case it would be possible to undertake many different types of control, since it would be possible to change the setting condition from the battery controller 20.

After the stage STGCV1 in the row 260Y1 of the operation table of FIG. 4, the processing proceeds to the interval of the next stage STGCV2. By the selection circuit 120 in FIG. 6 selecting VC2 (V2) and VC3 (V3), the terminal voltage of the battery cell BC2 of FIG. 2 is selected. And, by a similar operation to that in the stage STGCV1 described above, the terminal voltage of the battery cell BC2 is digitally converted by the analog/digital converter 122A, the average of a predetermined number of the newest measured values including the measurement in this cycle is calculated by the averaging circuit 264, and the result is stored in the register CELL2 of the present value storage circuit 274. The selection of the position for storage of this measurement result is performed on the basis of the outputs of the decoder 257 and the decoder 259 of FIG. 4, in the same manner as in the case of the other measurement value.

Next, in the same manner as in the case of the stage STGCV1 described above, on the basis of the outputs of the decoder 257 and the decoder 259, along with the measured value for the battery cell BC2 from the present value storage circuit 274 being selected, also the over-charge diagnosis reference value OC of the reference value storage circuit 278 is selected, and diagnosis is performed by these being compared together by the digital comparison circuit 270. The details of the diagnosis and its operation are the same as in the case of the stage STGCV1 described above.

Subsequently, in the stages STGCV3 through STGCV6, the measurement followed by diagnosis performed by the circuit of FIG. 5 follows similar operational details to the cases of the stage STGCV1 and the stage STGCV2 described above.

Adjustment of the States of Charge SOC and Measurement of the Terminal Voltages

As described above, it is arranged to control the balancing switches 129A through 129F in order to adjust the states of charge SOC of the battery cells that make up the battery unit 9, and thereby to discharge electrical power from those battery cells whose amounts of charge are larger via their discharge resistors. However, there is a possibility that the control of these balancing switches 129A through 129F to open and close may exert a negative influence upon the detection of the terminal voltages of the battery cells. In other words, when the balancing switches 129 are closed in the circuit of FIG. 2, discharge currents flow via the resistors R1 through R4, and the accuracy of measurement of the terminal voltages of the battery cells BC1 through BC4 is reduced.

It is necessary for the opening and closing control of the balancing switches 129A through 129F to be performed on the basis of the states of all of the battery cells of the entire battery unit 9. Accordingly, it is desirable for the battery controller 20 shown in FIG. 1 to perform the processing, and it is desirable for each of the integrated circuits 3A through 3N to control its balancing switches 129A through 129F on the basis of commands from the battery controller 20. On the other hand, in relation to the measurement of the terminal voltages of the battery cells, it is desirable for each of the integrated circuits 3A through 3N individually to perform measurement of the voltages of the battery cells of its corresponding group, and for these measured values of terminal voltage that have been measured and stored individually to be rapidly transmitted upon receipt of a transmit command for these measurement values from the battery controller 20. Accordingly, in order to harmonize the above described control of the balancing switches 129A through 129F and control of measurement of the terminal voltages of the battery cells, for which the circuits that perform control are different, it is necessary to execute both types of control in a combined manner.

A structure that implements both types of control described above will now be explained in concrete terms using FIGS. 18 through 22. It should be understood that in the actual product that is manufactured, in addition to the discharge resistors R1 through R4 shown in FIGS. 1 and 2, it is also desirable to provide capacitors C1 through C6 in order to eliminate the influence of noise. Due to this, in the following explanation, circuits are shown in FIGS. 18, 19, 23, and 24 in which capacitors for elimination of noise have been added to the circuit shown in FIGS. 1 and 2. It should be understood that while the number of battery cells in FIGS. 1 and 2 is four, cases are shown in FIGS. 18, 19, 23, and 24 in which the number of battery cells is six. And it should be understood that the above described resistors and capacitors are housed in the cell controller shown by the broken line 80 along with the integrated circuit also shown by a broken line, and are connected to the battery cells BC1 through BC6 of this battery block via a communication harness.

Figure 18:
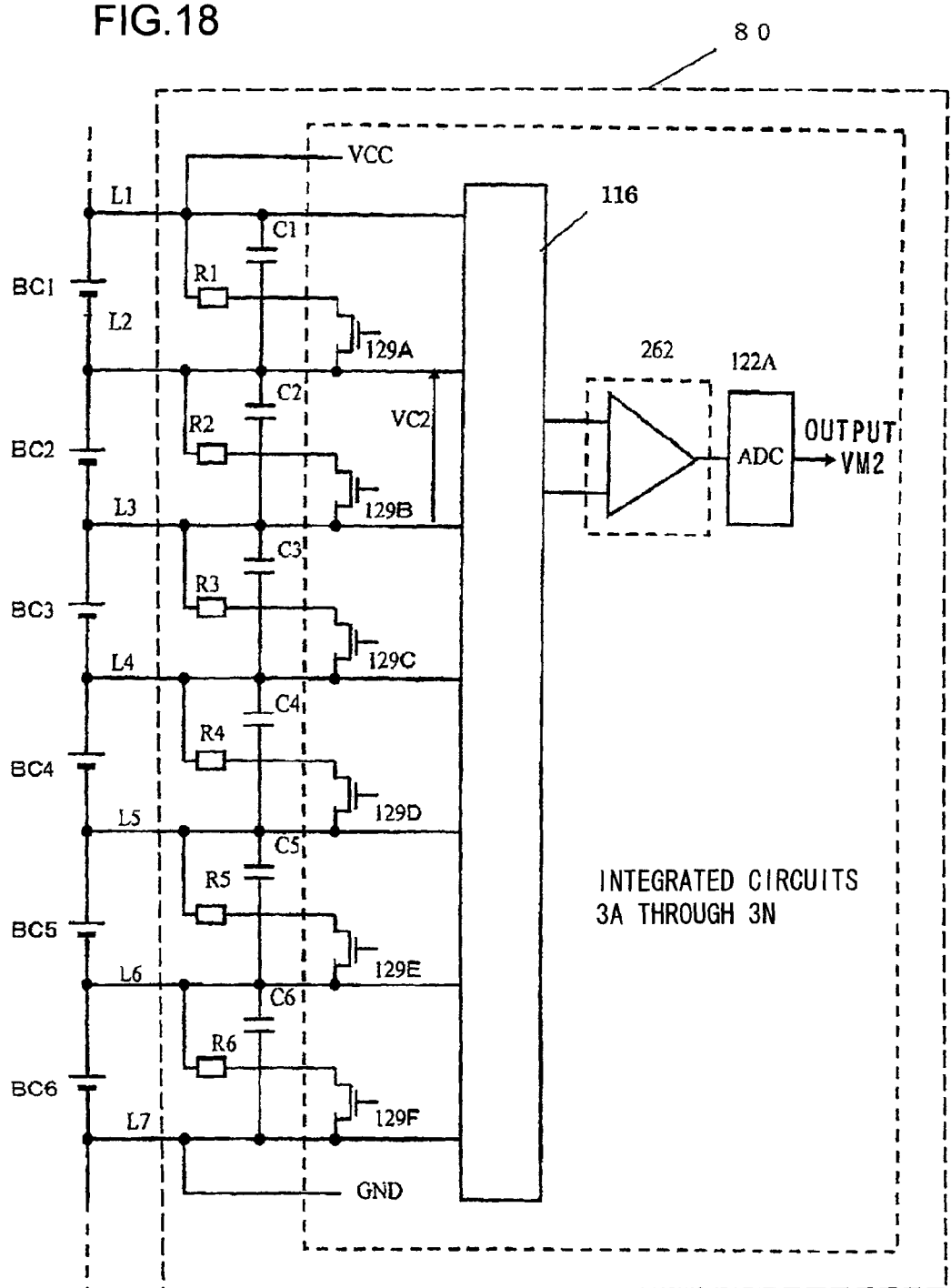
FIG. 18 is a figure showing an example of a structure for implementing both control of balancing switches and also control to measure the terminal voltages of the battery cells.
Figure 19:
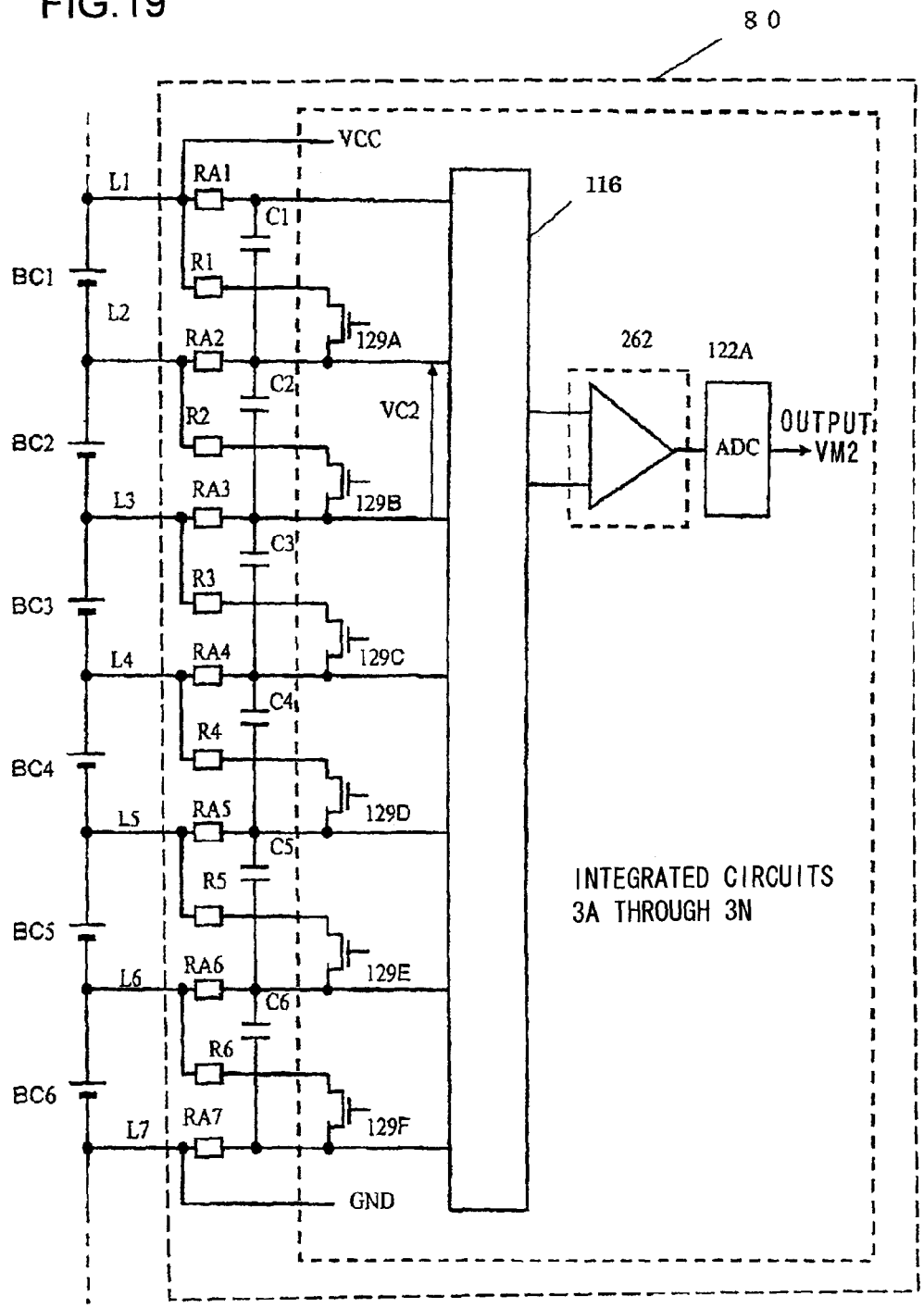
FIG. 19 is a figure showing another embodiment of a structure for implementing both control of balancing switches and also control to measure the terminal voltages of the battery cells.
Figure 20:
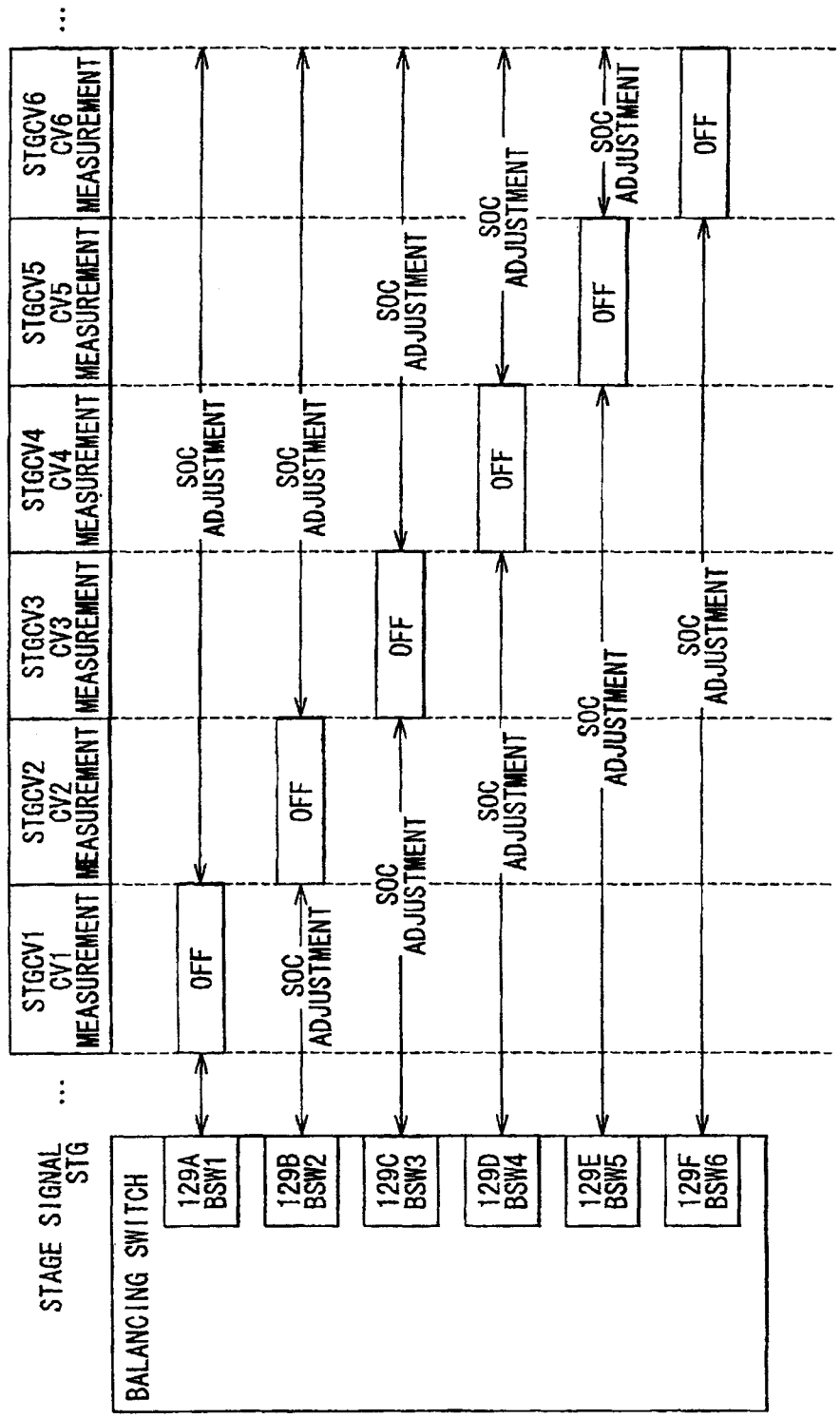
FIG. 20 is an operational figure showing the relationship between the measurement control and the discharge control for adjusting the states of charge, performed by the circuit shown in FIG. 18.
Figure 21:
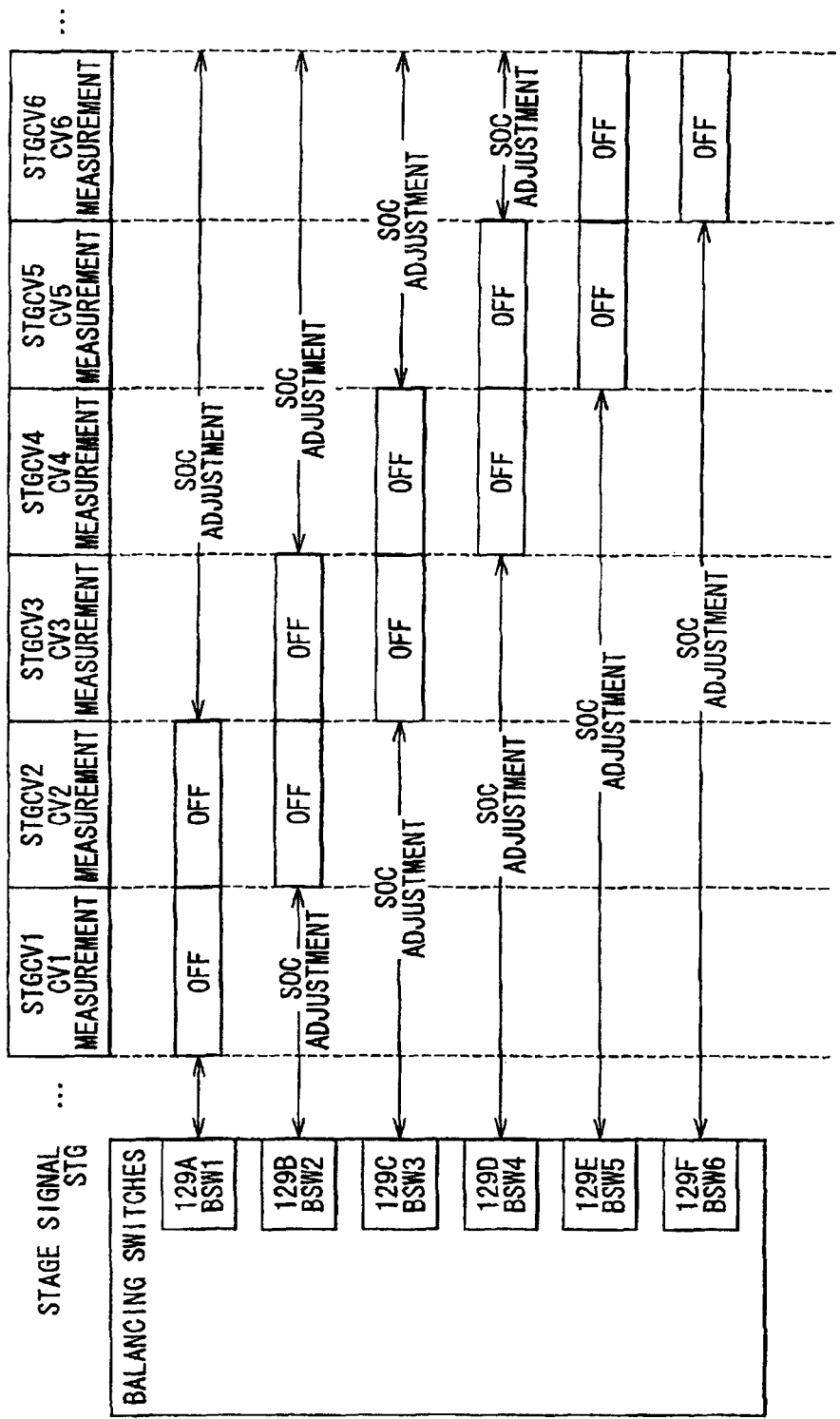
FIG. 21 is an operational figure showing the relationship between the measurement control and the discharge control for adjusting the state of charge performed by the circuit shown in FIG. 19.
Figure 22:
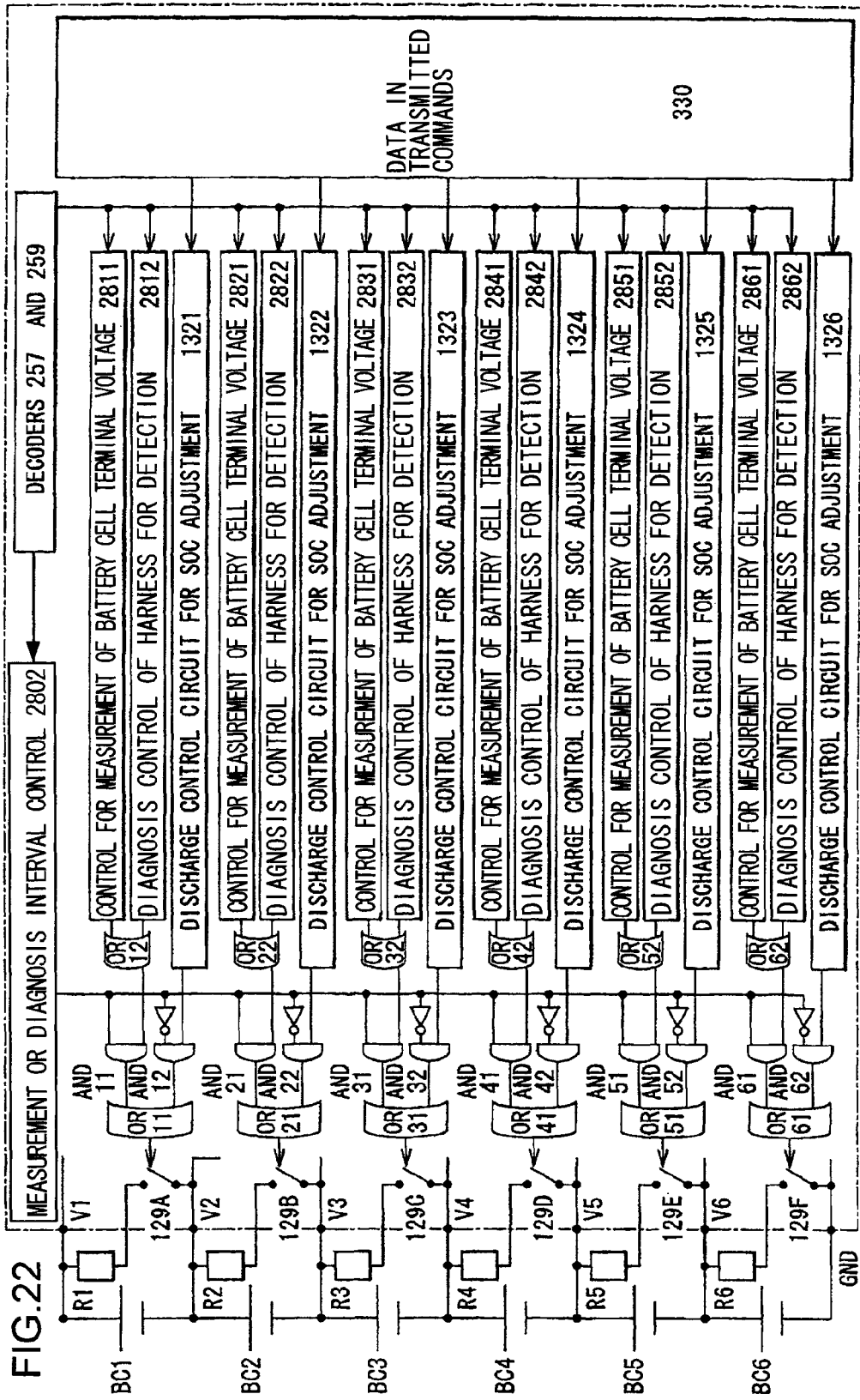
FIG. 22 is a figure showing an example of a circuit for performing the control shown in FIGS. 20 and 21.

In FIG. 19, a circuit is shown that is intended further to reduce the influence of noise using the discharge resistors R1 through R6 shown in FIG. 18. And FIGS. 20 and 21 are figures showing the operations of measurement control and of discharge control for adjusting the states of charge SOC. It should be understood that FIG. 20 shows the operation of the circuit shown in FIG. 18, while FIG. 21 shows the operation of the circuit shown in FIG. 19. Moreover, a circuit for performing the control shown in FIGS. 20 and 21 is shown in FIG. 22.

With the circuit of FIG. 18, the terminal voltage of the battery cell BC1 is measured in the stage STGCV1, and then in the next stage STGCV2 the terminal voltage of the battery cell BC2 is measured. And subsequently measurement of the terminal voltages of the battery cells BC3 through BC6 is performed in order. By repeating the measurement in this manner, it becomes possible always to monitor the states of the terminal voltages of the battery cells.

For example, when the balancing switch 129B is in the closed state in order to adjust the state of charge SOC, then a discharge current flows via the balancing switch 129B and the resistor R2. Due to this, the internal resistance and the wiring resistance of the battery cell BC2 are influenced by this discharge current, and the voltage VC2 inputted to the selection circuit 120 becomes a lower value than the terminal voltage when the balancing switch 129B is in its opened state. In other words, by closing the balancing switch 129B, the terminal voltage inputted to the input circuit 116 drops to a lower value, so that the accuracy of measurement decreases.

In order to prevent the above described decrease of measurement accuracy, as shown in FIG. 20, in the stage STGCV1 in which the terminal voltage of the battery cell BC1 is measured, controlling of the state of charge SOC is temporarily stopped with the balancing switch 129A being put into the opened state, and the terminal voltage of the battery cell BC1 is measured. Next, in the stage STGCV2 in which the terminal voltage of the battery cell BC2 is measured, controlling of the state of charge SOC is temporarily stopped with the balancing switch 129B being put into the opened state, and the terminal voltage of the battery cell BC2 is measured. Subsequently, in order, each of the balancing switches 129C through 129F (BSW3 through BSW6 in FIG. 20) is put into its opened state, and the terminal voltage of the corresponding battery cell is measured.

It is acceptable to stop the control for adjusting the state of charge SOC in the respective measurement intervals of each of the stages STGCV1 through STGCV6. Or it would also be acceptable to stop control for adjusting the state of charge SOC only for the short periods of time in which the terminal voltages are actually measured during the intervals of each of the stages STGCV1 through STGCV6.

Next, the circuit shown in FIG. 19 will be explained. A large amount of noise is mixed in upon the electrical power line that supplies power from the battery cells BC1 through BC6 that are connected in series to the inverter device. In order to reduce the influence of this noise, in the circuit shown in FIG. 19, resistors RA1 through RA7 are inserted between the battery cell terminals and the input terminals of the input circuit 116. The resistors RA1 through RA7 mentioned above perform noise elimination along with the capacitors C1 through C7, thus protecting the integrated circuit from noise.

With the circuit shown in FIG. 19, when the balancing switch 129A is closed in order to adjust the state of charge SOC, a discharge current for the battery cell BC1 flows via the resistor R1, the balancing switch 129A, and the resistor RA2. Since in the state in which the balancing switch 129A is closed the discharge current flows through the resistor RA2, accordingly its influence is exerted, not only upon the measurement of the terminal voltage of the battery cell BC1, but also upon the measurement of the terminal voltage of the battery cell BC2. Accordingly, during measurement of the terminal voltage of the battery cell BC2, it becomes necessary to open both the balancing switch 129A and also the balancing switch 129B. In a similar manner, during measurement of the terminal voltage of the battery cell BC3, it becomes necessary to open both the balancing switch 129B and also the balancing switch 129C. Subsequently, in a similar manner, the same is the case during the measurements for the other battery cells.

FIG. 21 shows the situation for the circuit shown in FIG. 19 with the balancing switch 129 forcibly opened when measurement is being performed. Since the measurement of the terminal voltage of the battery cell CB2 of FIG. 19 is performed in the stage STGCV2, accordingly the control of the balancing switches 129A and 129B for adjusting the state of charge SOC is stopped, and the balancing switches 129A and 129B are maintained in their open states. In this case, the fact that it would be possible to stop the control of the balancing switches 129A and 129B for adjusting the state of charge SOC over the entire interval of the stage STGCV2, and that it would alternatively also be acceptable to arrange to stop the control of the balancing switches 129A and 129B for adjusting the state of charge SOC only for the short interval in that stage STGCV2 in which the voltage is actually measured, is the same as in the case of FIG. 20 described above.

Moreover, since the measurement of the terminal voltage of the battery cell B3 of FIG. 19 is performed in the stage STGCV3 of FIG. 21, accordingly, in the measurement interval of the terminal voltage of the battery cell BC3, the control of the balancing switches 129B and 129C for adjusting the state of charge SOC is stopped, and the balancing switches 129B and 129C are maintained in their open states. In this case, it would be possible to stop the control of the balancing switches 129B and 129C for adjusting the state of charge SOC over the entire interval of the stage STGCV3. Alternatively, the fact that it would also be acceptable to arrange to stop the control of the balancing switches 129B and 129C for adjusting the state of charge SOC only for the short interval in the stage STGCV3 in which the voltage is actually measured, is the same as in the cases described above.

And since measurement of the terminal voltage of the battery cell BC4 or BC5 is performed in the stage STGCV4 or in the stage STGCV5, the balancing switches 129C and 129D or the balancing switches 129D and 129E are maintained in their open states. And in the stage STGCV6, measurement of the terminal voltage of the battery cell BC6 is measured. Due to this, in the measurement interval for the terminal voltage of the battery cell BC6, the balancing switch 129F is maintained in its open state.

It should be understood that the intervals shown by the arrow signs "←" and "→" in FIGS. 20 and 21 are intervals in which control of the balancing switches 129A through 129F for adjusting the states of charge SOC is performed. Moreover, the intervals shown as "OFF" are intervals in which control of the balancing switches 129A through 129F for adjusting the states of charge SOC is stopped, and those switches are forcibly put into their opened states. As described above, in the intervals for measurement of the battery terminal voltages, it is possible to enhance the accuracy of measurement of the battery cell terminal voltages by forcibly opening the relevant ones of the balancing switches 129 while taking priority over control for adjustment of the state of charge SOC performed by the battery controller 20.

Next, using the circuit shown in FIG. 22, the operation for opening the balancing switches 129 described above will be explained. First, control values for performing adjustment of the states of charge SOC are calculated in the step 815 of FIG. 14. And control values based upon the results of this calculation are sent to the integrated circuits 3A, . . . 3M, . . . 3N by communication commands 292. In each of these integrated circuits 3A, . . . 3M, . . . 3N, reception of these commands is performed by the communication circuit 127 shown in FIGS. 2 and 7, and the balancing switches 129A through 129F are controlled on the basis of these received results.

The data 330 shown in FIG. 22 shows the portion 330 of the data in the reception register 322 of FIG. 7 in magnified view; the contents of this data 330 is inputted to discharge control circuits 1321 through 1326. The control signals that are inputted may, for example, be "1" or "0", with "1" meaning control to close the balancing switch so that discharge is performed, and "0" meaning control to open the balancing switch so that discharge is not performed. These control signals are stored in the discharge control circuits 1321 through 1326, and the respective balancing switches 129A through 129F are controlled on the basis of this stored data.

The data stored in the discharge control circuits 1321 through 1326 is supplied to AND gates 12 through 62, and also drives the balancing switches 129A through 129F via OR gates 11 through 61. On the other hand, during priority control of the balancing switches 129A through 129F that takes priority over control for adjustment of the states of charge SOC, the signals based upon the above described discharge control circuits 1321 through 1326 are intercepted by the AND gates 12 to 62. This interval of interception is the interval explained with reference to FIGS. 26 and 27, and, since the measurement of the terminal voltages of the battery cells is to be performed on the basis of the outputs of the decoders 257 and 259, accordingly a control stop signal from a circuit 2802 on the basis of the outputs of the decoders 257 and 259 is sent to the AND gates 12 through 62.

In the interval in which the AND gates 12 through 62 are opened and control for adjusting the states of charge SOC is stopped, AND gates 11 through 61 are closed, and the balancing switches 129A through 129F are driven by the outputs of the OR gates 12 through 62. Accordingly, in this interval in which the AND gates 12 through 62 are opened and the AND gates 11 through 61 are closed, it is possible to output control signals from measurement control circuits 2811 through 2861 that control the balancing switches 129A through 129F, so that measurement may be performed in an optimum manner. Moreover, if abnormality diagnosis is made for the harness for detection as will be described hereinafter, then control signal-for controlling the balancing switches 129A through 129F are outputted from diagnosis control circuits 2812 through 2862.

Since, in this manner, each of the integrated circuits 3A, . . . 3M, . . . 3N is provided with a circuit that is able to prioritize stopping the control for adjustment of the states of charge SOC over the control for adjusting the states of charge SOC, and moreover is able to control the balancing switches 129A through 129F individually during the stopped interval, accordingly the beneficial effect is obtained that it becomes possible to perform accurate measurement and diagnosis.

Diagnosis of the ADCs, of the Differential Amplifiers 262, and of the Reference Voltages In the stage STGPSGB described in the row 260Y1 of the operation table 260 shown in FIG. 4, diagnosis is performed of the internal reference voltage, of the analog circuitry, and of the voltage detection circuit 122A. The power supply voltage for the operation of the analog circuitry and the digital circuitry shown in FIG. 5 is generated by the power supply circuit 121 interior to the integrated circuit (refer to FIG. 2). If this power supply voltage is generated on the basis of an absolute reference power supply, then it is possible to obtain that power supply voltage very accurately and in a comparatively simple manner. However there is the concern that, if the absolute reference voltage changes, then the power supply voltage will also change, and this is undesirable.

In the stage STGPSBG, it is possible to perform diagnosis of the reference power supply and diagnosis of the analog circuitry and of the voltage detection circuit 122A with good efficiency. This will now be explained in the following in concrete terms.

With the circuit of FIG. 5, the input circuit 116 selects the reference power supply and GND. By this selection, the voltage difference between the potential of GND and the reference power supply is inputted to the differential amplifier 262 that performs potential shifting and scale matching, and the result is inputted to the analog/digital converter 122A. The analog/digital converter 122A converts this input signal to a digital value. And, on the basis of the decoders 257 and 259, this digital signal is stored in the present value storage circuit 274 as data PSBG in the PSGB register.

The voltage of the reference power supply is already known if the operation of the relevant circuitry is normal, and a lower level permitted value (PSBGmin) for the reference power supply, i.e. a value slightly smaller than the already known voltage of the reference power supply, and a higher level permitted value (PSBGmax), i.e. a value slightly greater than the already known voltage of the reference power supply, are both stored in storage regions for a lower level permitted value and a higher level permitted value that are allocated in advance in registers in the reference value storage circuit 278. If the reference power supply is at a normal voltage, its value will be between the lower level permitted value and the higher level permitted value of the reference power supply. Furthermore, if the analog circuitry is not operating normally, for example if the differential amplifier 262 is not normal, then, even if for example the reference power supply is at a normal voltage, the output of the analog/digital converter 122A will become outside its normal range. Moreover, the output of the analog/digital converter 122A will also become outside its normal range if the analog/digital converter 122A is not normal.

Accordingly, comparison and diagnosis are performed by the digital comparison circuit 270 as to whether or not the value "reference power supply" stored in the present value storage circuit 274 is between the lower level permitted value and the higher level permitted value for the reference power supply that are stored in the reference value storage circuit 278.

The digital multiplexer 272 selects the measurement value "reference power supply" on the basis of the outputs of the decoders 257 and 259, and sends it to the digital comparison circuit 270. Moreover, the digital multiplexer 272 selects the lower level permitted value of the reference power supply on the basis of the outputs of the decoders 257 and 259, and sends it to the digital comparison circuit 270. If the measurement value "reference power supply" is smaller than the lower level permitted value of the reference power supply, then the digital comparison circuit 270 takes this as being an abnormality, and stores an abnormality flag in an abnormality flag storage register selected by the digital multiplexer 282 on the basis of the outputs of the decoders 257 and 259, in this embodiment in the register MFflag of the flag storage circuit 284. But if it is decided that the measurement value "reference power supply" is greater than the lower level permitted value of the reference power supply, then the above setting of the abnormality flag of the flag storage circuit 284 is not performed.

And, in the interval of the stage STGPSBG, the digital multiplexer 272 selects the measurement value "reference power supply" on the basis of the outputs of the decoders 257 and 259, and sends it to the digital comparison circuit 270. Moreover, the digital multiplexer 272 selects the higher level permitted value of the reference power supply on the basis of the outputs of the decoders 257 and 259, and sends it to the digital comparison circuit 270. If the measurement value "reference power supply" is greater than the higher level permitted value of the reference power supply, then the digital comparison circuit 270 takes this as being an abnormality, and stores an abnormality flag in an abnormality flag storage register selected by the digital multiplexer 282 on the basis of the outputs of the decoders 257 and 259, in this embodiment in the register MFflag of the flag storage circuit 284. But if it is decided that the measurement value "reference power supply" is smaller than the higher level permitted value of the reference power supply, then the above setting of the abnormality flag of the flag storage circuit 284 is not performed. By doing this it is possible, during the interval of the stage STGPSBG, to perform the diagnosis as to whether or not the differential amplifier 262, that is an analog amplifier, and the analog/digital converter 122A are operating normally, and accordingly it is possible to maintain high reliability.

Diagnosis of the Digital Comparison Circuitry

Diagnosis of the digital comparison circuitry is performed in the stage STGCa1 of the operation table 260 shown in FIG. 4. In the following, this operation will be explained. The digital multiplexer 272 selects an increase calculation value 280 on the basis of the outputs of the decoders 257 and 259. This increase calculation value 280 is a reference value that is stored in the reference value storage circuit 278 (for example a value that is obtained by adding some predetermined value to the reference value OC). The digital multiplexer 276 selects one reference value stored in the reference value storage circuit 278 (in this embodiment, the reference value OC), and inputs it to the digital comparison circuit 270 as a subject for comparison. Yet further, it inputs a value determined by the reference value OC that has been selected (for example an increase calculation value 280 that has been obtained by adding "1" thereto) to the digital comparison circuit 270 via the digital multiplexer 272. And, if the digital comparison circuit 270 decides that the increase calculation value 280 is larger than the reference value OC, then the conclusion is that the digital comparison circuit 270 is operating correctly.

Next, the digital multiplexer 272 selects a decrease calculation value 281 on the basis of the outputs of the decoders 257 and 259. This decrease calculation value 281 is a reference value that is stored in the reference value storage circuit 278 (for example a value that is obtained by subtracting some predetermined value, for example "1", from the reference value OC). The digital multiplexer 276 selects one reference value stored in the reference value storage circuit 278 (in this embodiment, the reference value OC), and inputs it to the digital comparison circuit 270 as a subject for comparison. Yet further, it inputs a value determined by the reference value OC that has been selected (for example the decrease calculation value 281 that has been obtained by subtracting "1" therefrom) to the digital comparison circuit 270 via the digital multiplexer 272. And, if the digital comparison circuit 270 decides that the decrease calculation value 281 is smaller than the reference value OC, then the conclusion is that the digital comparison circuit 270 is operating correctly.

As described above, it is possible to determine whether or not the comparator is operating correctly by comparing the reference value OC stored in the reference value storage circuit 278 with a value that has been obtained by adding a predetermined value to this reference value OC, or by comparing it with a value that has been obtained by subtracting a predetermined value from it.

The objective of using the increase calculation value 280 and the decrease calculation value 281 is in order to diagnose results of comparison by furnishing a condition in which a magnitude relationship to a subject of comparison is already known; and, instead of adding or subtracting a predetermined value, it would also be acceptable to use a value obtained by shifting the data towards the more significant side or towards the less significant side. In this case, by multiplying by the predetermined value 4 or by subtracting it, it becomes possible to furnish a magnitude relationship that is already known, like that described above.

Figure 23:
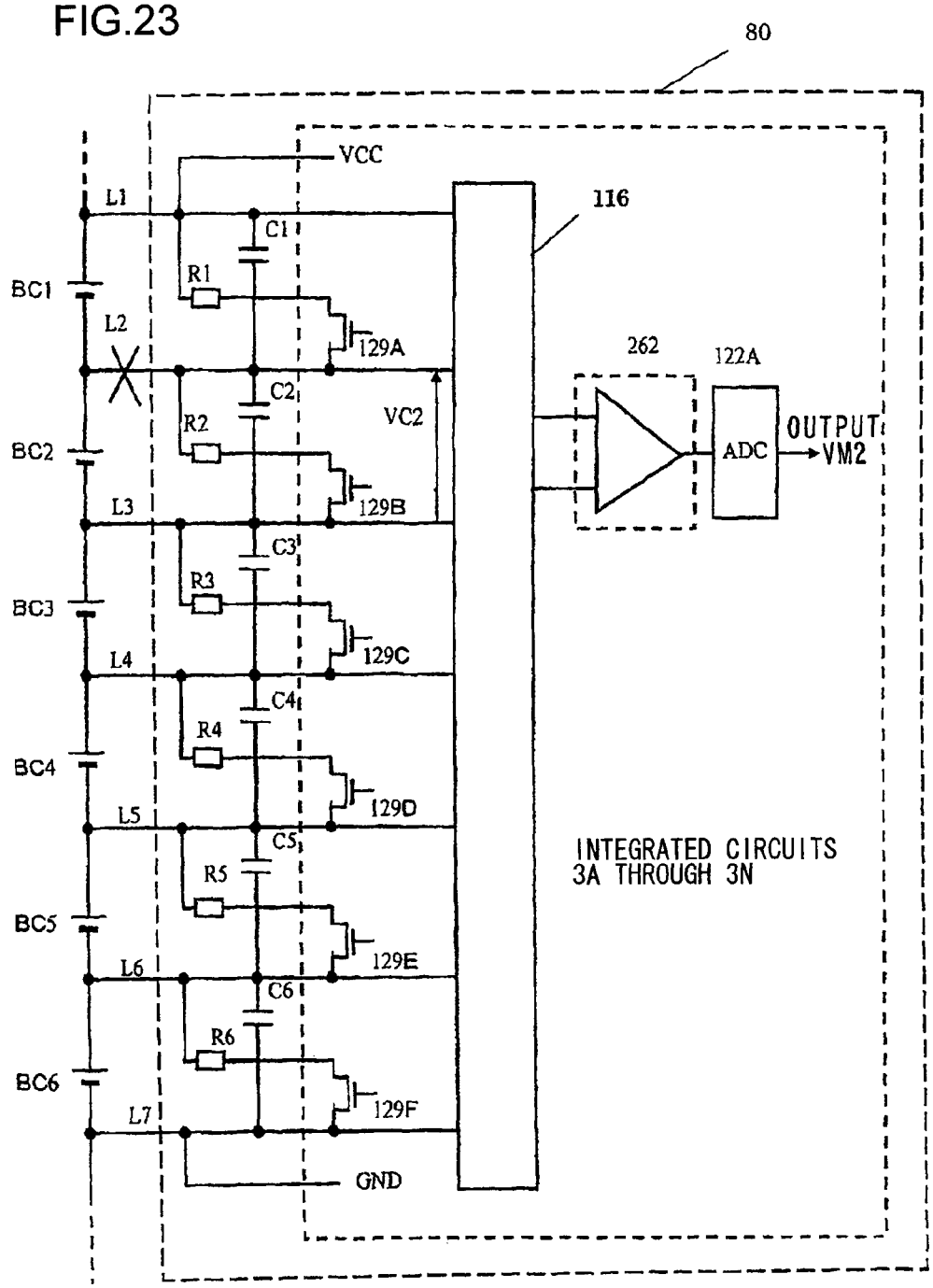
FIG. 23 is an explanatory figure showing an example of diagnosis f occurrence of an abnormality in a harness for detection of the terminal voltages of the battery cells BC that connects between their positive and negative electrodes and the cell controller.
Figure 24:
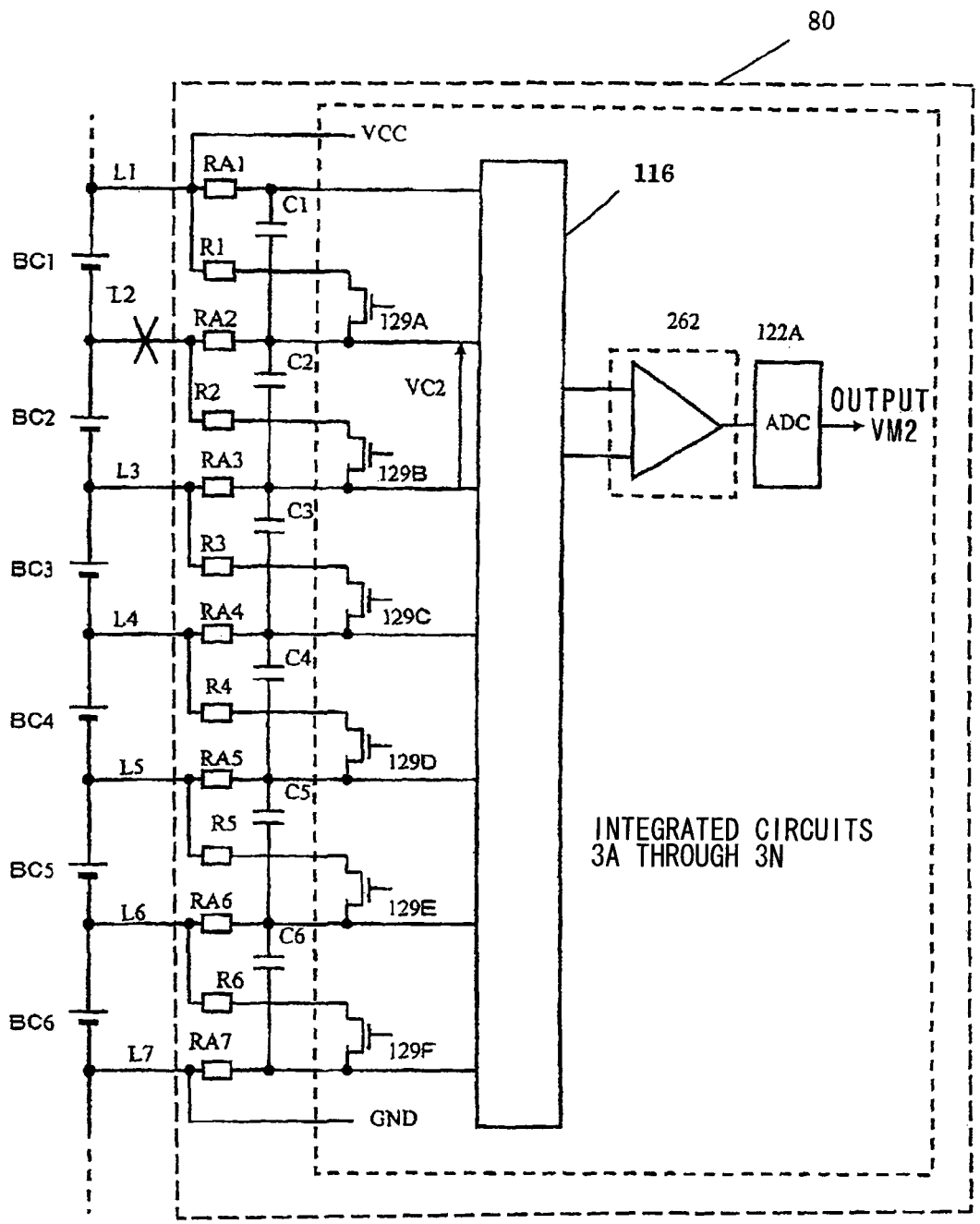
FIG. 24 is an explanatory figure showing another example of diagnosis of when an abnormality has occurred in a harness for detection of the terminal voltages of the battery cells BC that connects between their positive and negative electrodes and the cell controller.

The diagnosis of whether an abnormality has occurred in the harness for detection that connects together the positive electrode and the negative electrode of a battery cell BC and the cell controller 80 will now be explained on the basis of FIGS. 23 and 24. FIG. 23 shows a case in which a harness L2 within the harness for detection of FIGS. 1 and 2 has suffered a line disconnection. Moreover, FIG. 24 shows a case in which the same harness L2 as mentioned above within the harness for detection of the circuit of FIG. 19 has suffered a line disconnection. As causes of line disconnection, poor contacting of some connection portion between the battery cells and the harness for detection, or poor contacting in a connector that serves as a connection portion between the cell controller 80 and the harnesses, may be considered. Moreover, occasionally the harness for detection itself may suffer a line disconnection.

It is important to detect the possibility of any abnormality of the battery cells, and to ensure that no abnormality occurs. Supposing that an anomaly occurs in an electrical connection between the battery cells and the integrated circuits, then it will become impossible to detect any possibility of an abnormality with some battery cell. A detection method for detecting that an anomaly has occurred in an electrical connection between the battery cells and the integrated circuits of FIGS. 23 and 24 will now be explained using FIG. 25. It should be understood that the fundamental operation of FIGS. 23 and 24 are as already explained above. Moreover, while in this explanation it is supposed that a line disconnection has occurred in the harness L2 of the harness for detection, it is possible to make a diagnosis of abnormality in the same way in the case of disconnection of a line in any of the harnesses L1 through L7.

Figure 25:
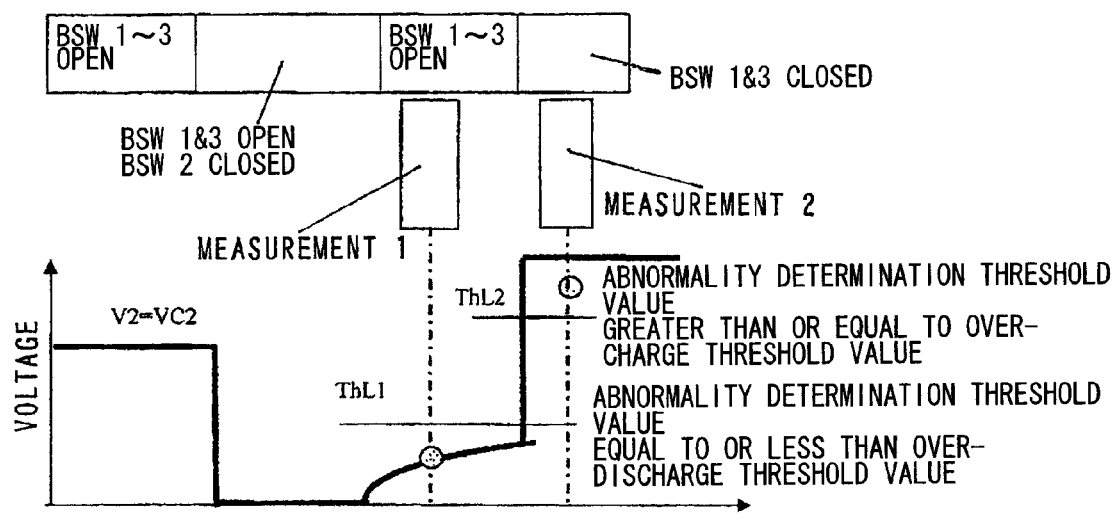
FIG. 25 is an explanatory figure showing a method for detecting that, in the structure shown in FIGS. 23 and 24, an abnormality has occurred in the electrical connections between the battery cells and the integrated circuits.

In FIG. 25, even if with the balancing switches 129A through 129C in the opened state a line disconnection has occurred in the harness L2 of the harness for detection, there is a possibility that the voltage VC2 inputted to the selection circuit 120 may still, in appearance, have a value close to the normal one for the terminal voltage of its battery cell, since there are various electrostatic capacitances in the system including that of the capacitor C2. Accordingly it is not possible to perform abnormality detection in this state.

Accordingly, next, a discharge current is flowed via the line L2 of the harness for detection that it is desired to diagnose, and the balancing switch 129B is closed. By closing the balancing switch 129B, any electric charge that is accumulated in the electrostatic capacitances present between the circuits of the harness L2 and the harness L3, including the capacitor C2, is discharged, and the input voltage VC2 of the selection circuit 120 decreases abruptly. Since current is supplied from the battery cell BC2 if there is no line disconnection, accordingly the input voltage VC2 of the input circuit decreases hardly at all.

In the measurement stage for the terminal voltage of the battery cell BC2 explained previously with reference to FIGS. 20 and 21, the terminal voltage of the battery cell BC2 is measured (measurement #1). As already explained above, during this measurement interval the balancing switch 129B is put into its opened state. Since electric charge has flowed and accumulated into the electrostatic capacity that is present between the circuits for the harness L2 and the harness L3, including the capacitor C2, accordingly, while the input voltage VC2 of the input circuit 116 is a little elevated, even so, the voltage VC2 that is measured by the measurement #1 described above is an extremely low voltage as compared with the normal voltage. The voltage VC2 that is measured is stored in BC2 of the present value storage circuit 274 shown in FIG. 5.

In the state described above, since, in the diagnosis of the battery cell BC2 in which measurement is performed continuously, the measured value that is read out from the present value storage circuit 274 is an abnormal value less than or equal to the over-discharge threshold value OD in the reference value storage circuit 278, accordingly it becomes possible to diagnose an abnormality with the digital comparator 270. The result of this abnormality diagnosis is set in the register MFflag of the flag storage circuit 284. Since, when a line disconnection is occurred, the voltage VC2 is lower than the over-discharge threshold value OD, accordingly a line disconnection threshold value is provided that is even lower than the over-discharge threshold value OD, and it becomes possible to determine line disconnection in a simple manner by comparing together, with the digital comparator 270, this line disconnection threshold value and the measurement value that is stored in the register CELL2 of the present value storage circuit 274. By taking the value of the register OC FFO of the reference value storage circuit 278 in FIG. 5 as the value of the line disconnection threshold value, it becomes possible always to detect line disconnection.

In FIG. 25, after the balancing switch 129B is put into its opened state, when the balancing switch 129A and the balancing switch 129C are closed, the voltage of the series connection of the battery cells BC1 and BC2 is applied to the capacitor C2, and thus the terminal voltage of the capacitor C2 becomes extremely high. Due to this, when directly after the measurement #1 the balancing switches 129A and 129C are closed and measurement is performed again for the battery cell BC2 (measurement #2), the voltage VC2 goes to an extremely high value that is very much above the over-charge threshold value. Due to this, it becomes possible to detect line disconnection in a simple manner.

As described above, the result of the measurement #2 described above is stored in the register CELL2 of the present value storage circuit 274 shown in FIG. 5. It would be acceptable to perform detection of line disconnection by this measurement value stored in the register CELL2 of the present value storage circuit 274 being compared by the digital comparator 270 with a threshold value for line disconnection detection, or it would also be acceptable to perform line disconnection diagnosis on the basis of processing by software in the battery controller 20.

FIG. 26 shows a method for performing diagnosis by communication commands 292 from the battery controller 20. As already explained above, it is supposed that a line disconnection has occurred in the harness L2 of the harness for detection. At a timing that is determined in advance, a communication command 292 for diagnosis of line disconnection is transmitted. This communication command 292 is a command that, along with specifying the integrated circuit that is the subject of diagnosis, also commands "open all of the balancing switches 129". In other words, the data 330 of this communication command 292 is "zero", and this means "open". Upon receipt of this command, the integrated circuit that is the subject thereof opens all its balancing switches.

Next, in order to discharge the battery cell to which the harness for detection that is the subject for diagnosis is connected at a timing that is determined in advance, a close command is sent to the balancing switch 129B, and the balancing switch 129B is closed. If the harness L2 has suffered a line disconnection, then the input signal VC2 to the multiplexer 120 becomes almost zero. Thereafter, in the measurement stage for the battery cell BC2 on the basis of the stage signal of the integrated circuit, before a command is outputted from the battery controller 20, the balancing switch 129B goes into the opened state, and measurement is performed for measuring the terminal voltage of the battery cell BC2. If there is a line disconnection in the harness L2, then the input signal VC2 to the multiplexer 120 is at an extremely low voltage, and this low voltage is stored in the register CELL2 of the present value storage circuit 274 of FIG. 5.

Since the integrated circuit performs measurement of the battery cell terminals individually on a short cycle, accordingly the balancing switch 129B goes into the opened state for a second time, and measurement is performed for measuring the terminal voltage of the battery cell BC2. If a line disconnection has occurred in the harness L2, then the result of this measurement is an extremely low value, and this value is stored in the register CELL2 of the present value storage circuit 274.

Upon receipt of a command from the battery controller 20 to input the result of diagnosis, the integrated circuit transmits the measurement result stored in the register CELL2 of the present value storage circuit 274. Upon receipt of this measurement result, it is possible for the battery controller 20 to perform detection of line disconnection on the basis of a measurement result that is even lower than the over-discharge state. In other words, the measurement result that has arrived from the integrated circuit is compared with a threshold value ThL1 shown in FIG. 26, and line disconnection is determined if the measurement result is less than this threshold value ThL1. Preparations are then started to interrupt the connection between the DC power supply in which this lithium cell is used and the inverter, and the relays RLP and RLN are opened after these preparations are completed.

To assure this further, the battery controller 20 transmits commands to close the balancing switch 129A and the balancing switch 129C, and to open the balancing switch 129B. Since, if there is some line disconnection, the input voltage VC2 to the selection circuit 120 becomes extremely high when both of the balancing switches next to the battery cell that is diagnosed are closed, accordingly a larger voltage than the over-charge threshold value comes to be measured. The result of this measurement is stored in the register CELL2 of the present value storage circuit 274.

Upon receipt of the measurement result input command from the battery controller 20, the integrated circuit transmits the measurement value to the battery controller 20. The battery controller 20 compares this measurement result that it has received with a threshold value ThL2 for line disconnection detection, that is higher than the over-charge threshold value, and determines that line disconnection has occurred if the measurement result is greater than that threshold value ThL2. While it is possible to perform accurate line disconnection detection either by comparing the result of the measurement #1 or the result of the measurement #2 with the threshold value ThL1, or by comparing the average of the result of the measurement #1 and the result of the measurement #2 with the threshold value ThL1, it is possible to perform detection of line disconnection with extremely high accuracy by further comparison with the threshold value ThL1. Moreover, it is possible to perform this diagnosis by employing the normal measurement operation for the terminal voltages of the battery cells, so that it is simple and easy. Furthermore it is not necessary to add on a large amount of special circuitry, and it is possible to perform diagnosis using the balancing switches 129 for controlling the states of charge SOC that are already provided, so this procedure is very simple.

Figure 28:
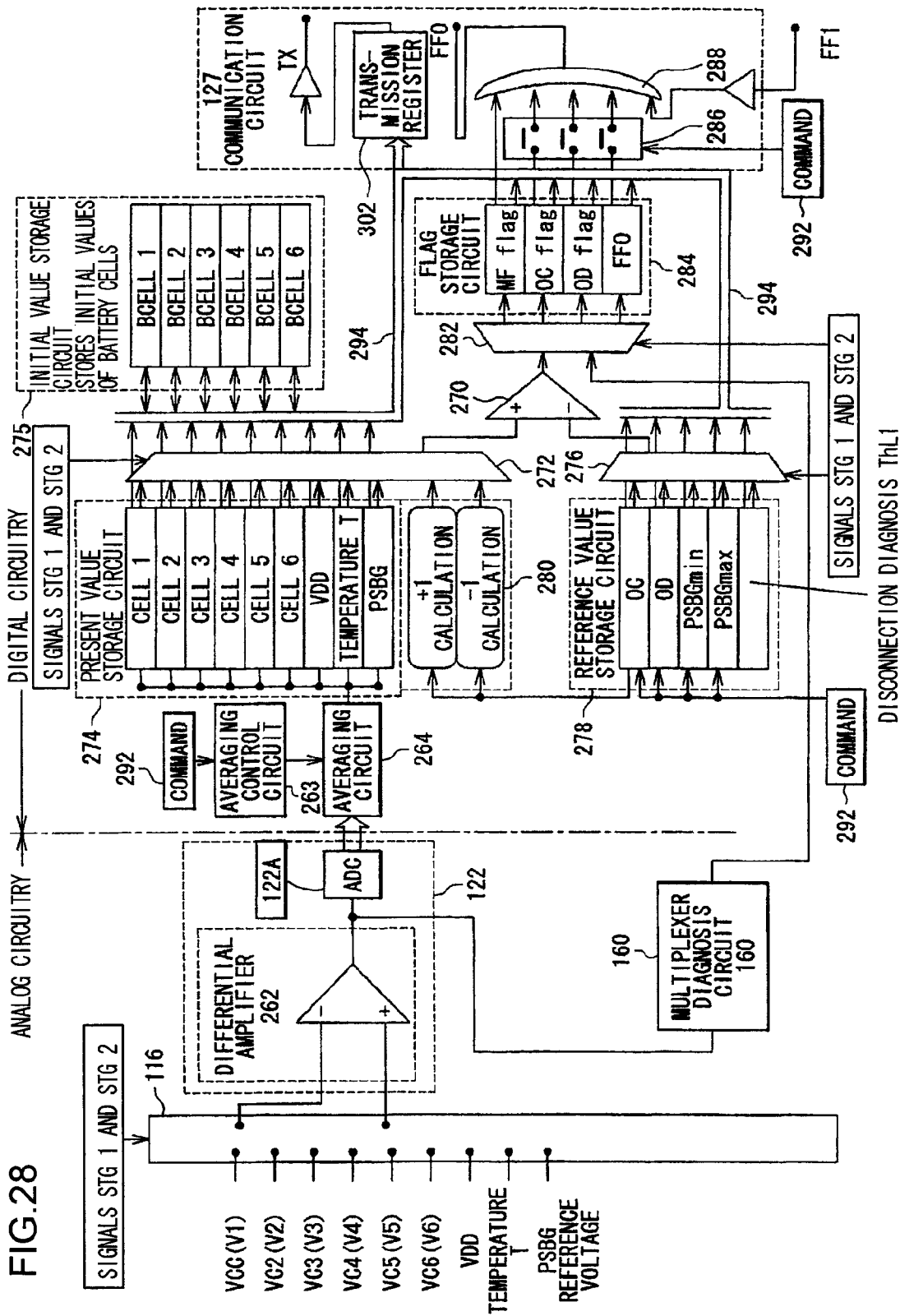
FIG. 28 is an explanatory figure for explanation of another embodiment of a circuit that is to be the subject of diagnosis and a circuit for such diagnosis.
Figure 29:
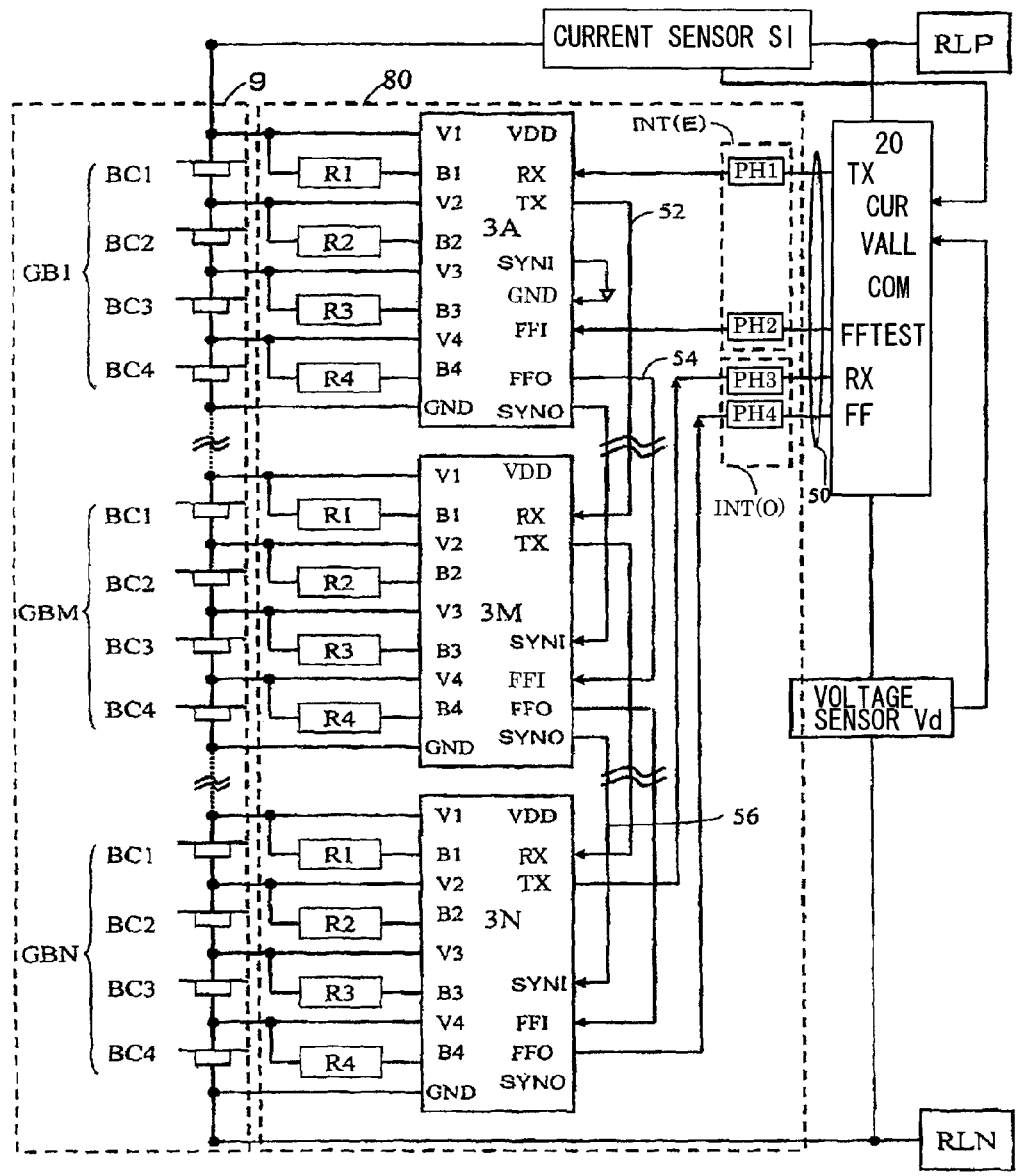
FIG. 29 is a figure showing the structure of another embodiment of the battery unit and the cell controller.

Next, a method of automatically diagnosing line disconnection within each of the integrated circuits will be explained using FIGS. 27 through 29. It is possible to implement diagnosis of line disconnection automatically by performing measurement of the unit voltages of the battery cells and line disconnection diagnosis on the basis of the stage signal as described with reference to FIG. 4. The schedule for measurement and diagnosis is shown in concrete terms in FIG. 27, and a concrete circuit therefore is shown in FIG. 29.

The upper section of FIG. 27 shows the measurement and line disconnection diagnosis of the integrated circuit 3A in the cycles of the m-th and (m+1)-th stage signals, the middle section shows the measurement and line disconnection diagnosis for the next integrated circuit 3B after the integrated circuit 3A, and the lower section shows the measurement and line disconnection diagnosis for the next integrated circuit 3C after the integrated circuit 3B. The integrated circuit 3B receives a synchronization signal from the integrated circuit 3A, and the integrated circuit 3C receives a synchronization signal from the integrated circuit 3B, and thereby the processing of the stages shown in FIG. 4 is started. It should be understood that, in FIG. 27, the legend "ON" means an interval in which control is performed to close one of the balancing switches 129, while "OFF" means an interval in which control is performed to open one of the balancing switches 129. Moreover "MEASUREMENT" means an interval in which control is performed for measurement of the terminal voltage of a battery cell and for line disconnection diagnosis. And the portions where none of "ON, "OFF", or "MEAS" is shown are intervals in which control of state of charge SOC is performed.

In the stage STGCa1 for the integrated circuit 3A, the balancing switch 129A is closed. If a line disconnection has taken place in the harness for detection, then, by closing the balancing switch 129A, the input voltage to the selection circuit 120 becomes extremely small, as explained in connection with FIG. 25. Due to this, the terminal voltage of the battery cell BC1 that is measured in the stage STGCV1 is detected by the analog/digital converter 122A of FIG. 28 as being an abnormally small value. Accordingly, the measurement value that is stored in the register CELL1 of the present value storage circuit 274 becomes an extremely small value. It should be understood that the balancing switch 129B is also controlled to be in the opened state, in order to enhance the measurement accuracy in the stage STGCV1.

In the line disconnection diagnosis that is performed subsequently to the measurement, the measurement value that is stored in the register CELL1 of the present value storage circuit 274 and the threshold value ThL1 for line disconnection diagnosis that is stored in the reference value storage circuit 278 are compared together by the digital comparator 270. If the measurement value that is stored in the register CELL1 is less than the threshold value ThL1 for line disconnection diagnosis, then an abnormality has occurred due to a line disconnection, and the diagnosis flag in the flag storage circuit 284 is set to "1". The fact that this setting of the diagnosis flag is immediately transmitted to the battery controller 20 is as already explained in connection with FIG. 6. It should be understood that the basic operation in FIG. 28 is as already explained in connection with FIG. 5 and so on.

If there is no line disconnection or the like, then the terminal voltage of the battery cell BC1 as measured in the stage STGCV1 exhibits a normal value, and the digital comparator 270 does not perform any detection of abnormality either. In the m-th cycle of FIG. 27, terminal voltage measurement and diagnosis are performed for only the odd numbered ones of the battery cells. After the battery cell BC1, terminal voltage measurement and line disconnection diagnosis are performed for the battery cell BC3. Thus, in the stage STGCV2, the balancing switch 129C of the battery cell BC3 is temporarily closed, and in the next stage STGCV3 the balancing switch 129C is opened and measurement of the terminal voltage of the battery cell BC3 is performed. Furthermore, line disconnection diagnosis is performed by the digital comparator 270 of FIG. 28 in a similar manner to that explained above. In order to enhance the terminal voltage detection accuracy and the diagnosis accuracy for the battery cell BC3 in this stage STGCV3, both of the two balancing switches 129B and 129D next to the balancing switch 129C are kept in the opened state, as shown in FIG. 27.

In a similar manner, in the stage STGCV5, measurement of the terminal voltage of the battery cell BC3 and diagnosis are performed, and the balancing switches 129D and 129F are held in their open states. The measurement and diagnosis described above are thus performed for the odd numbered ones of the battery cells, i.e. for the battery cells BC1, BC3, and BC5. In a similar manner, measurement and diagnosis for the even numbered ones of the battery cells, i.e. for the battery cells BC2, BC4, and BC6, is performed in the next (m+1)-th cycle. In this manner, in FIG. 27, it is arranged to perform measurement and diagnosis for the odd numbered ones of the battery cells and for the even numbered ones of the battery cells in different stage cycles.

In the measurement and diagnosis related to the battery cell BC1 in the stage STGCV1 of the integrated circuit 3B, it is necessary to keep the balancing switch 129F of the integrated circuit 3A one earlier in its opened state. For this, a synchronization signal is sent to the integrated circuit 3B, and the integrated circuit 3B generates stages that are synchronized with the synchronization signal of the integrated circuit 3A. In this embodiment, generation of the first stage signal STGCa1 is started upon reception of the synchronization signal from the integrated circuit 3A.

In this manner, with adjacent integrated circuits, at the predetermined cycle of one of the integrated circuits, it is arranged to send a synchronization signal to the other integrated circuit, and it is arranged for that other integrated circuit to start its predetermined stage signal upon receipt of this synchronization signal. Due to this, in the measurement interval for the battery cell on the other side of the one integrated circuit, in other words in the measurement interval of the battery cell BC6 of the integrated circuit 3A, the balancing switch 129A of the battery cell BC1 of the other integrated circuit 3B is kept open. Moreover, in the measurement interval of the battery cell BC1 of the other integrated circuit 3B, the balancing switch 129F of the battery cell BC6 on the other side of the one integrated circuit 3A is kept open.

In FIG. 27, the same as described above is the case for the integrated circuit 3B and the integrated circuit 3C as well: at a specified stage of the integrated circuit 3B, a synchronization signal is sent from this integrated circuit 3B to the integrated circuit 3C. By operating in this manner, the balancing switches 129 of the two adjacent battery cells that are connected in series with the battery cell that is being measured are kept open, and thereby it is possible to carry out accurate measurement and accurate diagnosis.

While, in FIGS. 27 and 29, the synchronization signals were transmitted from the integrated circuits whose potentials were higher to the integrated circuits whose potentials were lower, this is only one example; there would be no problem even if it were to be arranged for the synchronization signals to be transmitted from the integrated circuits whose potentials were lower to the integrated circuits whose potentials were higher. The important thing is that the stage signals in adjacent ones of the integrated circuits are generated while being mutually synchronized.

Shortening the Monitoring Cycle

By performing diagnosis of the type described above, the state of the battery can be ascertained more accurately, including the states of the integrated circuits that gather the cell voltages. While the battery controller 20 performs gathering of cell voltages from the cell controller 80 and diagnosis on a predetermined measurement and diagnosis cycle (hereinafter termed the "monitoring cycle"), it is necessary to make this monitoring cycle shorter, in order quickly to cope on the battery side with changes of the running state of the vehicle. In the embodiment explained below, efforts are made to shorten the monitoring cycle by reducing the amount of communication between the battery controller 20 and the cell controller 80 when performing line disconnection diagnosis and so on of the sensing lines for measuring the cell voltages (i.e. of the harness described above).

First, before explanation of the diagnosis performed by the battery controller 20, the overall operation of a monitor system included in the battery controller 20 and in the cell controller 80 will be explained with reference to the time chart of FIG. 32.

Figure 32:
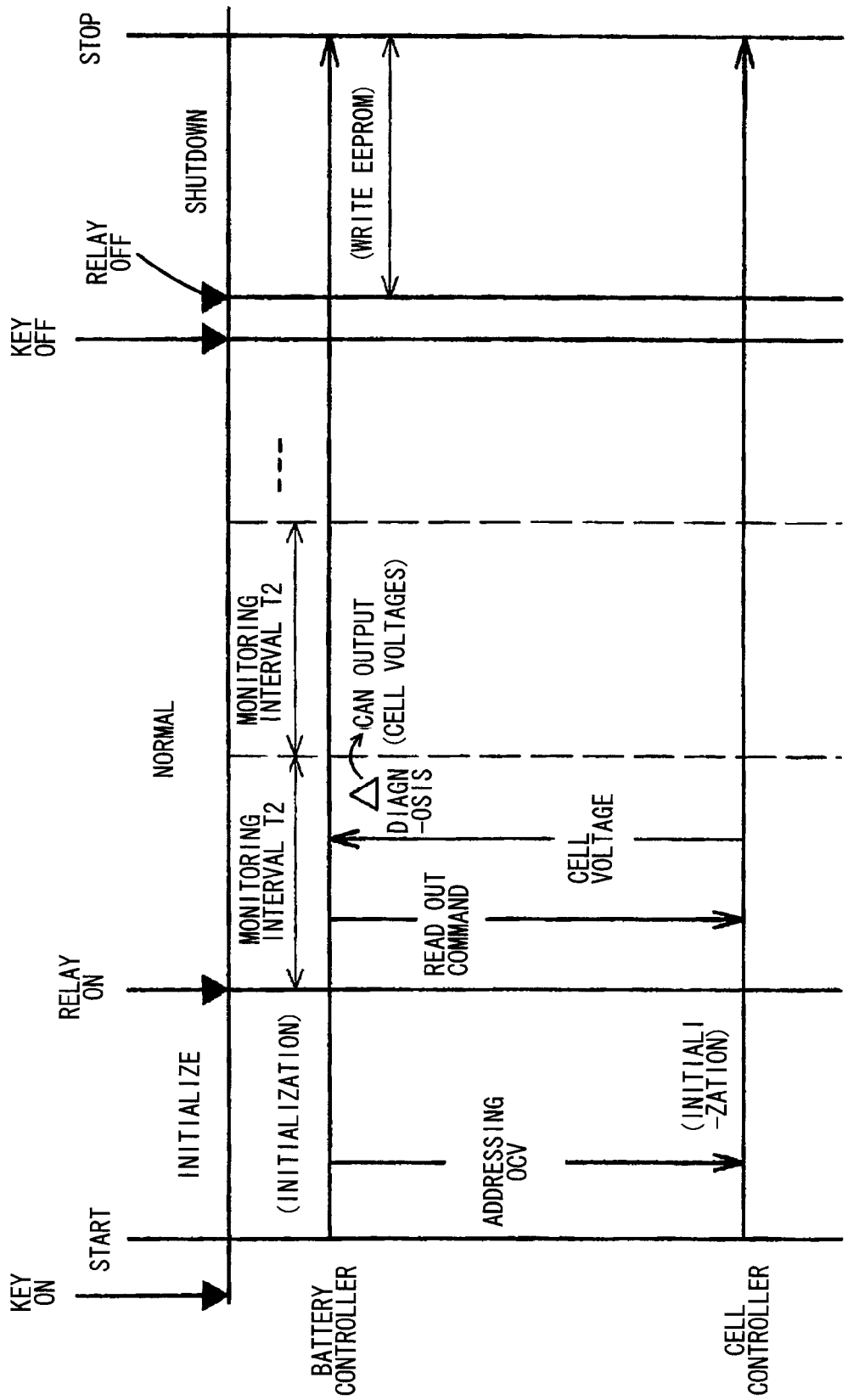
FIG. 32 is a time chart for explanation of the operation from start until shutdown.

FIG. 32 is a figure showing processing flow from when the monitor system is started up by the vehicle being started (i.e. by its key being turned ON) to when the monitor system is shut down by the vehicle being stopped (i.e. by its key being turned OFF). This figure schematically shows operations that are related to the diagnosis explained below, in the operation explained with reference to the flow chart of FIG. 14 and described above. The overall operation may be divided into: initialization operation from starting of the monitor system until the relays RLP and RLN are turned ON (refer to FIG. 13); normal operation from when the relays RLP and RLN are turned ON until the battery controller 20 receives a key OFF signal, and shutdown operation from when the key OFF signal is received until the monitor system stops.

In the initialization operation, the battery controller 20 performs a ROM/RAM check and measurement of the current sensor offset, transmits a command to the cell controller 20, and then performs starting of the cell controller 20, addressing, OCV (open circuit voltage) measurement, and so on.

In the normal operation, the battery controller 20 performs monitoring of the cell states in a predetermined monitoring interval T2, and the result of this monitoring is transmitted to a higher ranking controller (i.e. to the higher ranking controller shown in FIG. 13 or to the inverter device 220). The monitor operation in the interval T2 (measurement of cell voltages and diagnosis) is executed repeatedly during the normal operation interval. In this monitoring interval T2, the battery controller 20 transmits to the cell controller 80 commands requesting the cell voltages and the states of the balancing switches, as will be described hereinafter. In response to these commands, the cell controller 80 returns to the battery controller 20 data related to the cell voltages and to the states of the balancing switches. On the basis of these cell voltages and these states of the balancing switches, the battery controller 20 performs diagnosis as will be described hereinafter, and transmits the results of this diagnosis and the voltages of all the cells to the higher ranking controller in the next monitoring interval T2.

And in the shutdown operation, when the relays RLP and RLN are turned OFF by commands from the inverter device 220 after receipt of a key OFF signal, the battery controller 20 writes the required data into an EEPROM provided in the battery controller 20, and then stops the monitor system.

Figure 33:
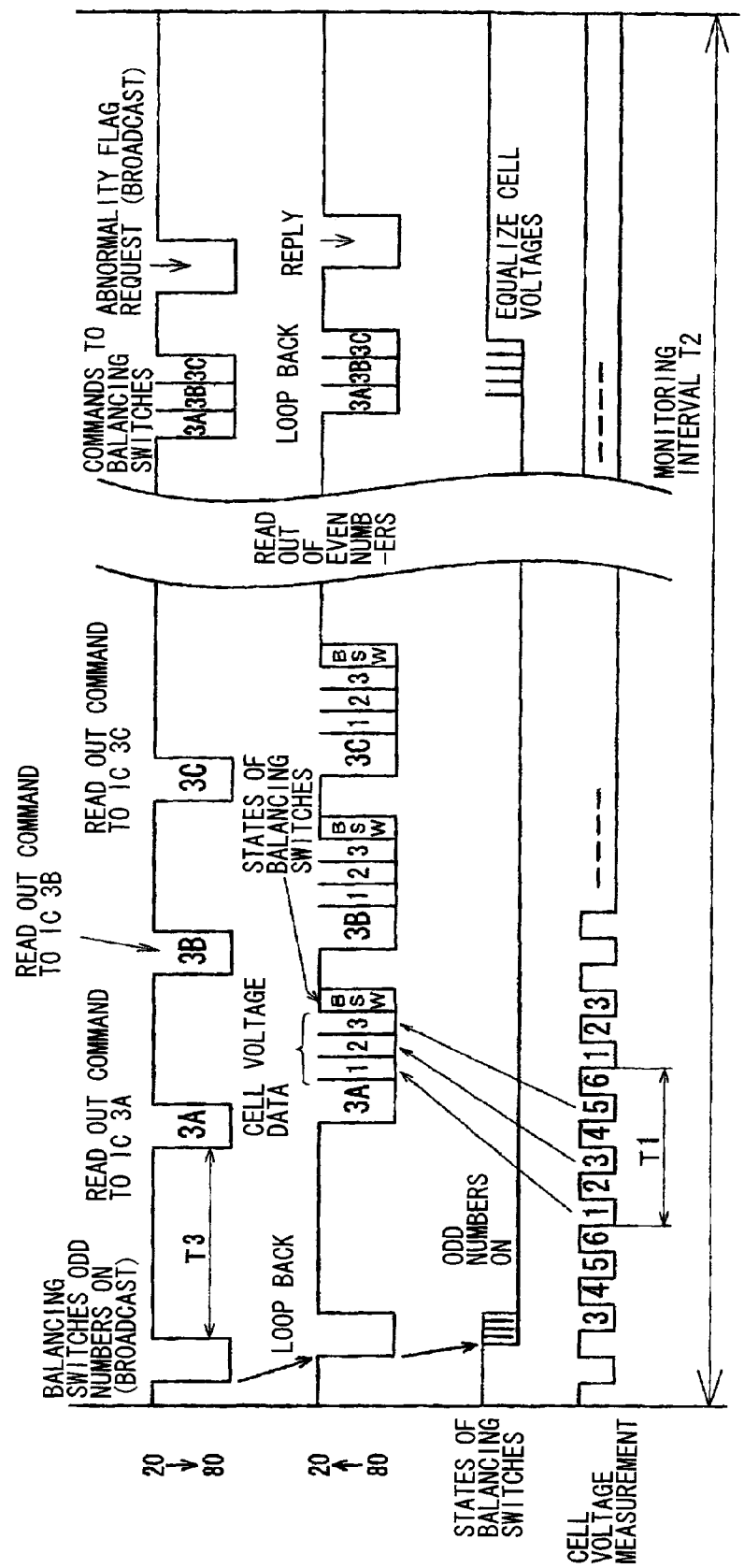
FIG. 33 is a time chart for explanation of the operation during a monitoring interval T2.

FIG. 33 is a figure for explanation of the operation in the monitoring interval T2, and is a time chart showing the relationship between transmission of commands from the battery controller 20 to the cell controller 80, and return of data from the cell controller 80 to the battery controller 20. Here, principally the data gathering related to diagnosis is shown. In the following, the balancing switches are turned ON for performing equalization of the battery cells, the cell voltages of these battery cells are measured, and diagnostics that will be described hereinafter are performed on the basis of the cell voltages that have been measured and the states of the battery switches. It should be understood that, in the following explanation, reference will be made to the circuit diagram of FIG. 19. Moreover, in order to simplify the explanation, it will be supposed that the number N of integrated circuits is 3.

First, the battery controller 120 transmits to the cell controller 80 a broadcast command that instructs the odd numbered ones of the balancing switches 129A, 129C, and 129E to turn ON. By a broadcast command is meant a command for all of the integrated circuits 3A through 3C to perform the same processing. The integrated circuits 3A through 3C are linked to the cell controller 80 in a daisy chain, and so the broadcast command is received and transferred in order by the integrated circuits 3A through 3C, and is looped back from the integrated circuit 3C to the battery controller 20. And, upon receipt of this broadcast command, each of the integrated circuits 3A through 3C turns ON its odd numbered balancing switches 129A, 129C, and 129E.

FIG. 34(*a*) is a figure for explanation of one example of the data format of the broadcast command. The command is specified by 8 bits, of which the first through the sixth bit are ON/OFF settings for the balancing switches 129A through 129F, while the seventh and the eighth bit set a combination of cell voltages to be read out next. For example, if the ON setting is 1 and the OFF setting is 0, and if the setting to return the voltages of the odd numbered cells is "01" and the setting to return the voltages of the even numbered cells is "10", then a command to turn the odd numbered ones of the balancing switches ON is expressed as "10101001", while a broadcast command to turn the even numbered ones of the balancing switches ON is expressed as "01010110", Next, after having waited for just a predetermined time period T3 from the transmission of the broadcast command, the battery controller 20 transmits a command for gathering of the cell voltages to the highest ranking integrated circuit 3A of the cell controller 80. It should be understood that this predetermined time period T3 is the time period from when each of the integrated circuits receives the broadcast command and starts measurement of its cell voltages, until subsequently the measurement of all of the cell voltages has been completed and a state is reached in which it is possible to gather the cell voltage data.

Since, in these embodiments, the plurality of integrated circuits 3A through 3C are linked serially in a daisy chain, accordingly, when a command is to be outputted to these integrated circuits, communication can only be performed with a single one of the integrated circuits. Due to this, when three integrated circuits 3A through 3C are linked together, as shown in FIG. 33, it is necessary to transmit commands individually to each of the integrated circuits for reading out its cell voltages.

Figure 35:
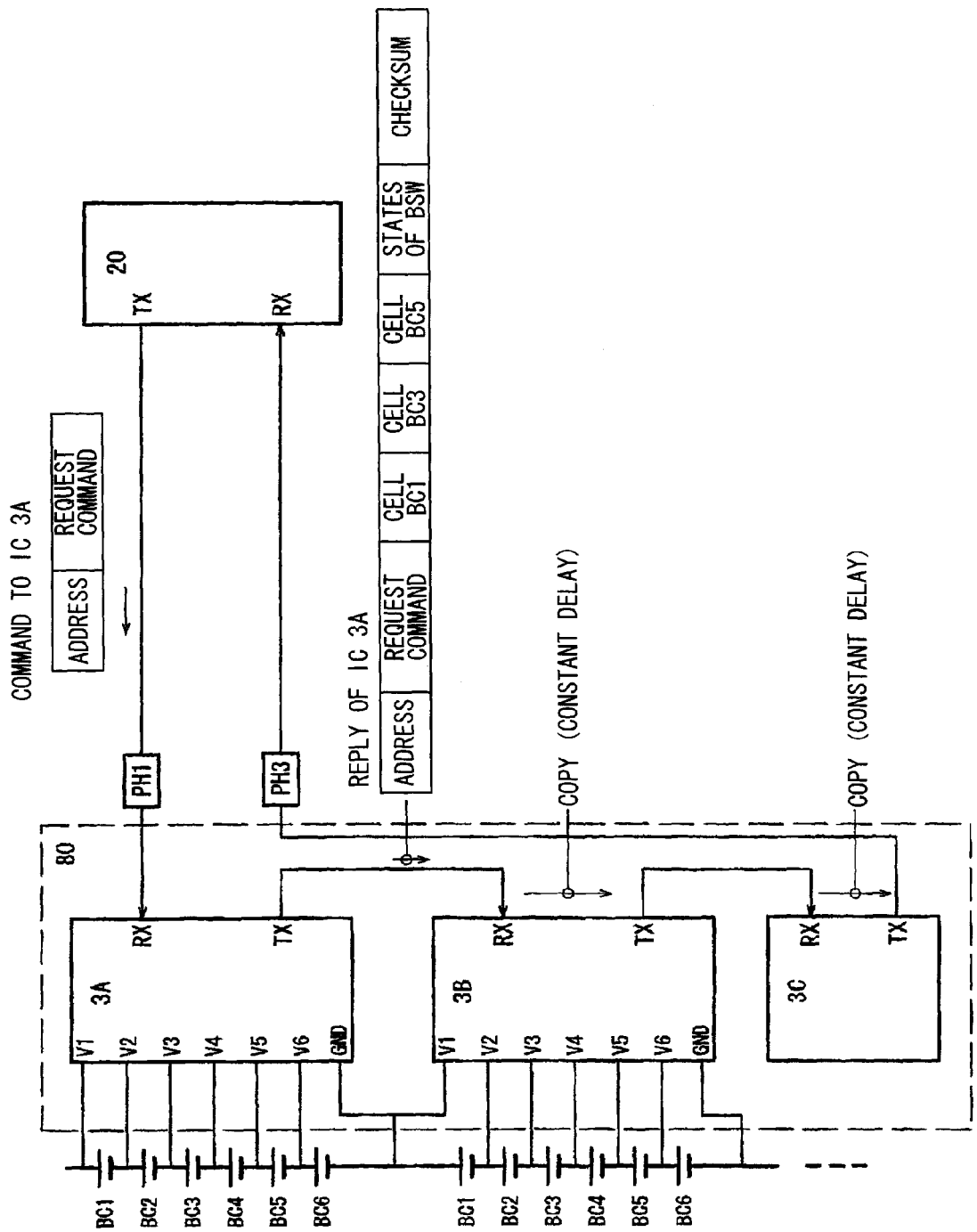
FIG. 35 is a schematic figure showing the way in which a reply to a request command is returned on the side of the cell controller 80.

First, the battery controller 20 transmits a command to the integrated circuit 3A of the cell controller 80, instructing it to return its cell voltages. FIG. 35 is a figure schematically showing the way in which a reply to this request command is returned on the side of the cell controller 80. When this command to the integrated circuit 3A is inputted to the reception terminal RX of the integrated circuit 3A, the integrated circuit 3A recognizes from the address that this command is a command addressed to itself. Thus, since the integrated circuit 3A knows in advance that it should transmit the odd numbered ones of the cell voltages according to the above described broadcast command, accordingly, after this command string that requests the cell voltages, it appends the cell voltage data for its odd numbered battery cells BC1, BC3, and BC5, the states of its balancing switches, and a checksum, and transmits the result to the next integrated circuit 3B from its transmission terminal TX. It should be understood that the states of the balancing switches will be described hereinafter.

As previously described, after starting, each of the integrated circuits 3A through 3C repeatedly performs measurement of its cell voltages on a predetermined cycle. The cell voltages that have been measured are stored in the corresponding registers CELL1 through CELL6 of the present value storage circuit 274 shown in FIG. 5. The cell voltages in the registers CELL1 through CELL6 are rewritten each time the cell voltage measurement is performed at its predetermined period T1. By doing this, it is arranged for the most recent cell voltages always to be stored in the registers CELL1 through CELL6. When the integrated circuit 3A receives the command described above to read out (i.e. to gather) the cell voltages, the integrated circuit 3A appends the cell voltages stored in the registers CELL1, CELL3, and CELL5 after the end of the command string (refer to FIG. 33).

It should be understood that, in normal cell voltage measurement, in order to avoid errors due to voltage drop in the discharge current limitation resistors, and in order to enhance the accuracy of measurement, the balancing switches are forcibly turned to OFF during the cell voltage measurement interval. However, as described above, since cell voltage measurement is carried out at high speed, as shown in FIG. 26, if disconnection of some line has taken place, then an almost zero voltage is maintained, and this does not exceed the decision threshold value ThL1. Moreover, it would also be acceptable to provide a diagnosis mode to the integrated circuits, and to ensure that the OFF function is forcibly cancelled, so that it is reliably kept less than or equal to the diagnosis threshold value ThL1. In other words, the optimum design should be provided for the filter time constants provided to the terminals for measurement of the cell voltages, and for the sampling time periods of the measurement circuits.

As shown in FIG. 35, upon receipt of the reply outputted from the integrated circuit 3A, the integrated circuit 3B transmits a copy thereof without alteration from its transmission terminal TX, since the address therein is different from its own address. In a similar manner to the case of the integrated circuit 3B, the integrated circuit 3C as well transmits a copy of this reply from its transmission terminal TX. And this reply from the integrated circuit 3A that has been transmitted from the lowest ranking integrated circuit 3C is inputted to the reception terminal TX of the battery controller 20.

Figure 36:
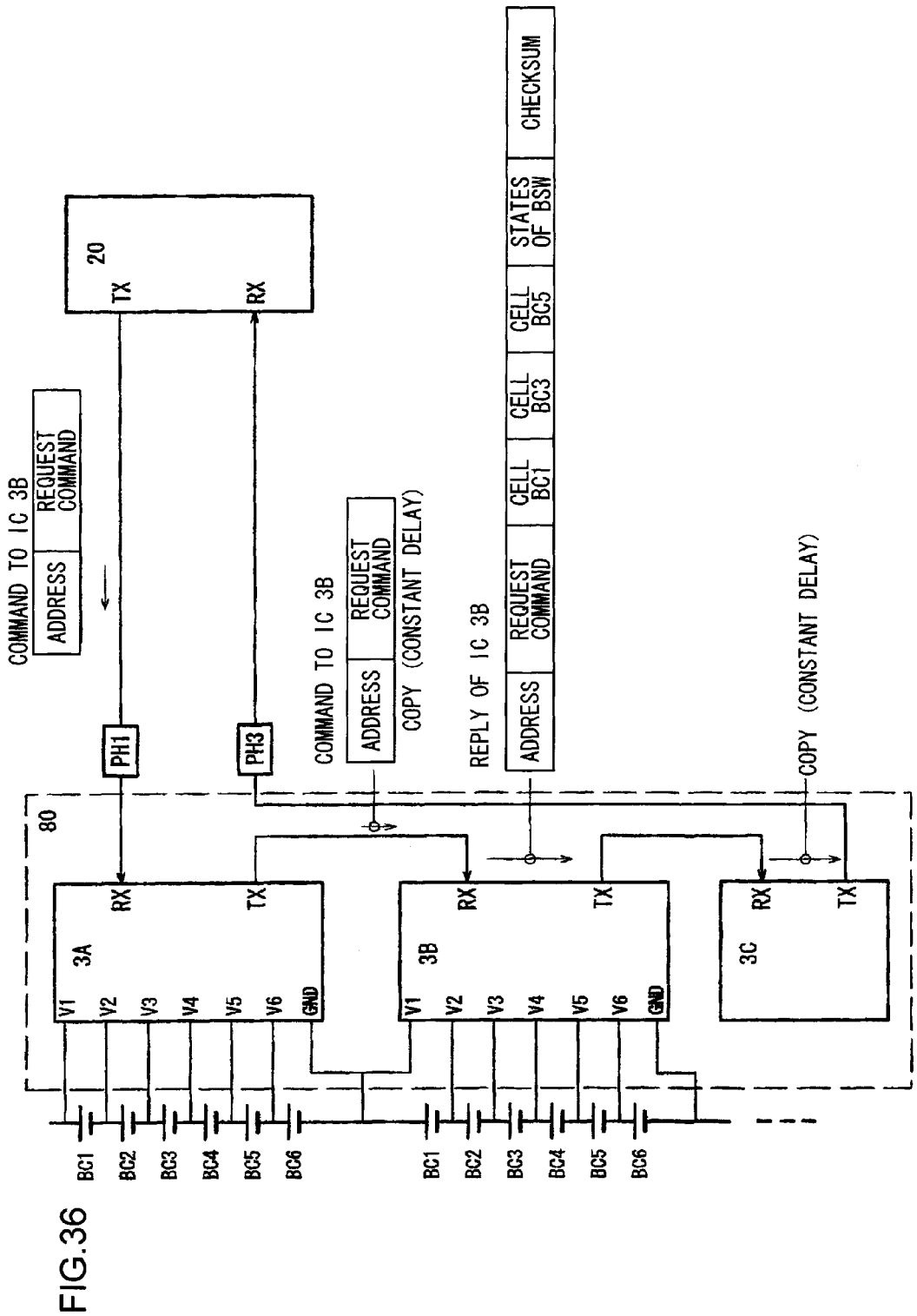
FIG. 36 is a schematic figure showing the way in which a reply to a cell voltage request command to the integrated circuit 3B is returned on the side of the cell controller 80.

As shown in FIG. 36, upon receipt of this reply from the integrated circuit 3A, the battery controller 20 transmits a command to the highest ranking integrated circuit 3A, telling the next integrated circuit 3B to return its cell voltages. Upon receipt of this command for the integrated circuit 3B, when the integrated circuit 3A recognizes that this is not a command for itself, it copies the command and sends the copy to the integrated circuit 3B. And, upon receipt of this command for the integrated circuit 3B, the integrated circuit 3B appends after this command string the cell voltage data for its odd numbered battery cells BC1, BC3, and BC5, the states of its balancing switches, and a checksum, and transmits the result to the next integrated circuit 3C from its transmission terminal TX. And, when the integrated circuit 3C has received this reply from the integrated circuit 3B, since the address is not that of itself, accordingly it copies the command just as it is, and sends the copy from its transmission terminal TX to the battery controller 20.

Although this feature is omitted from FIG. 33, it should be understood that, after the odd numbered balancing switches 129A, 129C, and 129E have been turned ON and the odd numbered ones of the cell voltages have been gathered, subsequently similar processing is performed to turn the even numbered balancing switches 129B, 129D, and 129F ON and to gather the even numbered ones of the cell voltages.

And, when the cell voltages when the odd numbered ones of the balancing switches are turned ON and the cell voltages when the even numbered ones of the balancing switches are turned ON have been read out, the battery controller 20 transmits to the cell controller 80 commands to turn the balancing switches ON and OFF appropriately in order to equalize the cell voltages. These commands are received and transferred in order through the integrated circuit 3A, the integrated circuit 3B, and the integrated circuit 3C, and are looped back to the battery controller 20. And upon receipt of these commands, each of the integrated circuits 3A through 3C starts equalization of its cell voltages by turning its balancing switches ON and OFF, according to the particular command directed to itself.

Next, as will be described hereinafter, the battery controller 20 transmits to the cell controller 80 a broadcast command that requests return of the abnormality flag. Upon receipt of this broadcast command, the cell controller 80 transmits its abnormality flag to the battery controller 20. When the battery controller 20 has received the data for the cell voltages when the balancing switches were ON, the states of the balancing switches, and the abnormality flag, it performs diagnosis of the integrated circuits on the basis of this data as will be described hereinafter. If as the result of this diagnosis it is determined that no abnormality is present in the cell voltage measurements, then the voltages of all the cells are gathered, and the diagnosis result and all the cell voltages are transmitted to the inverter device by CAN. This gathering of all the cell voltages is also performed within the monitoring interval T2 shown in FIG. 33.

As described above, in this embodiment, it is arranged, when the odd numbered ones of the balancing switches are turned ON and measured cell voltages are gathered, only to gather the odd numbered ones of the cell voltages; and it is arranged, when the even numbered ones of the balancing switches are turned ON and measured cell voltages are gathered, only to gather the even numbered ones of the cell voltages. The reason why the cell voltages with the balancing switches in their OFF states are unnecessary for the diagnosis is that, as described above, when a line is disconnected, its measurement terminal goes to floating, and the fact that its voltage may become less than or equal to the decision threshold value ThL1 is unreliable, so that diagnosis cannot be performed correctly. Moreover, conversely, in order to diagnose line disconnection for the N-th cell, it is also possible to put the (N−1)-th and the (N+1)-th balancing switches into their ON states, to put the N-th balancing switch into its OFF state, to measure the voltage of the N-th cell, and to make a decision as to whether or not this voltage is greater than or equal to the decision threshold value ThL2. In this case, it is possible to arrive at the decision by putting all of the odd numbered ones of the balancing switches into their ON states, and by reading out only the even numbered ones of the cell voltages. There is no change in the design of the integrated circuits, and, as the command to be transmitted from the battery controller 20, it will be sufficient to broadcast transmit a cell voltage reply setting of "10" for the even numbered ones of the cell voltages and also "10101010" in order to turn the odd numbered ones of the balancing switches to ON.

Generally, when gathering the cell voltages, it is normal to read out all of the cell voltage data stored in all of the registers of the integrated circuit. However when, as described above, the odd numbered ones or the even numbered ones of the balancing switches are turned ON and the cell voltages with the balancing switches in their ON states are read, and disconnection of any line is determined for which the cell voltage is less than or equal to the decision threshold value ThL1, if it is arranged for even cell voltages for which diagnosis is not required because their balancing switches are in the OFF state (in other words, the even numbered ones or the odd numbered ones of the cell voltages) also to be returned to the battery controller 20, then the amount of reply communication will increase as shown in FIG. 34(*b*), and this is undesirable. As a result, there are the inconveniences that the time period occupied by the communication path becomes long, and that the monitoring interval T2 becomes long.

Thus, in this embodiment, when gathering the odd numbered ones or the even numbered ones of the cell voltage data as described above, it is arranged to omit unnecessary cell voltage data, in other words to omit respectively the even numbered ones or the odd numbered ones of the cell voltage data for which the balancing switches are turned OFF, and this procedure aims at reducing the amount of communication and at shortening the monitoring interval T2. While the method of simply increasing the speed of communication would be a possible method of performing shortening of the monitoring interval T2, to do so is not desirable in view of unnecessary increase of the current consumed from the battery for driving the vehicle, and moreover the size of the chips for the integrated circuits also would become larger. Furthermore, if the speed of communication is increased, along with the shortcoming that the resistance to noise drops, doing so also invites increase of the cost of the insulating elements PH1 and PH3 shown in FIG. 35.

It should be understood that while, in the example described above, whether the cells to be read out are the odd numbered cells or the even numbered cells is specified by a broadcast command, it would also be acceptable to arrange to specify the odd numbered cells or the even numbered cells by commands to the integrated circuits.

The States of the Balancing Switches

Next, the above described states of the balancing switches will be explained. As explained in connection with FIG. 2, the balancing switches 129A through 129F are built from MOSFETs, and the balancing switches 129A through 129F go ON and OFF according to control of their gate voltages by the discharge control circuit 132. The voltages Vds between the sources and the drains of the balancing switches 129A through 129F (hereinafter termed the "drain voltages") are detected by the operational state detection circuits 128A through 128D, and are outputted to the potential conversion circuit 130.

The operational state detection circuits 128A through 128D include comparators that compare the drain voltages Vds of the balancing switches 129A through 129F with reference voltages VdsH and VdsL. The states of the balancing switches are detected by the drain voltages Vds being compared with the reference voltages VdsH and VdsL by these comparators. This comparison of the drain voltages Vds of the balancing switches 129A through 129F with the reference voltages VdsH and VdsL is performed in the RES interval of the pre-processing stage shown in FIG. 4.

While only the cell voltage measurement timing is described in the cell voltage measurement timing chart shown in FIG. 33, there is a pre-processing stage before the cell voltage measurement for the battery cell BC1 shown by the reference symbol 1, and in this interval detection of the drain voltages of the balancing switches is performed, in other words comparison thereof with the reference voltages VdsH and VdsL. Due to this, each time one cycle T1 of cell voltage measurement elapses, comparison results related to the odd numbered balancing switches 129A, 129C, and 129E are acquired. Moreover, in this pre-processing stage, an abnormality flag is also set on the basis of the results of comparison of the drain voltages.

FIG. 37 is a figure showing a decision table when comparing the drain voltages Vds with the reference voltages VdsH and VdsL. The reference voltages VdsH and VdsL are a lower limit value and an upper limit value for the range of drain voltage in the normal operation range, including the operation points of the MOSFETs. For example, if the result of comparing a drain voltage Vds is that "Vds≤VdsH", then it is determined that the state of the balancing switch (i.e. the BSW state) is 1 (ON), while, if this result is "Vds>VdsH", then it is determined that the state of the balancing switch (i.e. the BSW state) is 0 (OFF). In other words, the states of the balancing switches are determined by comparing their drain voltages Vds with the reference voltage VdsH.

Furthermore, with regard to balancing switch abnormality determination (i.e. BSW decision), in the case of the first row of the decision table, with the command being H (high) the state of the balancing switch is ON (1), but, since the result of comparing Vds is, for example, that "Vds<VdsL", i.e. that Vds is too low, accordingly it may be considered that there is a short circuit fault of the balancing switch or an open fault of its resistor or the like, so that a decision of NG (abnormality) is made and the abnormality flag is set. In the case of the second row of the table, with the command being high the state of the balancing switch is ON, and, since the result of comparing Vds is that "VdsL≤Vds≤VdsH", i.e. that Vds is in the normal range, accordingly a decision of normal (OK) is made. And, in the case of the third row of the table, while the command is high, the state of the balancing switch is OFF, and moreover the result of comparison is that "Vds>VdsH", so that it may be considered that the balancing switch is suffering from an open fault, and accordingly a decision of NG (abnormality) is made and the abnormality flag is set.

Moreover, in the case of the fourth row of the table, while the command is low (L), the state of the balancing switch is ON, and moreover the result of comparison is that "Vds<VdsH", so that it may be considered that the balancing switch is suffering from a short circuit fault or its resistor is suffering from an open fault or the like, and accordingly a decision of NG (abnormality) is made and the abnormality flag is set. In the case of the fifth row of the table, since with the command being low the state of the balancing switch is ON, accordingly a decision of abnormality is made and the abnormality flag is set. And, in the case of the sixth row of the table, since with the command being low the state of the balancing switch is OFF, accordingly a decision of normality is made.

A decision of the type described above is performed on the basis of the decision table for the drain voltage Vds of each of the balancing switches 129A through 129F, and the results of these decisions are stored in a register. And the values in this register are updated each time one cycle T1 of the cell voltage measurement shown in FIG. 33 (also including the diagnosis described above) is repeated. When each of the integrated circuits 3A through 3C receives a cell voltage read out command from the battery controller 20, as shown in FIGS. 33, 35, and 36, a reply is made in which the states of the balancing switches are attached after the cell voltage data. For example at the timing that the cell voltages are read out after the command to turn the odd numbered ones of the balancing switches ON, the data "101010" may be stored in the register as the states of the balancing switches. This balancing switch state of "101010" shows that all of the balancing switches are operating as commanded.

In relation to the abnormality flag, it should be understood that the various decision results are ORed together, and a single abnormality flag related to this one integrated circuit is transmitted to the battery controller 20 as a reply to the abnormality flag request of FIG. 33.

Diagnostic Operation by the Battery Controller 20

Figure 38:
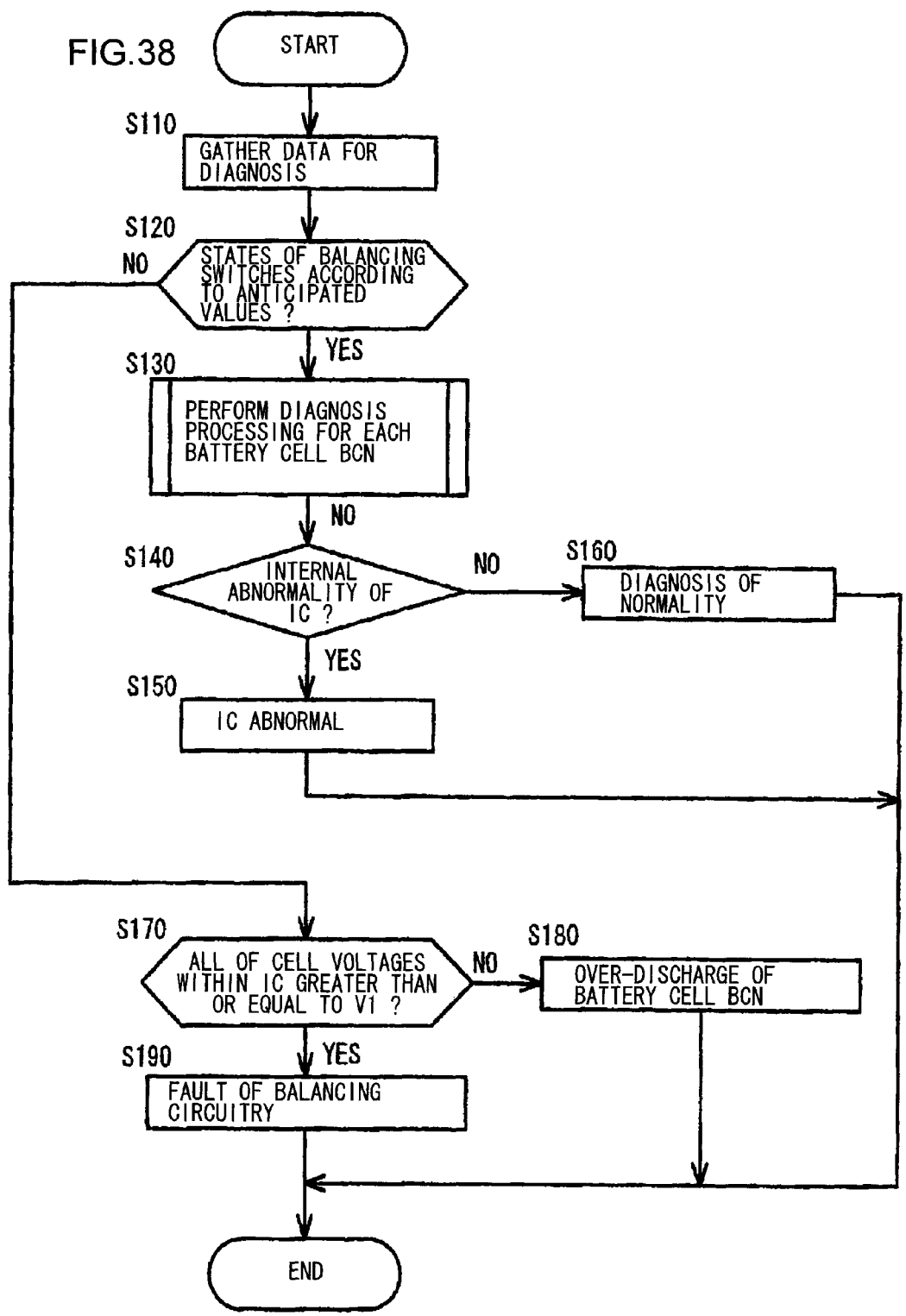
FIG. 38 is a flow chart showing diagnosis processing executed by the battery controller 20.

Next, the diagnosis processing executed by the battery controller 20 will be explained with reference to the flow charts of FIGS. 38 and 39. It should be understood that FIG. 38 is a figure that shows the diagnosis processing related to one of the integrated circuits, and that it is possible to diagnose whether or not all of the cell voltages have been correctly read out by executing the processing steps shown in FIG. 38 repeatedly for each of the integrated circuits.

In a step S110, the data needed for diagnosis, in other words data related to the cell voltages, the states of the balancing switches, and the abnormality flag, is gathered. It should be understood that this data is gathered from each of the integrated circuits 3A through 3C, upon transmission of the cell voltage read out command and the abnormality flag request command shown in FIG. 33 to the cell controller 80.

In a step S120, a decision is made as to whether or not the states of the balancing switches that have been gathered are as per the anticipated values. In other words, if the ON/OFF of the command transmitted from the battery controller 20 and the ON/OFF states of the balancing switches all agree, then it is determined that the states that have been gathered are as per the anticipated values, and the flow of control proceeds to a step S130. On the other hand, if there is even one of these ON/OFFs that does not agree, then the flow of control is transferred to a step S170.

First, the case in which the flow of control proceeds to the step S130 will be explained. In this step S130, diagnosis processing is performed for each of the battery cells BCn. FIG. 39 is a flow chart showing the processing of this step S130. It should be understood that the reference symbol n denotes the n-th cell in the cell group monitored by this integrated circuit.

Figure 39:
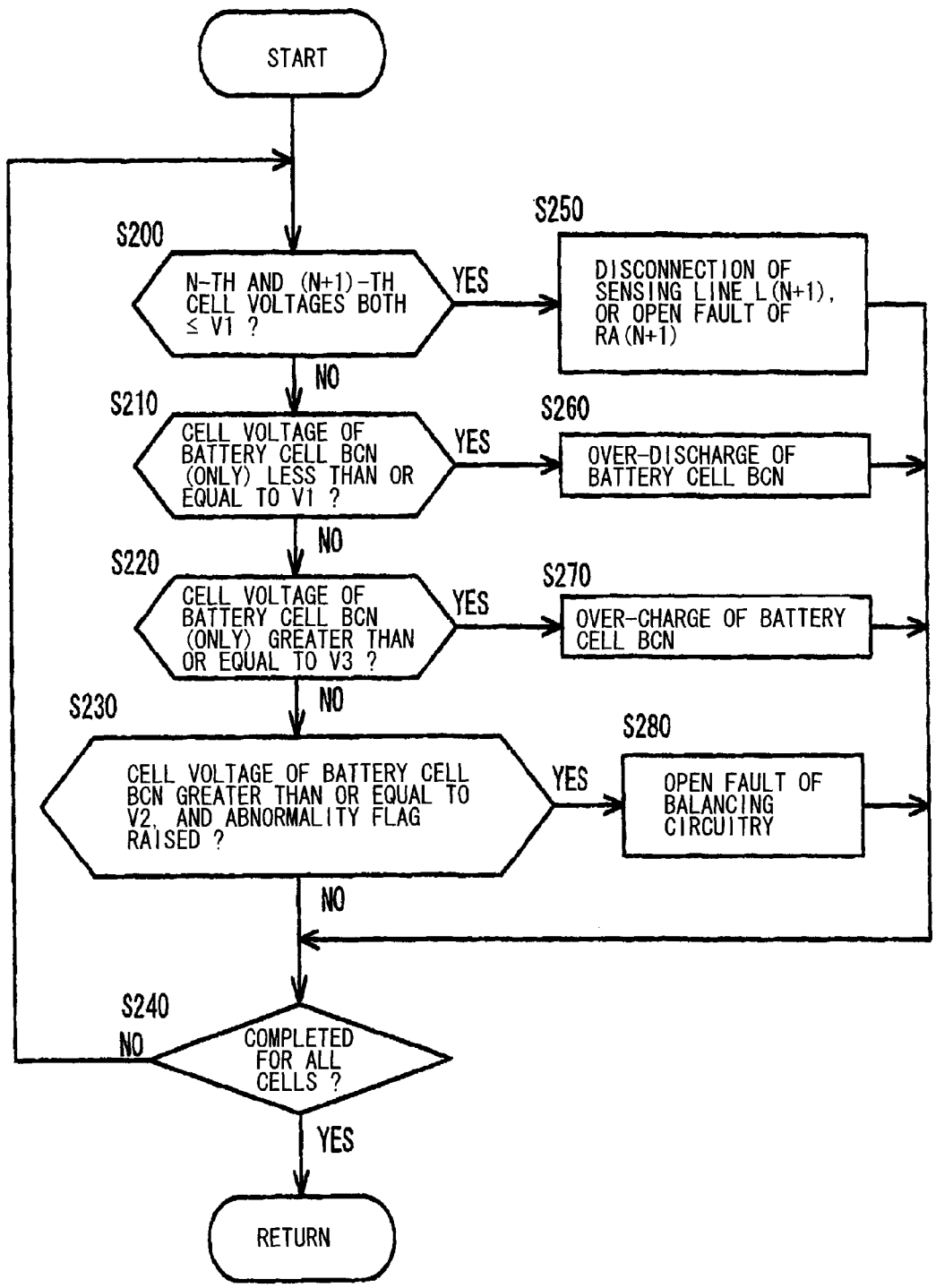
FIG. 39 is a flow chart showing the details of a step S130.

In a step S200 of FIG. 39, a decision is made as to whether or not the cell voltages of the adjacent n-th and (n+1)-th battery cells are both less than or equal to some fixed voltage V1. Here, this fixed voltage V1 is a threshold value for diagnosing whether or not the harnesses L1 through L6 (here these will be termed "sensing lines") of FIG. 19 have suffered line disconnection. It should be understood that, if the over-discharge threshold value for the cell voltages is termed V2 and the over-charge threshold value is termed V3, then the normal range of cell voltage satisfies the relationship "V3>(normal voltage)>V2>V1".

If in the step S200 it is decided that the cell voltages of the n-th and the (n+1)-th battery cells are both less than or equal to the fixed voltage V1, then the flow of control is transferred to a step S250, in which a diagnosis is made that there is a line disconnection of the sensing line L(n+1) or an open fault of the resistor RA(n+1). This diagnosis result is stored in a non-volatile memory of the battery controller 20.

If for example n=2, then when the step S200 is considered, in this case the adjacent n-th battery cell is BC2 and the (n+1)-th battery cell is BC3. If the cell voltage Vc2 of the battery cell BC2 is less than or equal to the sensing line diagnosis threshold value V1, then it may be considered that the sensing line L2 or L3 has suffered a line disconnection, or that the resistor RA2 or RA3 is suffering an open fault. In a similar manner, if the cell voltage Vc3 of the battery cell BC3 is less than or equal to the sensing line diagnosis threshold value V1, then it may be considered that the sensing line L3 or L4 has suffered a line disconnection, or that the resistor RA3 or RA4 is suffering an open fault. Due to this, if both of the cell voltages Vc2 and Vc3 are less than or equal to V1, then it may be considered that the sensing line L3 has suffered a line disconnection, or the resistor RA3 is suffering an open fault. In other words, a diagnosis result like that of the step S250 is reached.

If a NO decision is reached in the step S200 and the flow of control proceeds to the step S210, in other words if the cell voltage Vcn or the cell voltage Vc(n+1) is not less than or equal to V1, then in the step S210 a decision is made as to whether or not, among the two adjacent cells, only the cell voltage Vcn of the battery cell BCn is less than or equal to V1. If it is decided that the cell voltage Vcn of the battery cell BCn (only) is less than or equal to V1, then the flow of control is transferred to a step S260, in which a diagnosis is made that the battery cell BCn is over-discharged, and this diagnosis result is stored in the non-volatile memory.

But if a NO decision is reached in the step S210, then the flow of control proceeds to a step S220, in which a decision is made as to whether or not the cell voltage Vcn of the battery cell BCn (only) is greater than or equal to the over-charge threshold value V3. If in this step S220 it is decided that cell voltage Vcn of the battery cell BCn is greater than or equal to the over-charge threshold value V3, then the flow of control is transferred to a step S270, in which a diagnosis is made that the battery cell BCn is over-charged, and this diagnosis result is stored in the non-volatile memory.

But if a decision of NO is reached in the step S220, then the flow of control is transferred to a step S230, in which a decision is made as to whether or not the cell voltage Vcn of the battery cell BCn is greater than or equal to the over-discharge threshold value V2, and moreover the abnormality flag explained in connection with FIGS. 33 and 37 is raised. Since at this stage it has been decided in the step S120 of FIG. 38 that the states of the balancing switches are as per their anticipated values, accordingly it may be considered that the NGs (abnormalities) of the third row and the fourth row of the decision table of FIG. 37 are eliminated, and that the abnormality flag is raised because the drain voltage Vds is smaller than VdsL.

If a YES decision has been reached in this step S230, in other words if it has been decided that the cell voltage Vcn is within its normal voltage range, and moreover the abnormality flag is raised (so that the drain voltage Vds is smaller than VdsL), then the flow of control proceeds to a step S280, in which an open fault of the balancing circuitry is diagnosed, and this diagnosis result is stored in the non-volatile memory. For example, an open fault of the balancing switch itself, an open fault of the resistor Rn, or a line disconnection of the drain wiring on the circuit board pattern is considered as being an open fault of the balancing circuitry.

If a NO decision is reached in the step S230, then the flow of control proceeds to a step S240, in which a decision is made as to whether or not diagnosis has been completed in relation to all of the battery cells of this integrated circuit. If in this step S240 it is decided that all of the cells have not been dealt with yet, then the flow of control returns to the step S200 and the processing from the step S200 to the step S280 is executed in relation to the next one of the battery cells. On the other hand, if it is decided that diagnosis has been completed in relation to all of the battery cells of this integrated circuit, then the flow of control is transferred to the step S140 of FIG. 38.

In this step S140, a decision is made as to whether or not an abnormality has been found during diagnosis of the integrated circuit (for example, in the previously described multiplexer diagnosis or the like). If it is decided in this step S140 that an abnormality is present, then the flow of control proceeds to a step S150, in which a diagnosis is made that an abnormality is occurring with the integrated circuit itself, and this diagnosis result is stored in the non-volatile memory. On the other hand, if a NO decision is reached in this step S140, then the flow of control is transferred to a step S160, in which a diagnosis of normality is reached, in other words it is diagnosed that the cell voltage is being read correctly, and this diagnosis result is stored in the non-volatile memory.

On the other hand, if it has been decided in the step S120 that the states of the balancing switches are not according to their anticipated values, then the flow of control is transferred to a step S170, in which a decision is made as to whether or not all of the cell voltages of the battery cells corresponding to this integrated circuit are greater than or equal to the sensing line diagnosis threshold value V1. Here, since the sensing line diagnosis threshold value V1 is a value that is lower than the over-discharge threshold value V2, if there is even one of the cell voltages that is less than or equal to V1, then it may be said that this battery cell is in a quite gravely over-discharged state. Accordingly, if a decision of NO is reached in this step S170, then the flow of control proceeds to a step S180 in which over-discharge is diagnosed, and this diagnosis result is stored in the non-volatile memory.

On the other hand, if a decision of YES is reached in the step S170, then a diagnosis is made that there is some fault in the balancing circuitry, and this diagnosis result is stored in the non-volatile memory. For example, the balancing switch being stuck-at fault, or an open fault in the resistor or the like may be considered as balancing circuitry faults in this case.

As previously described, in the next monitoring interval T2, the battery controller 20 transmits the results of diagnosis and all of the cell voltages to the higher ranking controller. Due to this, it becomes easy for the user to perform repairs at the fault location by referring to the diagnosis data obtained by the higher ranking controller.

In this way, it is anticipated that the amount of communication will be reduced and that it will be possible to shorten the monitoring interval T2, since, in the diagnosis processing described above, it is arranged to turn on only the balancing switches for the odd numbered ones of the battery cells, and then to return only the odd numbered ones of the cell voltages (i.e. the terminal voltages) rather than all of the cell voltages, and then, in a similar manner, it is arranged to turn on only the balancing switches for the even numbered ones of the battery cells, and then to return only the even numbered ones of the cell voltages. As a result, it is possible to perform updating of the cell voltage measurement results and of the diagnosis results more rapidly, so that it is possible to anticipate an enhancement of the reliability of this battery system for a vehicle. Moreover, it is possible to respond to requests on the side of the vehicle more quickly.

Furthermore, the battery controller 20 is able to perform diagnostics on the basis of less information about the terminal voltages of the odd numbered ones of the battery cells, the terminal voltages of the even numbered ones of the battery cells, and the switching states of the balancing switches, gathered in a shorter time period as described above, and is able to determine whether any sensing line has suffered line disconnection, whether the state of charge of any of the battery cells is abnormal (i.e. whether any battery cell is over-charged or over-discharged), and whether there is any abnormality with the balancing circuitry.

It should be understood that while, in the explanation given above, in order to reduce the amount of communication, it is arranged not to return unnecessary cell voltage data to the battery controller 20, even with a structure in which all of the cell voltages that are measured with the odd numbered ones or with the even numbered ones of the balancing switches ON are returned, it would still be possible to perform determination of whether any sensing line has suffered line disconnection, of whether the state of charge of any of the battery cells is abnormal (i.e. whether any battery cell is over-charged or over-discharged), and of whether there is any abnormality with the balancing circuitry.

The various embodiments described above may be used either singly or in combination. This is because the beneficial effects of each of the embodiments may be obtained either singly or in synergy. Moreover, provided that the essential characteristics of the present invention are not lost, the present invention is not to be considered as being limited by any of the embodiments described above.

The contents of the disclosure of the following application, upon which priority is claimed, are hereby incorporated herein by reference:

Japanese Patent Application 2009-76785 (filed on 26 Mar. 2009).

The invention claimed is:

1. A battery system for a vehicle, comprising:
   a battery unit in which a plurality of cell groups are electrically connected in series, with a plurality of battery cells being electrically connected in series in each cell group;
   integrated circuits provided for the cell groups respectively, each of which measures the terminal voltage of each battery cell included in its cell group via a measurement line, and outputs battery cell information; and
   a control circuit that monitors states of the battery cells based on battery cell information from the integrated circuits, wherein
   each of the integrated circuits comprises a measurement circuit that measures respective terminal voltages of battery cells in its cell group, and discharge circuits respectively provided for the battery cells, each of which includes a semiconductor switching element that discharges its battery cell via measurement lines for that battery cell and a detection circuit that detects a switching state of the semiconductor switching element;
   the control circuit transmits
      a first discharge command that causes odd numbered battery cells of its cell group to be discharged, to each of the integrated circuits to turn on semiconductor switching elements corresponding to the odd numbered battery cells, to measure terminal voltages of the odd numbered battery cells, and to detect switching states of the semiconductor switching elements corresponding to the odd numbered battery cells with the detection circuit;
   the control circuit transmits a second discharge command that causes even numbered battery cells of its cell group to be discharged, to each of the integrated circuits to turn on semiconductor switching elements corresponding to the even numbered battery cells, to measure terminal voltages of the even numbered battery cells, and to detect switching states of the semiconductor elements corresponding to the even numbered battery cells with the detection circuit;
   the control circuit transmits a first transmission command that causes terminal voltages of only the odd numbered battery cells, measured during execution of the first discharge command, to be sent to the control circuit, to each of the integrated circuits to send the terminal voltages of the odd numbered battery cells measured during execution of the first discharge command and to send the switching states of the semiconductor switching elements corresponding to the odd numbered battery cells detected with the detection circuit when measuring the terminal voltages of the odd numbered battery cells;
   the control circuit transmits a second transmission command that causes terminal voltages of only the even numbered battery cells, measured during execution of the second discharge command, to be sent to the control circuit, to each of the integrated circuits to send the terminal voltages of the even numbered battery cells measured during execution of the second discharge command and to send the switching states of the semiconductor switching elements corresponding to the even numbered battery cells detected with the detection circuit when measuring the terminal voltages of the even numbered battery cells; and
   the control circuit diagnoses whether abnormality of states of charge of one or more of the battery cells, disconnection of one or more of the measurement lines, or abnormality of one or more of the discharge circuits has occurred, based on the terminal voltages of the odd numbered battery cells, the terminal voltages of the even numbered battery cells, and the switching states of the semiconductor switching elements sent from each of the integrated circuits.

2. A battery system for a vehicle according to claim 1, further comprising
   a serial communication system that comprises a first transmission path in which the plurality of integrated circuits are connected in series, a second transmission path for transmitting signals from the control circuit to a highest ranking one of the integrated circuits that are connected in series, and a third transmission path for transmitting signals from a lowest ranking one of the integrated circuits that are connected in series to the control circuit, wherein
   transmission of the first discharge command, the second discharge command, the first transmission command and the second transmission command from the control circuit to the plurality of integrated circuits, and sending of the terminal voltages and the switching states of the semiconductor switching elements from the plurality of integrated circuits to the control circuit, are performed via the serial communication system.

3. A battery system for a vehicle according to claim 1, wherein
   the disconnection of one or more of the measurement lines includes an open fault in a resistor provided at the measurement lines.

4. A battery system for a vehicle according to claim 1, wherein
   the abnormality of states of charge of one or more of the battery cells indicates over-charge or over-discharge of one or more of the battery cells.

5. A battery system for a vehicle according to claim 1, wherein:
- each of the discharge circuits includes a balancing resistor electrically connected to the semiconductor switching element in series; and
- the abnormality of one or more of the discharge circuits includes a being-stuck-at fault of the semiconductor switching element or an open fault in the balancing resistor.

6. A battery system for a vehicle, comprising:
- a battery unit in which a plurality of cell groups are electrically connected in series, with a plurality of battery cells being electrically connected in series in each cell group;
- integrated circuits provided for the cell groups respectively, each of which measures the terminal voltage of each battery cell included in its cell group via a measurement line, and outputs battery cell information; and
- a control circuit that monitors the states of the battery cells based on battery cell information from the integrated circuits, wherein
- each of the integrated circuits comprises:
    - a measurement circuit that measures respective terminal voltages of the battery cells in its cell group:
    - discharge circuits respectively provided for the battery cells, each of which includes a semiconductor switching element for flowing a discharge current via measurement lines for that battery cell; and
    - detection circuits that detect switching states of the semiconductor switching elements;
- the control circuit transmits a discharge command that commands discharge operation by the discharge circuits, to each of the integrated circuits to turn on the semiconductor switching elements and measure the terminal voltages of the battery cells;
- the control circuit transmits a transmission command that causes the terminal voltages of the battery cells, measured during execution of the discharge command, to be sent to the control circuit, to each of the integrated circuits to send the terminal voltages of the battery cells measured during execution of the discharge command;
- the control circuit makes each of the integrated circuits send out the switching states of the semiconductor switching elements detected with the detection circuits; and
- the control circuit diagnoses whether disconnection of one or more of the measurement lines, abnormality of states of charge of one or more of the battery cells, or abnormality of one or more of the of the discharge circuits has occurred, based on the terminal voltages and the switching states of the semiconductor switching elements sent from each of the integrated circuits.

7. A battery system for a vehicle according to claim 6, further comprising:
- a serial communication system that comprises a first transmission path in which the plurality of integrated circuits are connected in series, a second transmission path for transmitting signals from the control circuit to a highest ranking one of the integrated circuits that are connected in series, and a third transmission path for transmitting signals from a lowest ranking one of the integrated circuits that are connected in series to the control circuit, wherein
- transmission of the discharge command and the transmission command from the control circuit to the plurality of integrated circuits, and sending of the terminal voltages and the switching states of the semiconductor switching elements from the plurality of integrated circuits to the control circuit, are performed via the serial communication system.

8. A battery system for a vehicle according to claim 6, wherein
- the disconnection of one or more of the measurement lines includes an open fault in a resistor provided at the measurement lines.

9. A battery system for a vehicle according to claim 6, wherein
- the abnormality of states of charge of one or more of the battery cells shows over-charge or over-discharge of one or more of the battery cells.

10. A battery system for a vehicle according to claim 6, wherein:
- each of the discharge circuits includes a balancing resistor electrically connected to the semiconductor switching element in series; and
- the abnormality of one or more of the discharge circuits includes a being-stuck-at fault of the semiconductor switching element or an open fault in the balancing resistor.

11. A battery control device provided for a battery unit in which a plurality of cell groups are electrically connected in series, with a plurality of battery cells being electrically connected in series in each cell group comprising:
- integrated circuits provided for the cell groups respectively, each of which measures the terminal voltage of each battery cell included in its cell group via a measurement line, and outputs battery cell information; and
- a control circuit that monitors states of the battery cells based on battery cell information from the integrated circuits, wherein:
- each of the integrated circuits comprises a measurement circuit that measures respective terminal voltages of battery cells in its cell group, and discharge circuits respectively provided for the battery cells, each of which includes a semiconductor switching element to discharge its battery cell via measurement lines for that battery cell and a detection circuit that detects a switching state of the semiconductor switching element;
- the control circuit transmits a first discharge command that causes odd numbered battery cells of its cell group to be discharged, to each of the integrated circuits to turn on semiconductor switching elements corresponding to the odd numbered battery cells, to measure terminal voltages of the odd numbered battery cells, and to detect switching states of the semiconductor switching elements corresponding to the odd numbered battery cells with the detection circuit;
- the control circuit transmits a second discharge command that causes even numbered battery cells of its cell group to be discharged, to each of the integrated circuits to turn on semiconductor switching elements corresponding to the even numbered battery cells, to measure terminal voltages of the even numbered battery cells, and to detect switching states of the semiconductor switching elements corresponding to the even numbered battery cells with the detection circuit;
- the control circuit transmits a first transmission command that causes terminal voltages of only the odd numbered battery cells, measured during execution of the first discharge command, to be sent to the control circuit, to each of the integrated circuits to send the terminal voltages of the odd numbered battery cells measured during execution of the first discharge command and to send the switching states of the semiconductor switching elements corresponding to the odd numbered battery cells detected with the detection circuit when measuring the terminal voltages of the odd numbered battery cells;

the control circuit transmits a second transmission command that causes terminal voltages of only the even numbered battery cells, measured during execution of the second discharge command, to be sent to the control circuit, to each of the integrated circuits to send the terminal voltages of the even numbered battery cells measured during execution of the second discharge command and to send the switching states of the semiconductor switching elements corresponding to the even numbered battery cells detected with the detection circuit when measuring the terminal voltages of the even numbered battery cells; and the control circuit diagnoses whether abnormality of states of charge of one or more of the battery cells, disconnection of one or more of the measurement lines, or abnormality of one or more of the discharge circuits has occurred, based on the terminal voltages of the odd numbered battery cells, the terminal voltages of the even numbered battery cells, and the switching states of the semiconductor switching elements sent from each of the integrated circuits.

12. A battery control device according to claim 11, further comprising:

a serial communication system that comprises a first transmission path in which the plurality of integrated circuits are connected in series, a second transmission path for transmitting signals from the control circuit to a highest ranking one of the integrated circuits that are connected in series, and a third transmission path for transmitting signals from a lowest ranking one of the integrated circuits that are connected in series to the control circuit, wherein transmission of the first discharge command, the second discharge command, the first transmission command and the second transmission command from the control circuit to the plurality of integrated circuits, and sending of the terminal voltages and the switching states of the semiconductor switching elements from the plurality of integrated circuits to the control circuit, are performed via the serial communication system.

13. A battery control device according to claim 11, wherein the disconnection of one or more of the measurement lines includes an open fault in a resistor provided at the measurement lines.

14. A battery control device according to claim 11, wherein the abnormality of states of charge of one or more of the battery cells indicates over-charge or over-discharge of one or more of the battery cells.

15. A battery control device according to claim 11, wherein:

each of the discharge circuits includes a balancing resistor electrically connected to the semiconductor switching element in series; and the abnormality of one or more of the discharge circuits includes a being-stuck-at fault of the semiconductor switching element or an open fault in the balancing resistor.

16. A battery control device provided for a battery unit in which a plurality of cell groups are electrically connected in series, with a plurality of battery cells being electrically connected in series in each cell group;

integrated circuits provided for the cell groups respectively, each of which measures the terminal voltage of each battery cell included in its cell group via a measurement line, and outputs battery cell information; and a control circuit that monitors the states of the battery cells based on battery cell information from the integrated circuits, wherein:

each of the integrated circuits comprises a measurement circuit that measures respective terminal voltages of the battery cells in its cell group, discharge circuits respectively provided for the battery cells, each of which includes a semiconductor switching element for flowing a discharge current via measurement lines for that battery cell, and detection circuits that detect switching states of the semiconductor switching elements;

the control circuit transmits a discharge command that commands discharge operation by the discharge circuits, to each of the integrated circuits to turn on the semiconductor switching elements and measure the terminal voltages of the battery cells;

the control circuit transmits a transmission command that causes the terminal voltages of the battery cells, measured during execution of the discharge command, to be sent to the control circuit, to each of the integrated circuits to send the terminal voltages of the battery cells measured during execution of the discharge command;

the control circuit makes each of the integrated circuits send out the switching states of the semiconductor switching elements detected with the detection circuits; and the control circuit diagnoses whether disconnection of one or more of the measurement lines, abnormality of states of charge of one or more of the battery cells, or abnormality of one or more of the discharge circuits has occurred, based on the terminal voltages and the switching states of the semiconductor switching elements sent from each of the integrated circuits.

17. A battery control device according to claim 16, further comprising:

a serial communication system that comprises a first transmission path in which the plurality of integrated circuits are connected in series, a second transmission path for transmitting signals from the control circuit to a highest ranking one of the integrated circuits that are connected in series, and a third transmission path for transmitting signals from a lowest ranking one of the integrated circuits that are connected in series to the control circuit, wherein transmission of the discharge command and the transmission command from the control circuit to the plurality of integrated circuits, and sending of the terminal voltages and the switching states of the semiconductor switching elements from the plurality of integrated circuits to the control circuit, are performed via the serial communication system.

18. A battery control device according to claim 16, wherein the disconnection of one or more of the measurement lines includes an open fault in a resistor provided at the measurement lines.

19. A battery control device according to claim 16, wherein the abnormality of states of charge of one or more of the battery cells indicates over-charge or over-discharge of one or more of the battery cells.

20. A battery control device according to claim 16, wherein:

each of the discharge circuits includes a balancing resistor electrically connected to the semiconductor switching element in series; and the abnormality of one or more of the discharge circuits includes a being-stuck-at fault of the semiconductor switching element or an open fault in the balancing resistor.

* * * * *